(12) United States Patent
Kuroda et al.

(10) Patent No.: US 10,673,235 B2
(45) Date of Patent: Jun. 2, 2020

(54) POWER SYSTEM VOLTAGE REACTIVE POWER MONITORING CONTROL DEVICE AND METHOD

(71) Applicant: Hitachi, Ltd., Chiyoda-ku, Tokyo (JP)

(72) Inventors: Eisuke Kuroda, Tokyo (JP); Daichi Kato, Tokyo (JP); Osamu Tomobe, Tokyo (JP); Haruki Miyoshi, Tokyo (JP); Shintaro Ueno, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 117 days.

(21) Appl. No.: 15/568,238

(22) PCT Filed: Mar. 25, 2016

(86) PCT No.: PCT/JP2016/059533
§ 371 (c)(1),
(2) Date: Oct. 20, 2017

(87) PCT Pub. No.: WO2016/170912
PCT Pub. Date: Oct. 27, 2016

(65) Prior Publication Data
US 2018/0152020 A1 May 31, 2018

(30) Foreign Application Priority Data
Apr. 22, 2015 (JP) .................. 2015-087301

(51) Int. Cl.
*H02J 3/16* (2006.01)
*H02J 3/00* (2006.01)
(Continued)

(52) U.S. Cl.
CPC .............. *H02J 3/16* (2013.01); *G01R 21/003* (2013.01); *H02J 3/00* (2013.01); *H02J 13/00* (2013.01);
(Continued)

(58) Field of Classification Search
CPC .................................................. G01R 21/003
(Continued)

(56) References Cited

U.S. PATENT DOCUMENTS

2013/0134779 A1 5/2013 Watanabe et al.
2015/0214741 A1 7/2015 Kuroda et al.
(Continued)

FOREIGN PATENT DOCUMENTS

JP 6-153397 A 5/1994
JP 6-284582 A 10/1994
(Continued)

OTHER PUBLICATIONS

Ibe, Okwe Gerald, and Akwukwaegbu Isdore Onyema. "Concepts of reactive power control and voltage stability methods in power system network." IOSR Journal of Computer Engineering 11.2 (2013): 15-25. (Year: 2013).*
(Continued)

*Primary Examiner* — Mohammad Ali
*Assistant Examiner* — Joshua T Sanders
(74) *Attorney, Agent, or Firm* — Crowell & Moring LLP

(57) ABSTRACT

In a power system voltage reactive power monitoring control device, a balance between the power system voltage and the reactive power can be maintained even when, for example, the output of renewable energy varies over time due to the weather, or the power supply configuration or system configuration changes, and the economic efficiency can be improved. In the power system voltage reactive power monitoring control device, which supplies transmission data to individual devices capable of adjusting the voltage and the reactive power of a power system, indices indicating the stability of the power system are used to determine one or more target value restrictions, information about the target value is obtained from the target value (Continued)

restrictions, transmission data containing information about the target value is supplied to the individual devices, and the voltage and reactive power at the relevant installation site are adjusted by the individual devices.

9 Claims, 36 Drawing Sheets

(51) Int. Cl.
    *H02J 13/00*     (2006.01)
    *G01R 21/00*     (2006.01)
(52) U.S. Cl.
    CPC .......... *H02J 13/0006* (2013.01); *Y02E 40/34* (2013.01); *Y02E 40/74* (2013.01); *Y02E 60/726* (2013.01); *Y04S 10/22* (2013.01); *Y04S 10/24* (2013.01)
(58) Field of Classification Search
    USPC .......................................................... 307/71
    See application file for complete search history.

(56) References Cited

U.S. PATENT DOCUMENTS

| | | | | |
|---|---|---|---|---|
| 2016/0149412 | A1* | 5/2016 | Itaya | ............ H02J 3/16 307/31 |
| 2016/0204614 | A1 | 7/2016 | Itaya | |

FOREIGN PATENT DOCUMENTS

| | | |
|---|---|---|
| JP | 9-37463 A | 2/1997 |
| JP | 2001-16781 A | 1/2001 |
| JP | 2004-187390 A | 7/2004 |
| JP | 2012-186961 A | 9/2012 |
| JP | 2014-64382 A | 4/2014 |
| WO | WO 2014/207849 A1 | 12/2014 |
| WO | WO 2015/022746 A1 | 2/2015 |

OTHER PUBLICATIONS

Extended European Search Report issued in counterpart European Application No. 16782934.0 dated Dec. 3, 2018 (12 pages).
Japanese-language Office Action issued in counterpart Japanese Application No. 2015-087301 dated Jun. 20, 2018 with English translation (eight (8) pages).
International Search Report (PCT/ISA/210) issued in PCT Application No. PCT/JP2016/059533 dated Jun. 14, 2016 with English-language translation (two (2) pages).
Japanese-language Written Opinion (PCT/ISA/237) issued in PCT Application No. PCT/JP2016/059533 dated Jun. 14, 2016 (four (4) pages).
Prabha Kundar, et al., "Definition and Classification of Power System Stability," IEEE/CIGRE Joint Task Force on Stability Terms and Definitions, p. 1387-1401, IEEE Transactions on Power Systems, vol. 19, No. 2, May 2004. Fig. 5.
Chiang. H. D. et al., "CPFLOW: A Practical Tool for Tracing Power System Steady-State Stationary Behavior Due to Load and Generation Variations," IEEE Trans. on Power Systems, vol. 10, No. 2, pp. 623-634, May 1995.
Venkataramana Ajjarapu, "Computational Techniques for Voltage Stability Assessment and Control," Springer, 2006, pp. 49-116.
Nakachi et al., "Voltage and Reactive Power Control Taking into Account of Economy and Security by Using Tab Search," The Transactions of the Institute of Electrical Engineers of Japan B, vol. 128, No. 1, pp. 305-311, 2008.
Kishi et al., "Voltage and Reactive Power Control Considering Operation Room," School of Engineering of Tokai University, vol. 48, No. 1, pp. 81-86, 2008.
Ishida et al., "Feasibility Study on Feed-Forwarding Voltage Reactive-Power Control Method Based on LP Method," The Transactions of the Institute of Electrical Engineers of Japan B, vol. 117, No. 8, pp. 1115-1120, 1997.
Jintaek Lim et.al, "Expert Criteria Based Probabilistic Power System Health Index Model and Visualization," 2014 International Conference on Probabilistic Methods Applied to Power Systems (PMAPS), pp. 1-6.
Christoph Schneiders, et.al, "Enhancement of Situation Awareness in Wide Area Transmission Systems for Electricity and Visualization of the Global System State," 2012 3rd IEEE PES Innovative Smart Grid Technologies (ISGT Europe), 2012, pp. 1-9.
Lars Holten, et al., "Comparison of Different Methods for State Estimation," IEEE Transactions on Power Systems, vol. 3, No. 4, Nov. 1988, pp. 1798-1806.
Willim F. Tinney, et al, "Power Flow Solution by Newton's Method," IEEE Transactions on Power Apparatus and Systems, vol. PAS-86, No. 11, Nov. 1967 pp. 1449-1460.

\* cited by examiner

[Fig. 1]
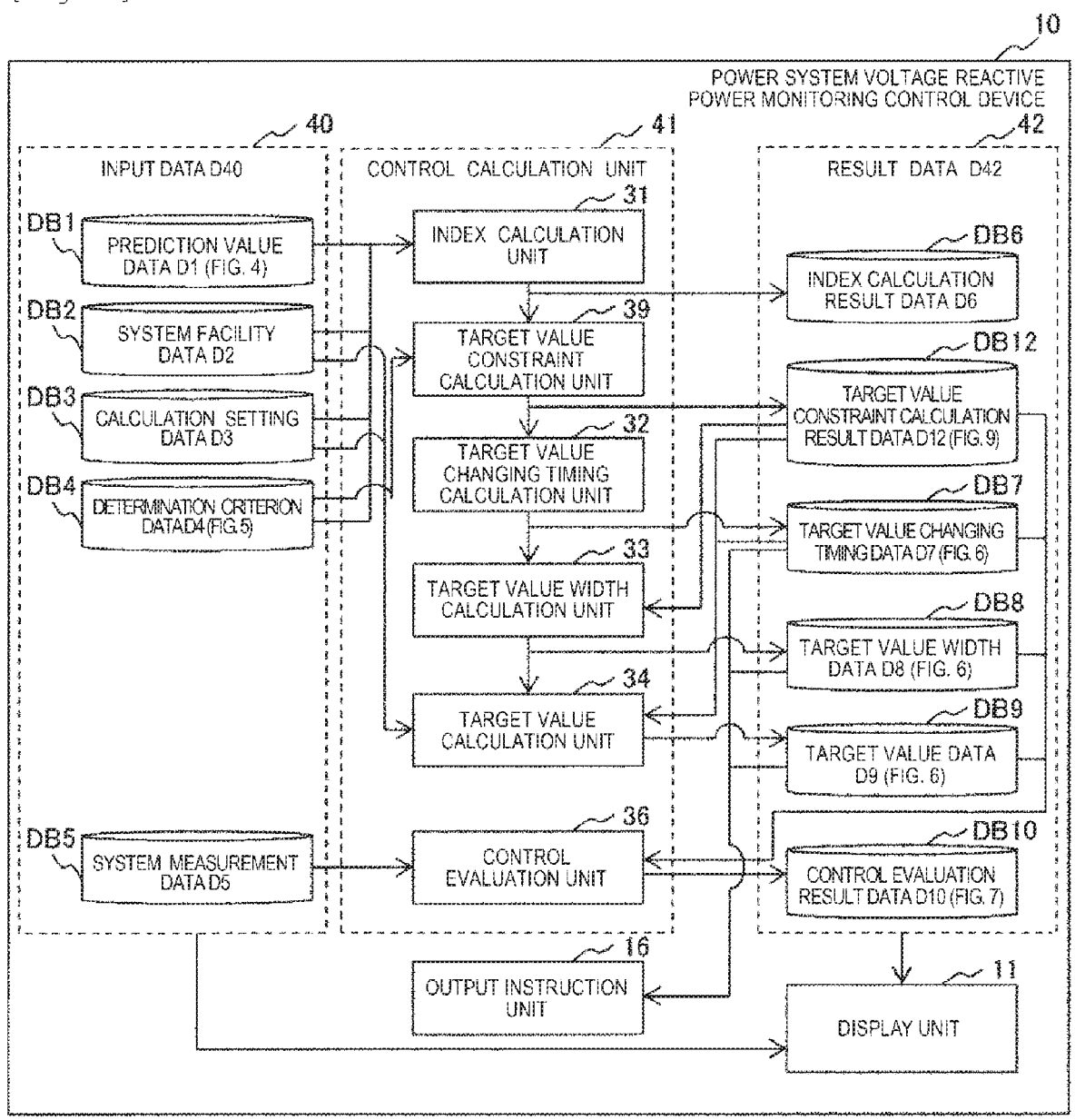

[Fig. 2]
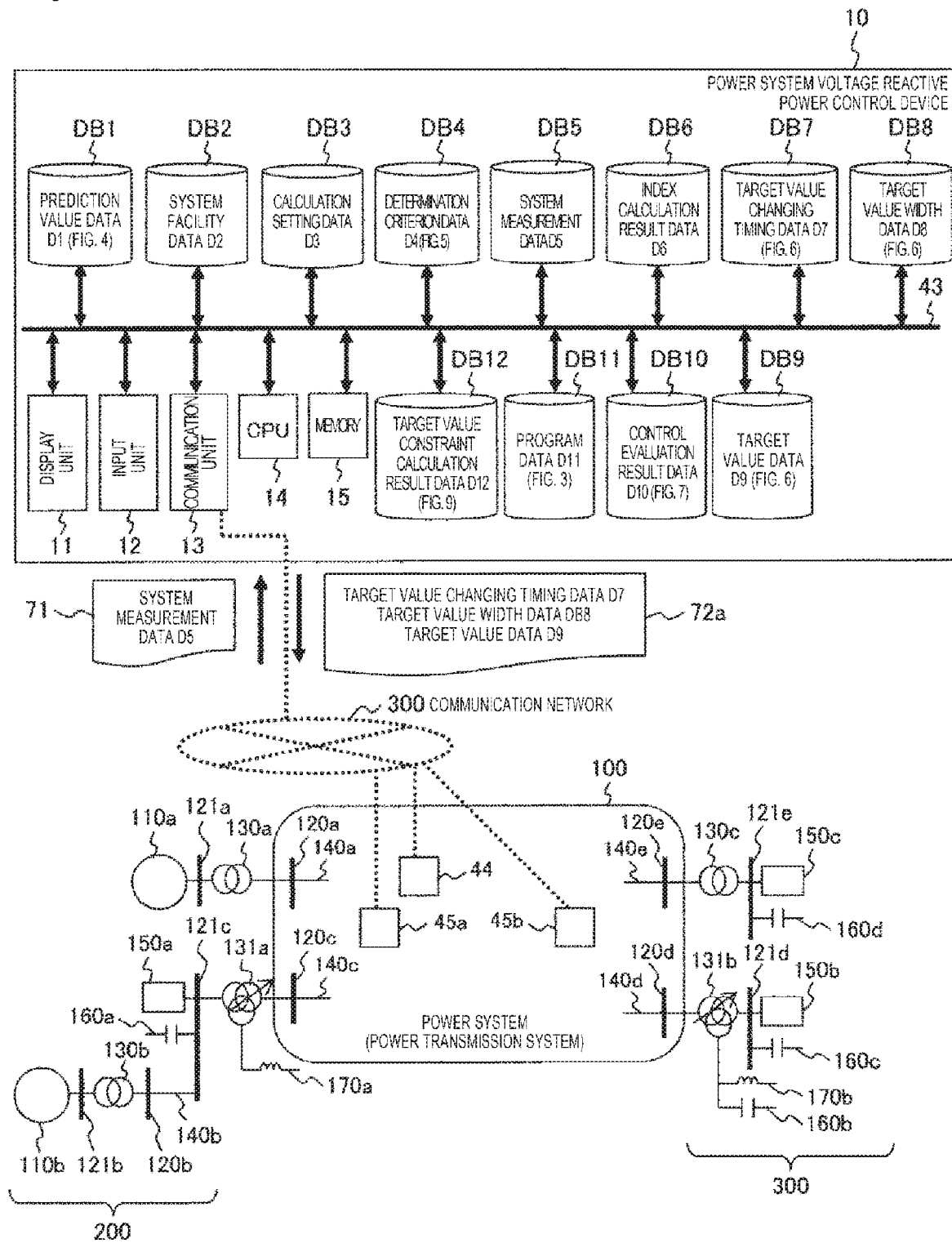

[Fig. 3]
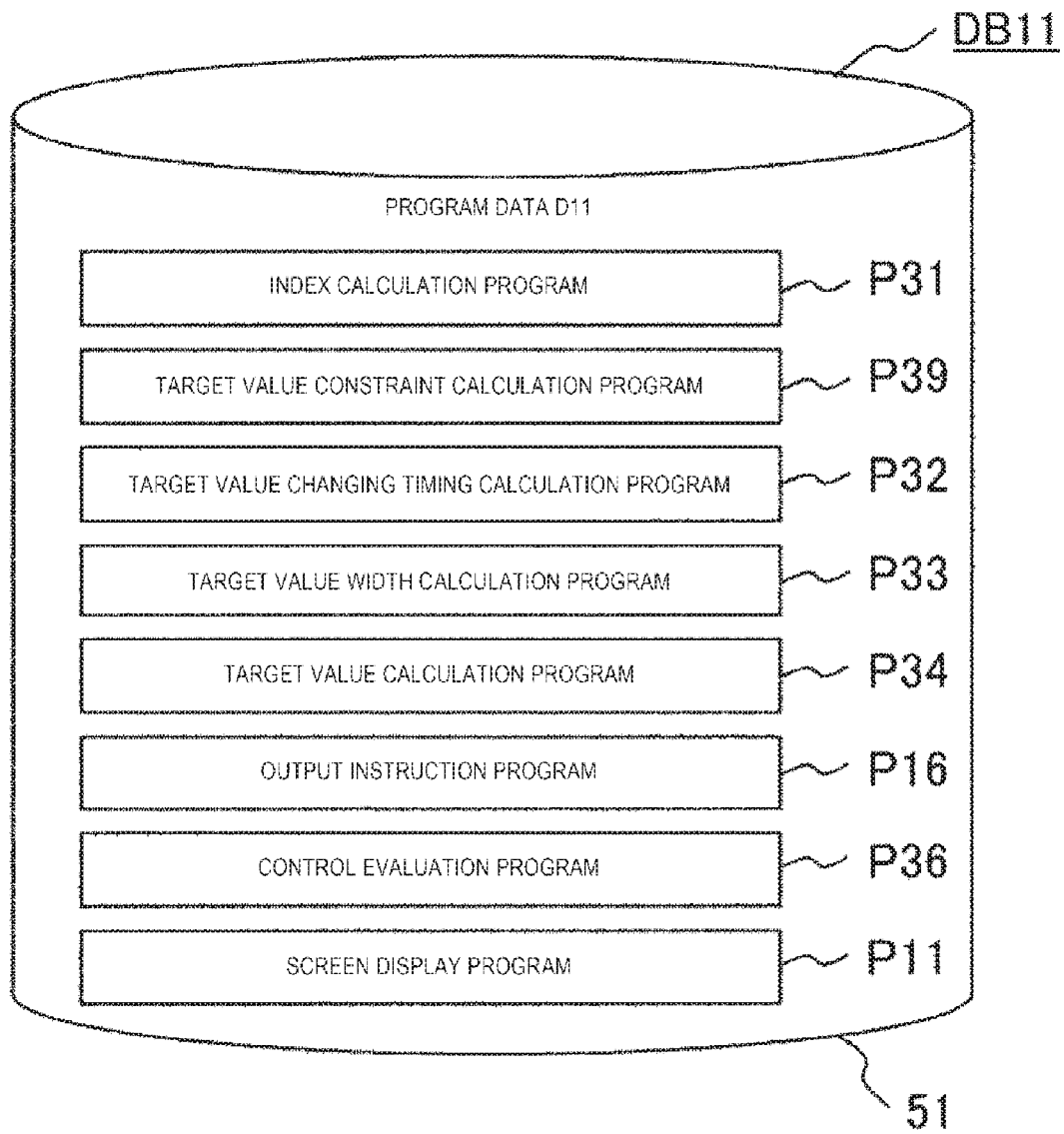

| TIME [s] | VOLTAGE [p.u.] | | ... | CONSUMPTION [p.u.] | | | | ... | POWER GENERATOR OUTPUT [p.u.] | | | | ... | ... |
|---|---|---|---|---|---|---|---|---|---|---|---|---|---|---|
| | | | | ACTIVE POWER | REACTIVE POWER | ACTIVE POWER | REACTIVE POWER | | ACTIVE POWER | REACTIVE POWER | ACTIVE POWER | REACTIVE POWER | | |
| | V1 | V2 | ... | PL1 | QL1 | PL2 | QL2 | ... | PG1 | QG1 | PG2 | QG2 | ... | ... |
| t1 | XX | XX | ... | XX | XX | XX | XX | ... | XX | XX | XX | XX | ... | ... |
| t2 | XX | XX | ... | XX | XX | XX | XX | ... | XX | XX | XX | XX | ... | ... |
| ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |

| TYPE OF STABILITY | TYPE OF THRESHOLD | SETTING VALUE 1 | SETTING VALUE 2 | ... |
|---|---|---|---|---|
| TRANSIENT STABILITY | OUT-OF-STEP DETERMINATION THRESHOLD ($\delta_{OOS}$) | 360 deg. | — | ... |
| | INSTABILITY THRESHOLD ($\delta_{maxTi}$) | $\delta_{maxT1}$=90 deg. | $\delta_{maxT2}$=120 deg. | ... |
| | ⋮ | ⋮ | ⋮ | ⋮ |
| STEADY-STATE STABILITY | DAMPING RATE THRESHOLD ($\alpha_{Ti}$) | $\alpha_{T1}$=0.1 | $\alpha_{T2}$=0 | ... |
| | ⋮ | ⋮ | ⋮ | ⋮ |
| VOLTAGE STABILITY | ACTIVE POWER MARGIN THRESHOLD ($\Delta P_{Ti}$) | $\Delta P_{T1}$=0.2 p.u. | $\Delta P_{T2}$=** p.u. | ... |
| | REACTIVE POWER MARGIN THRESHOLD ($\Delta Q_{Ti}$) | $\Delta Q_{T1}$=0.2 p.u. | $\Delta Q_{T2}$=** p.u. | ... |
| | ⋮ | ⋮ | ⋮ | ⋮ |
| ⋮ | ⋮ | ⋮ | ⋮ | ⋮ |

| No. | V1 | | | ... |
| --- | --- | --- | --- | --- |
| | CHANGING TIMING | WIDTH | TARGET VALUE | ... |
| 1 | $t_0$ | $\Delta V_{i0}$ | XX | ... |
| 2 | $t_1$ | $\Delta V_{i1}$ | XX | ... |
| ⋮ | ⋮ | ⋮ | ⋮ | ⋮ |

| TIME [s] | V1[p.u.] | | | V2[p.u.] | | | ... |
| --- | --- | --- | --- | --- | --- | --- | --- |
| | TARGET VALUE | MEASUREMENT VALUE | DEVIATION | TARGET VALUE | MEASUREMENT VALUE | DEVIATION | ... |
| t1 | XX | XX | XX | XX | XX | XX | ... |
| t2 | XX | XX | XX | XX | XX | XX | ... |
| ⋮ | ⋮ | ⋮ | ⋮ | ⋮ | ⋮ | ⋮ | ⋮ |

[Fig. 8]
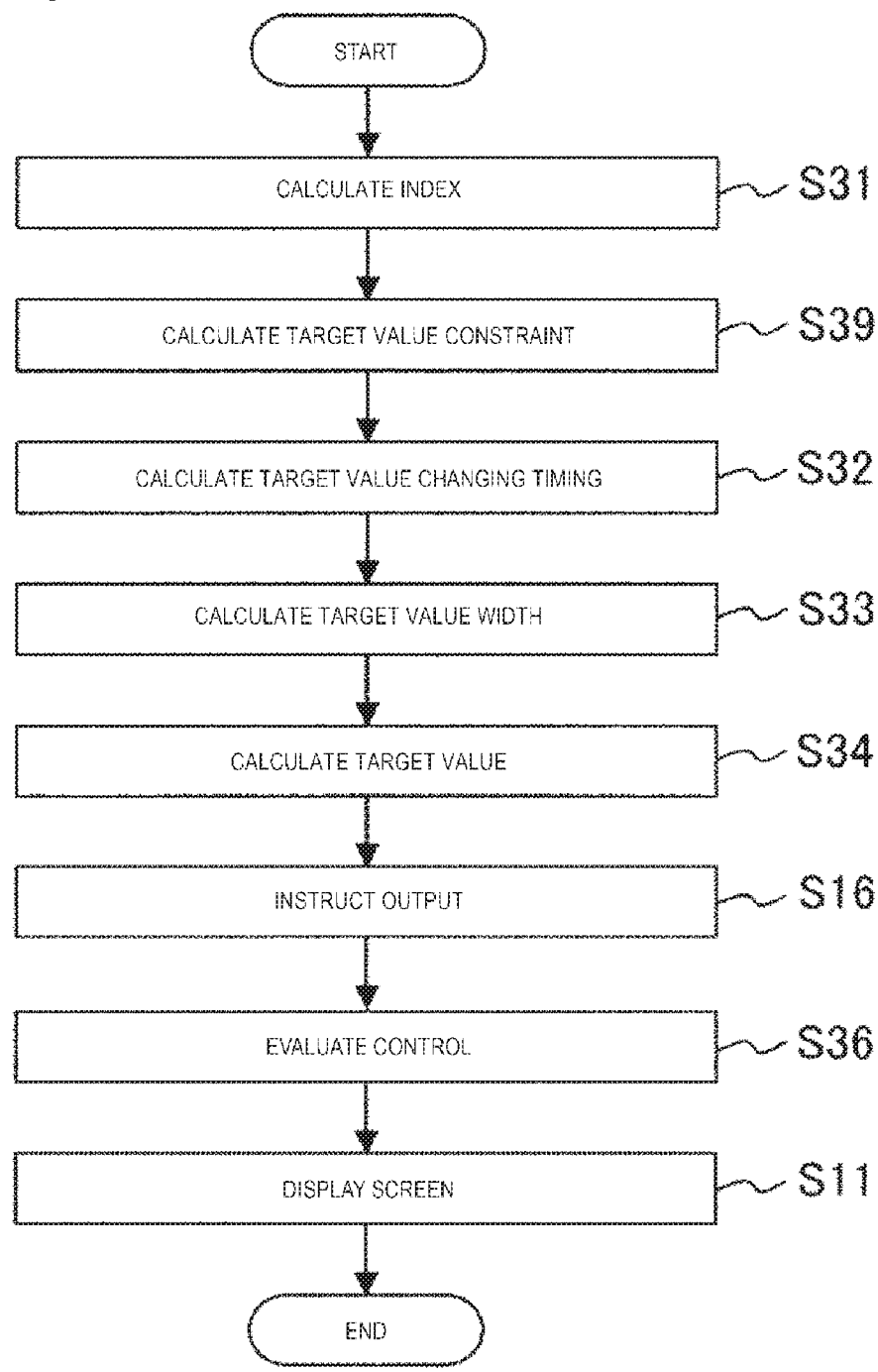

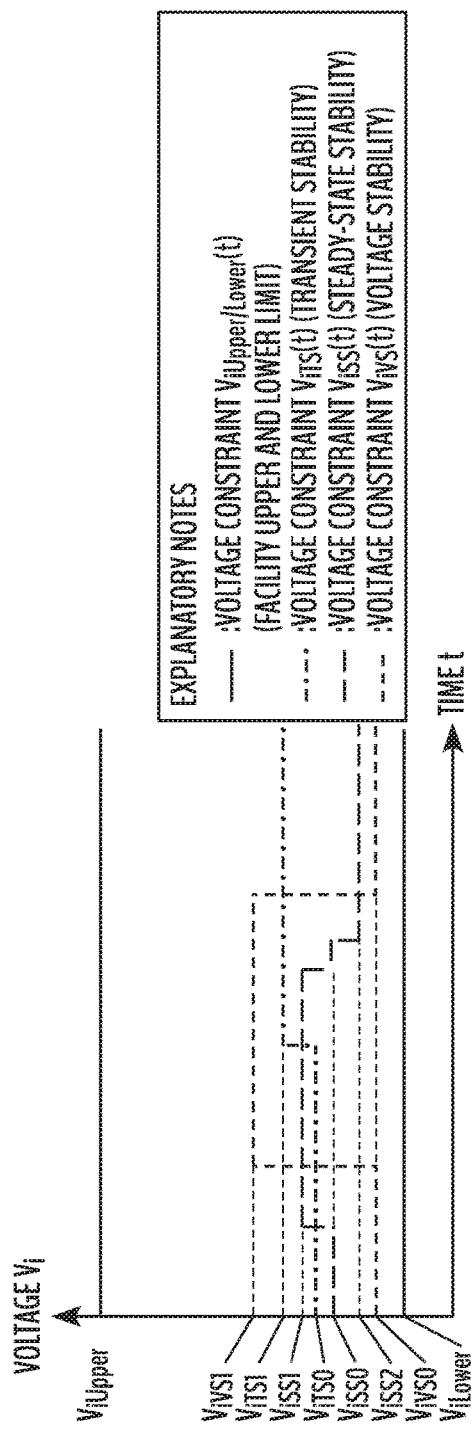
[Fig. 9]
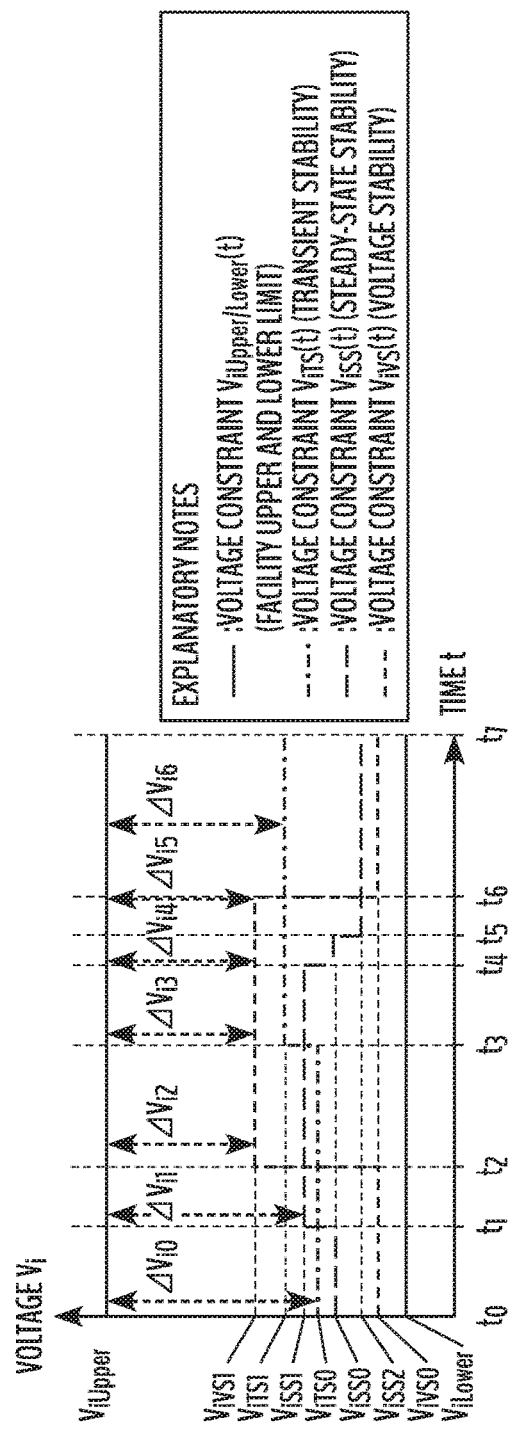
[Fig. 10]

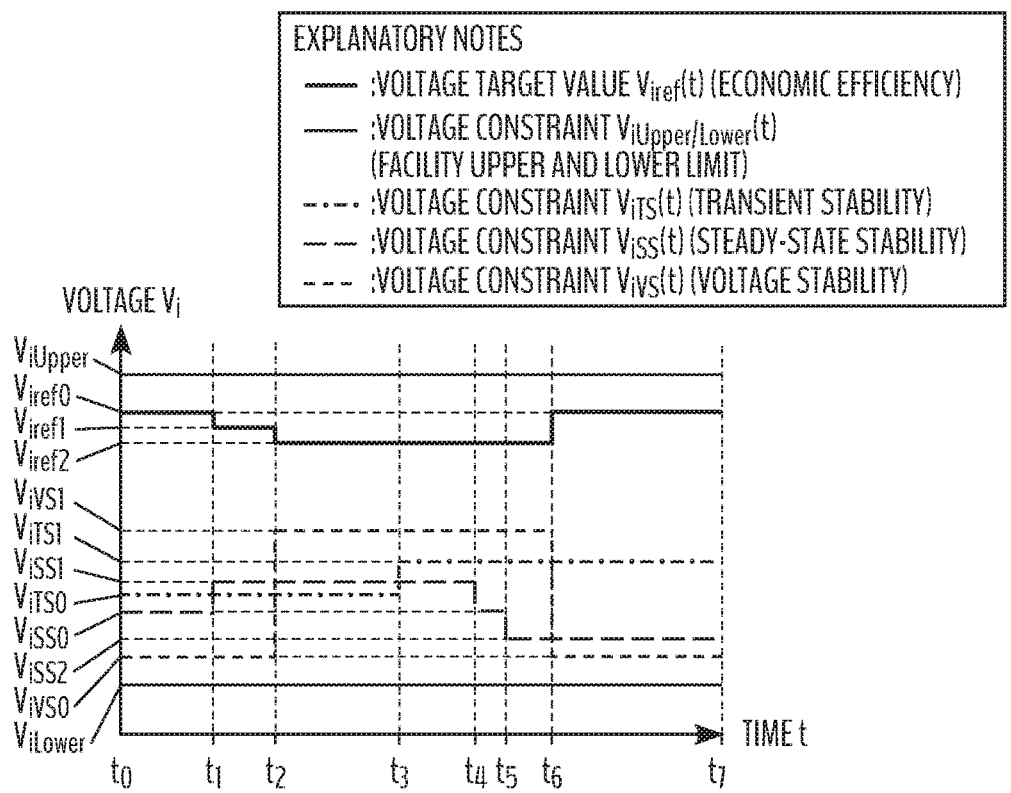
[Fig. 11]
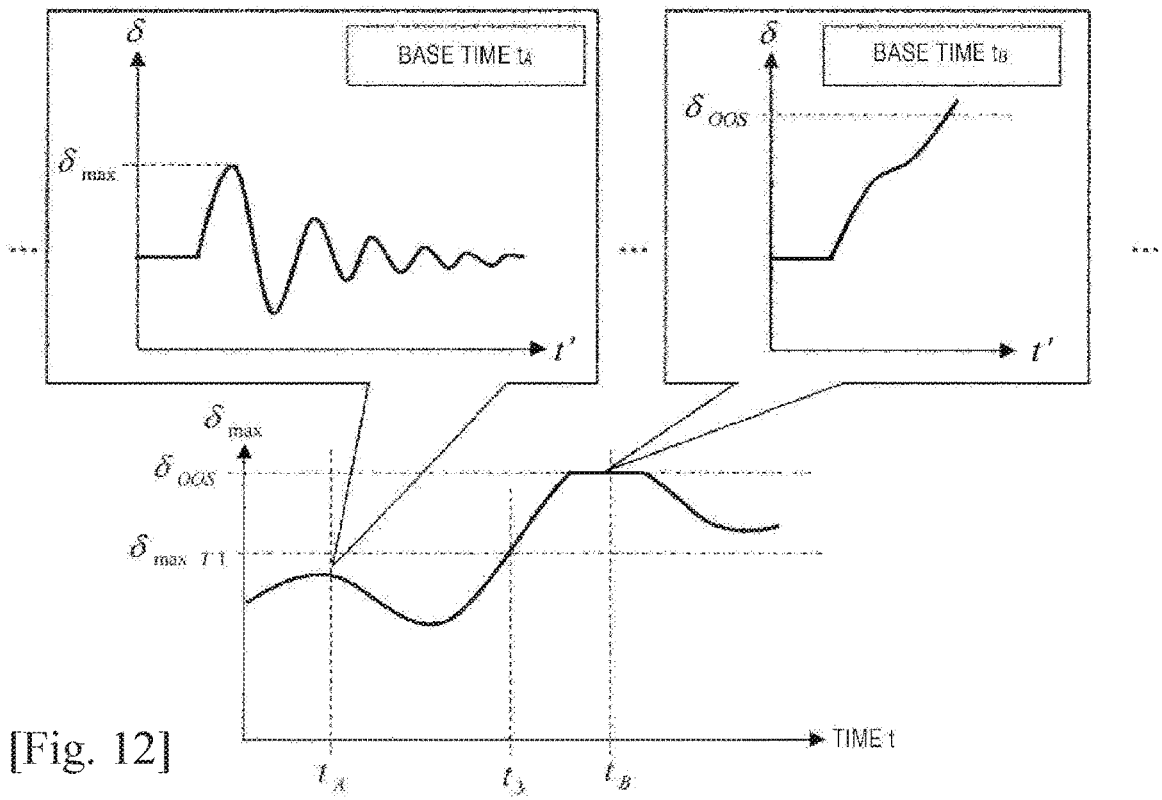
[Fig. 12]

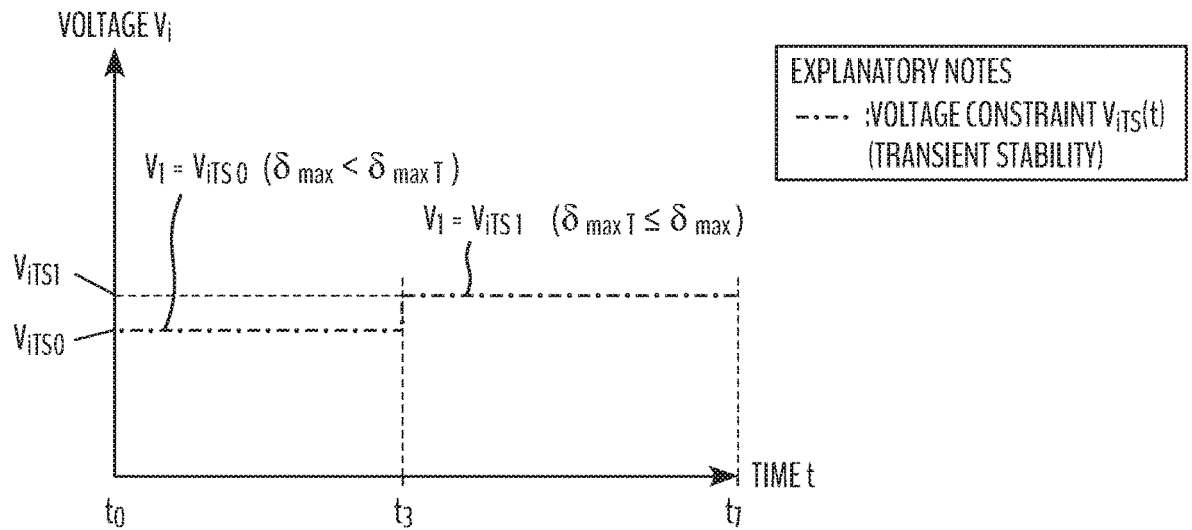
[Fig. 13]
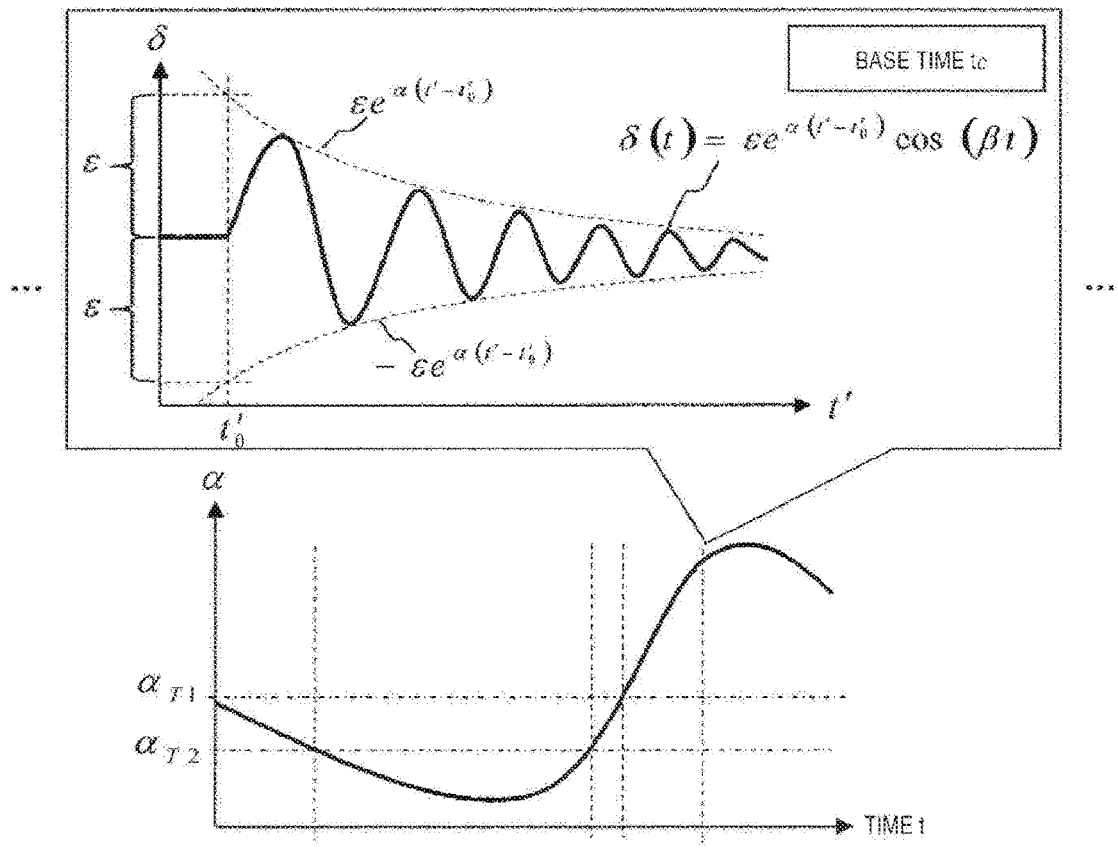
[Fig. 14]

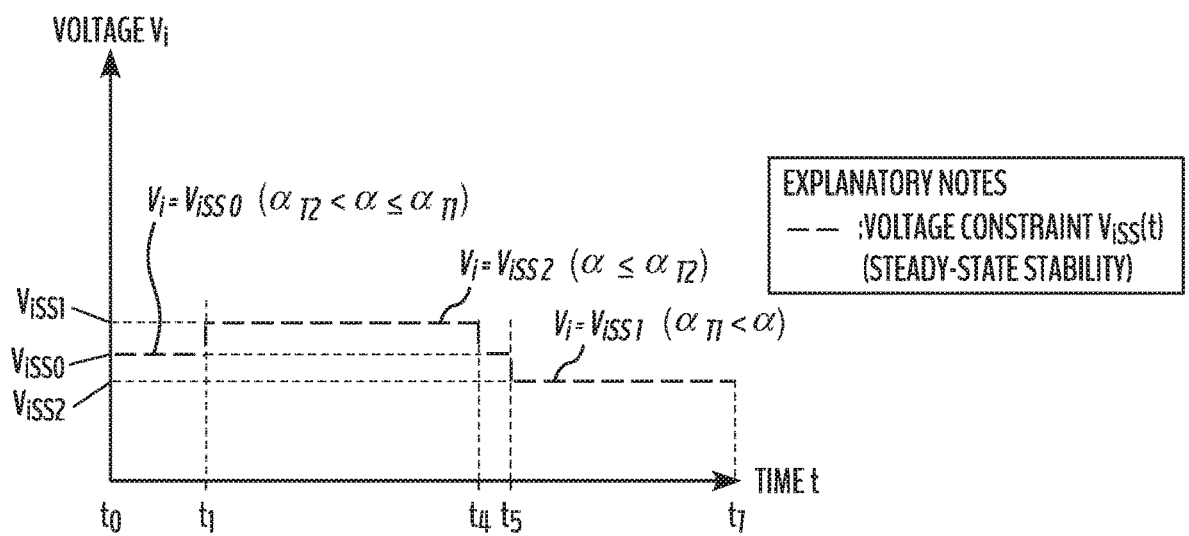
[Fig. 15]

[Fig. 16]
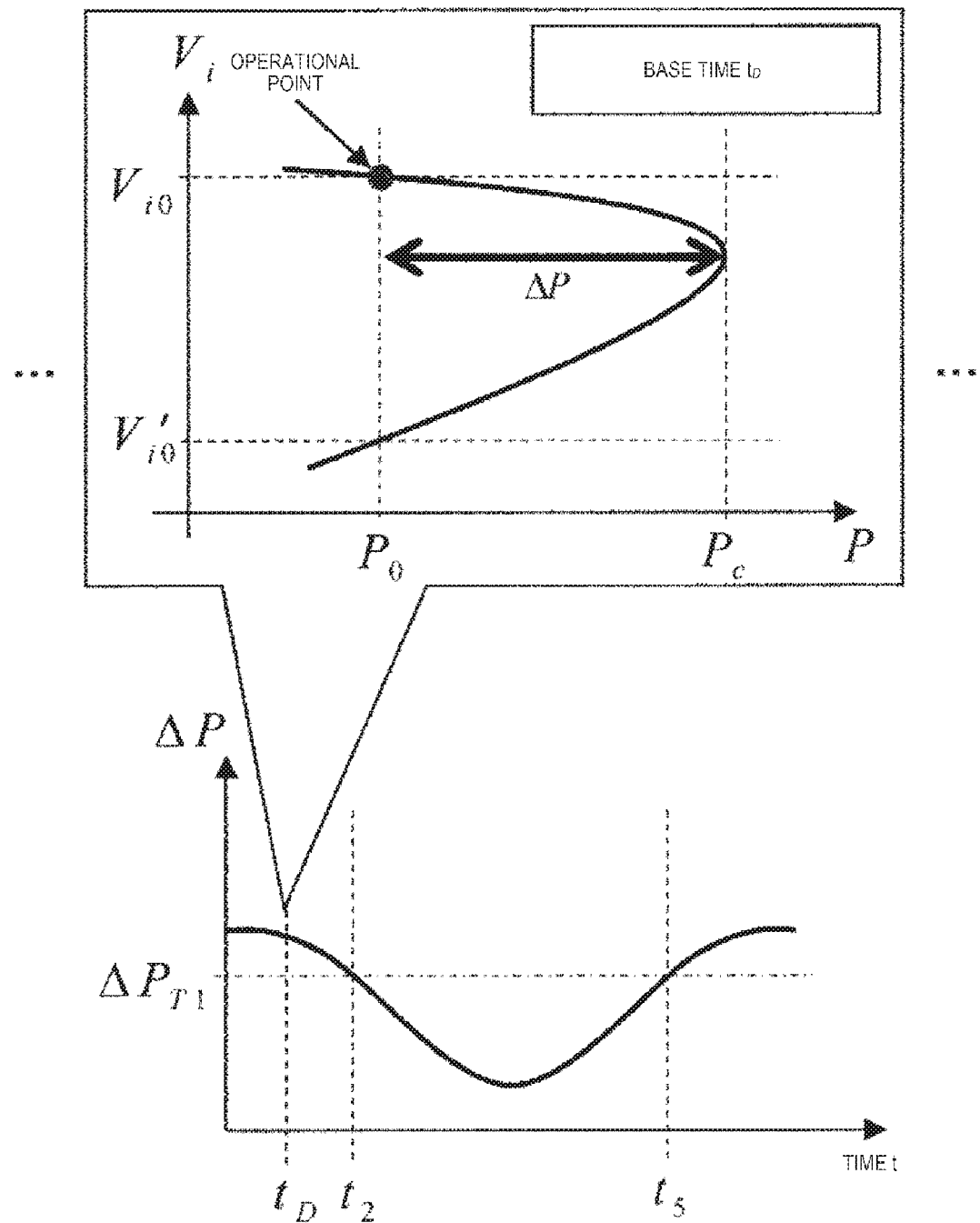

[Fig. 17]
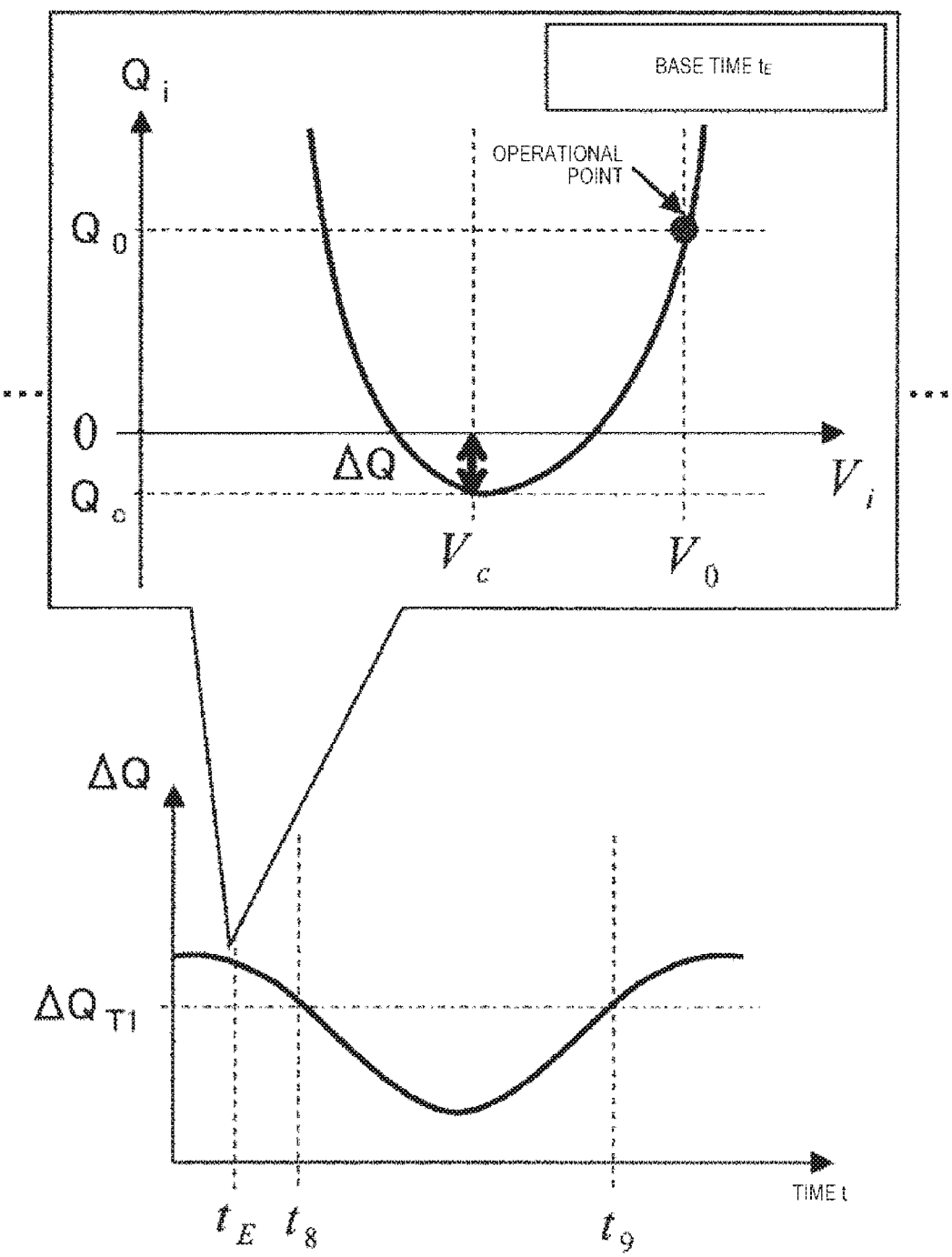

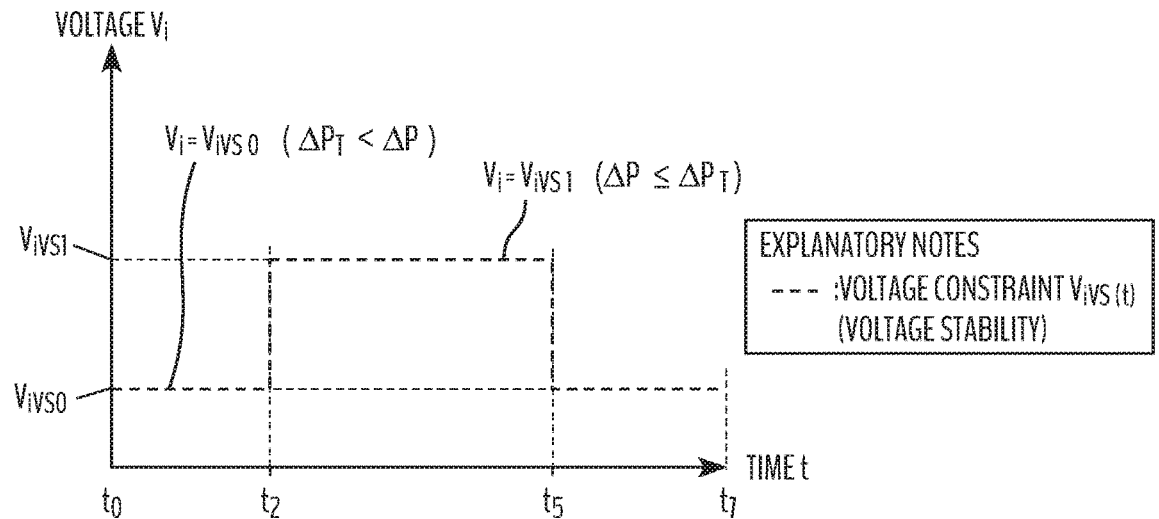
[Fig. 18]
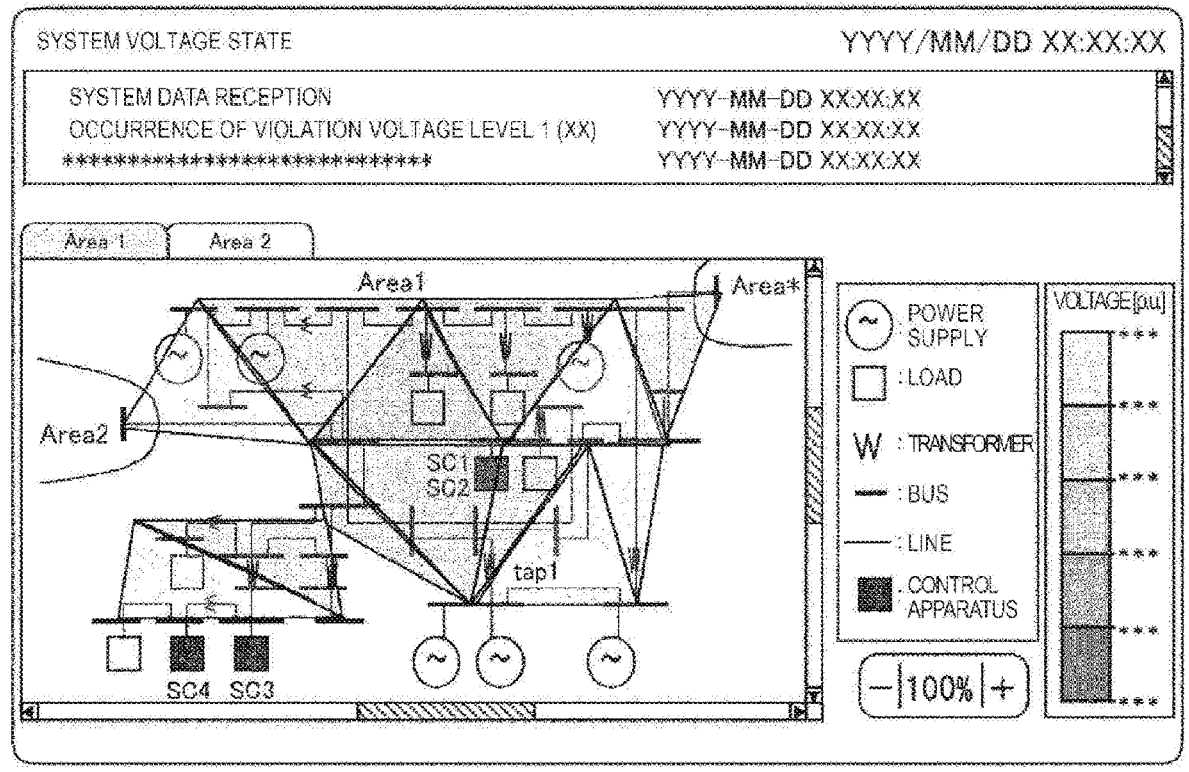
[Fig. 19]

[Fig. 20]
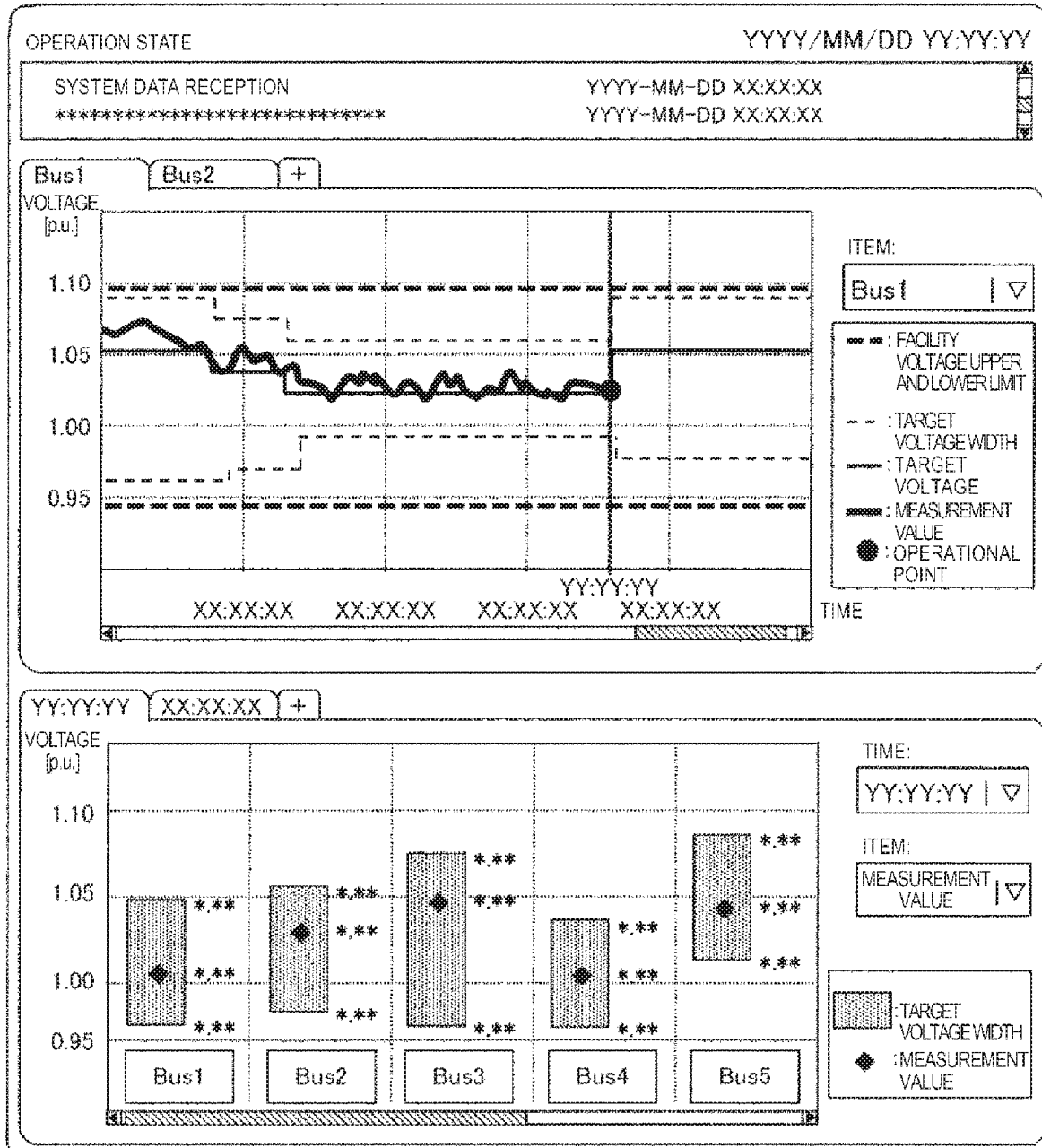

[Fig. 21]
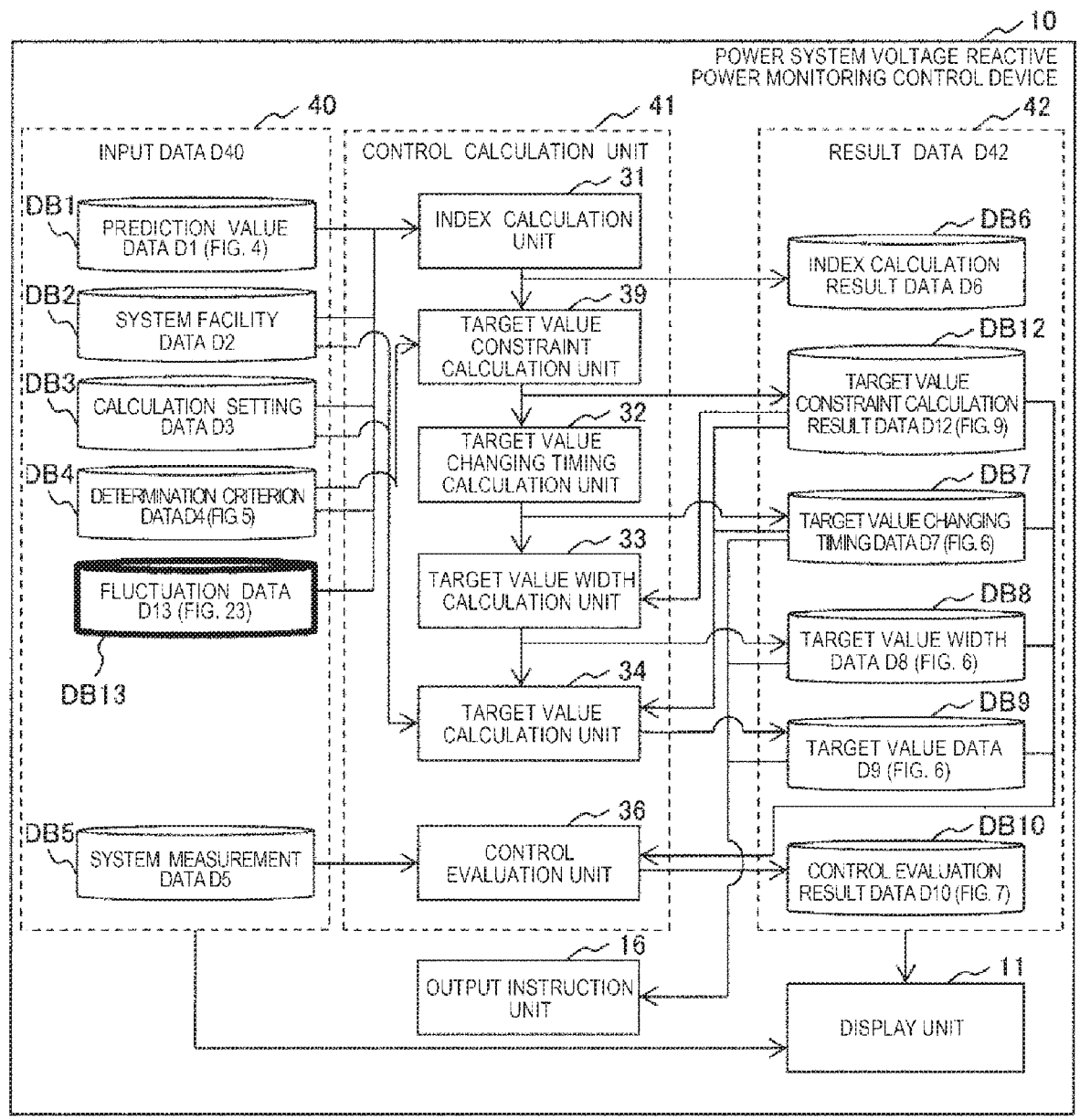

[Fig. 22]
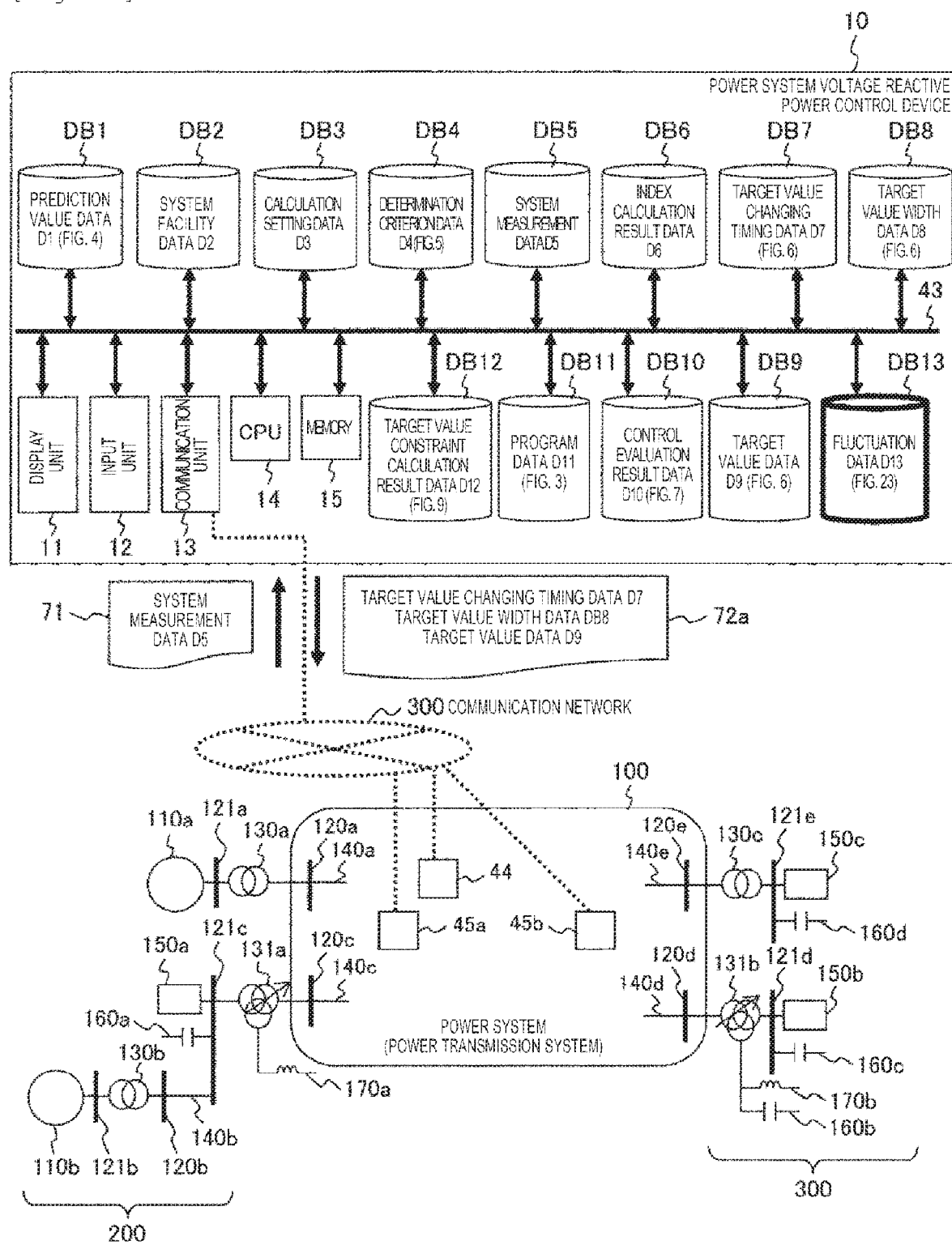

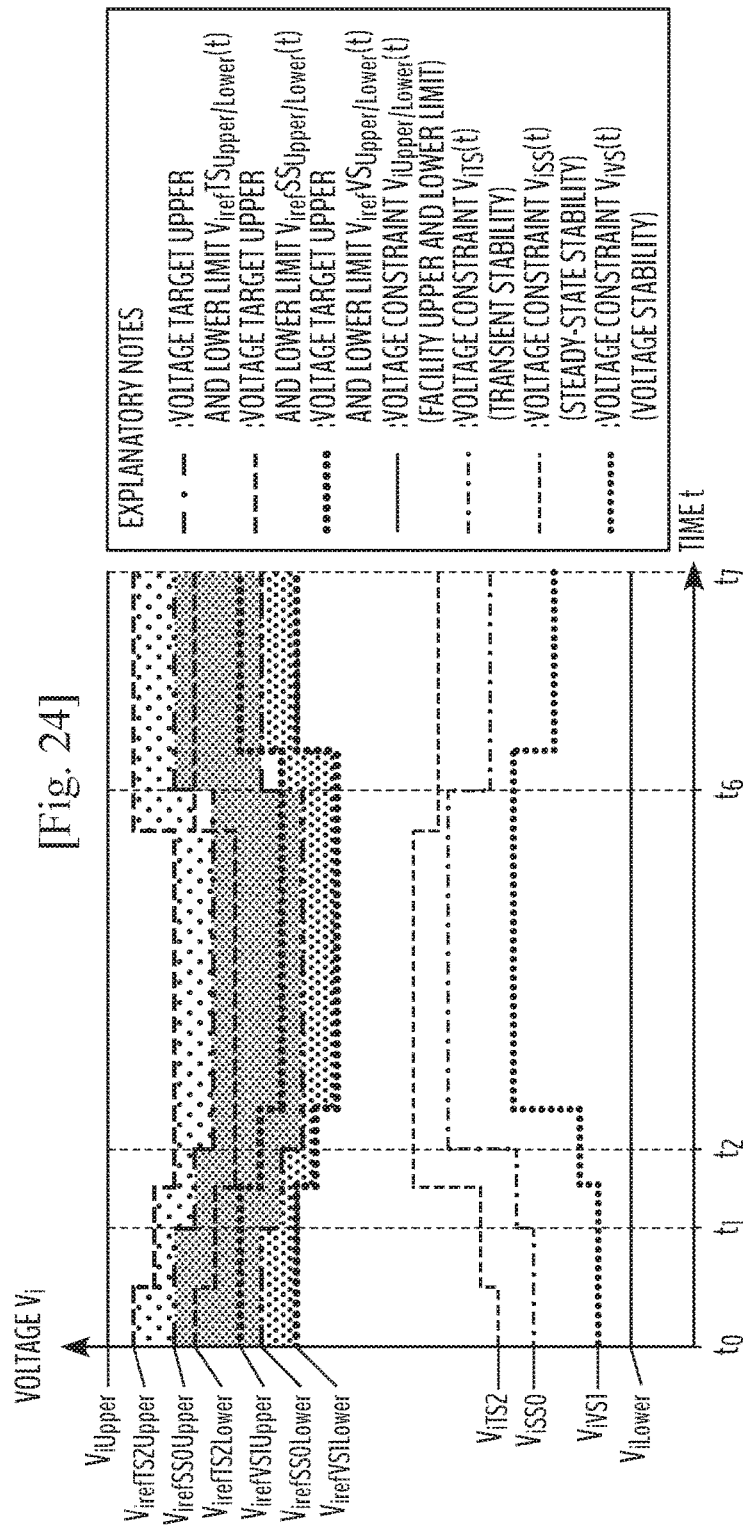

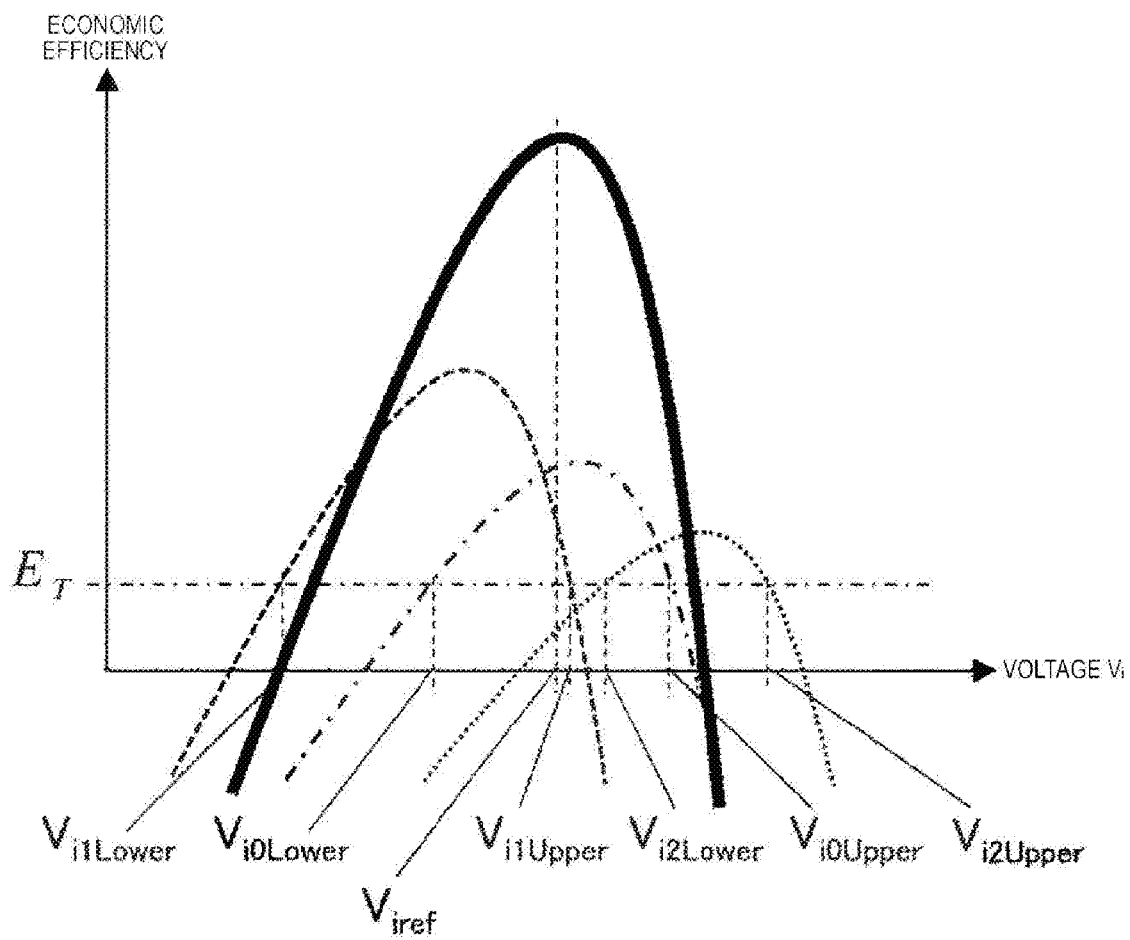
[Fig. 25]

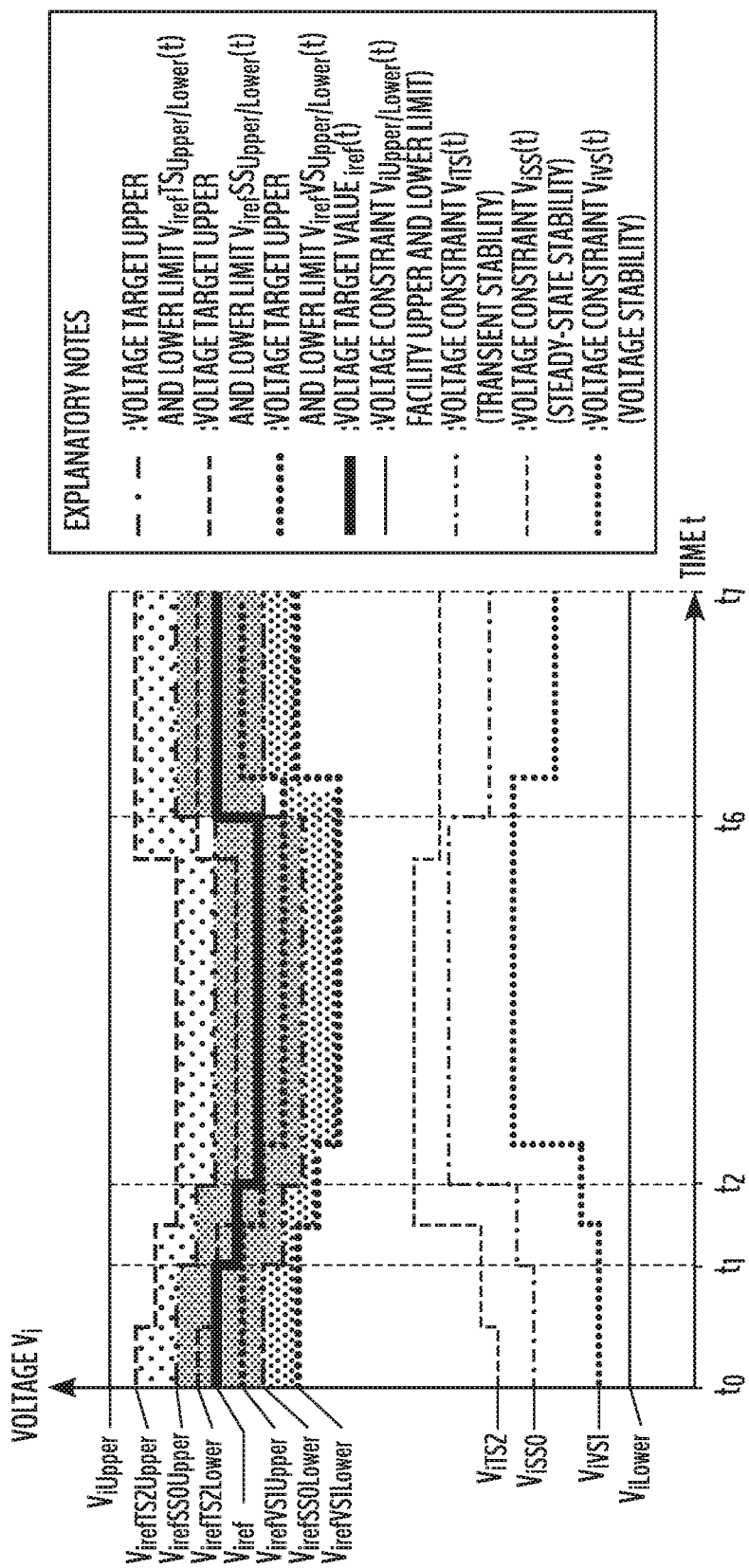
[Fig. 26]

[Fig. 27]
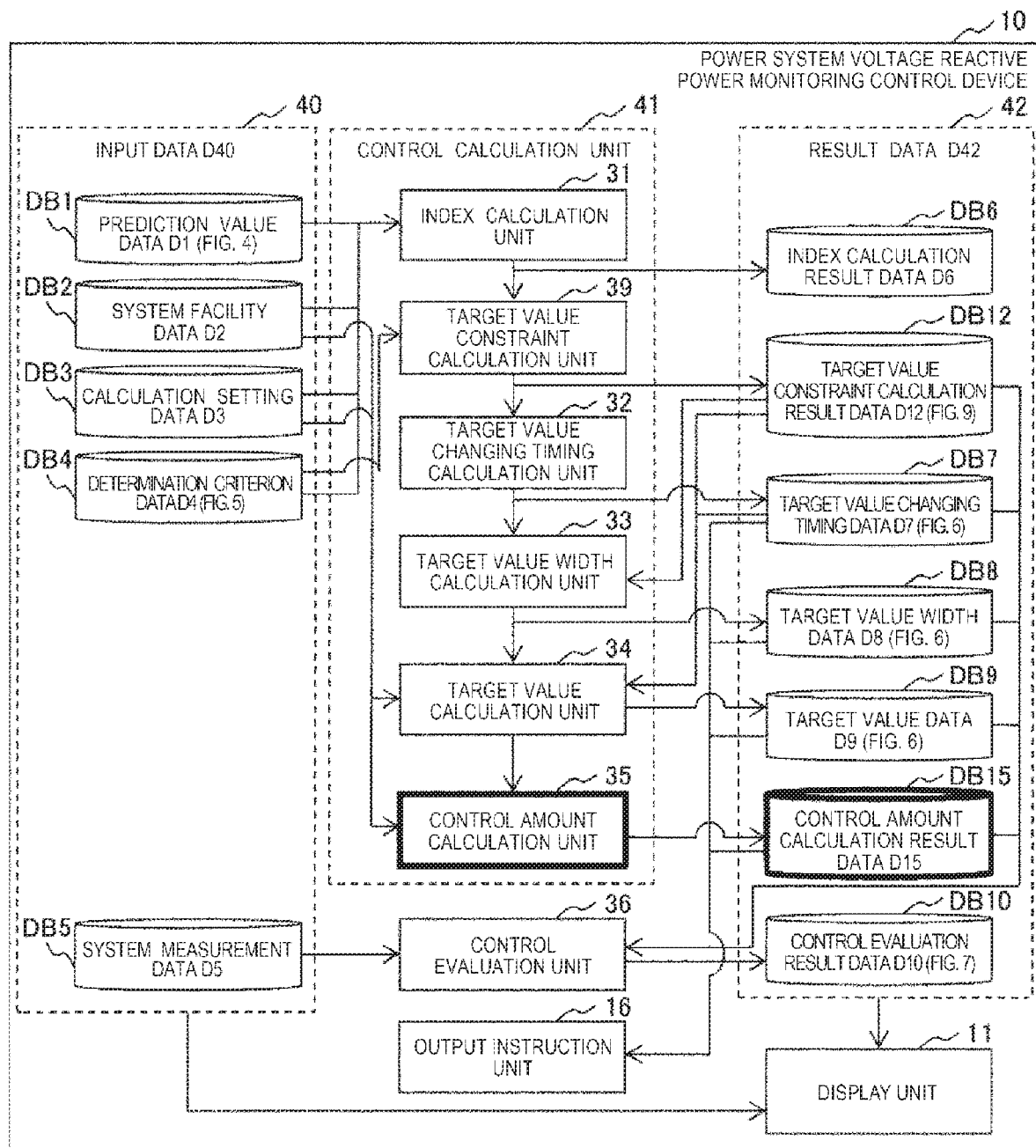

[Fig. 28]
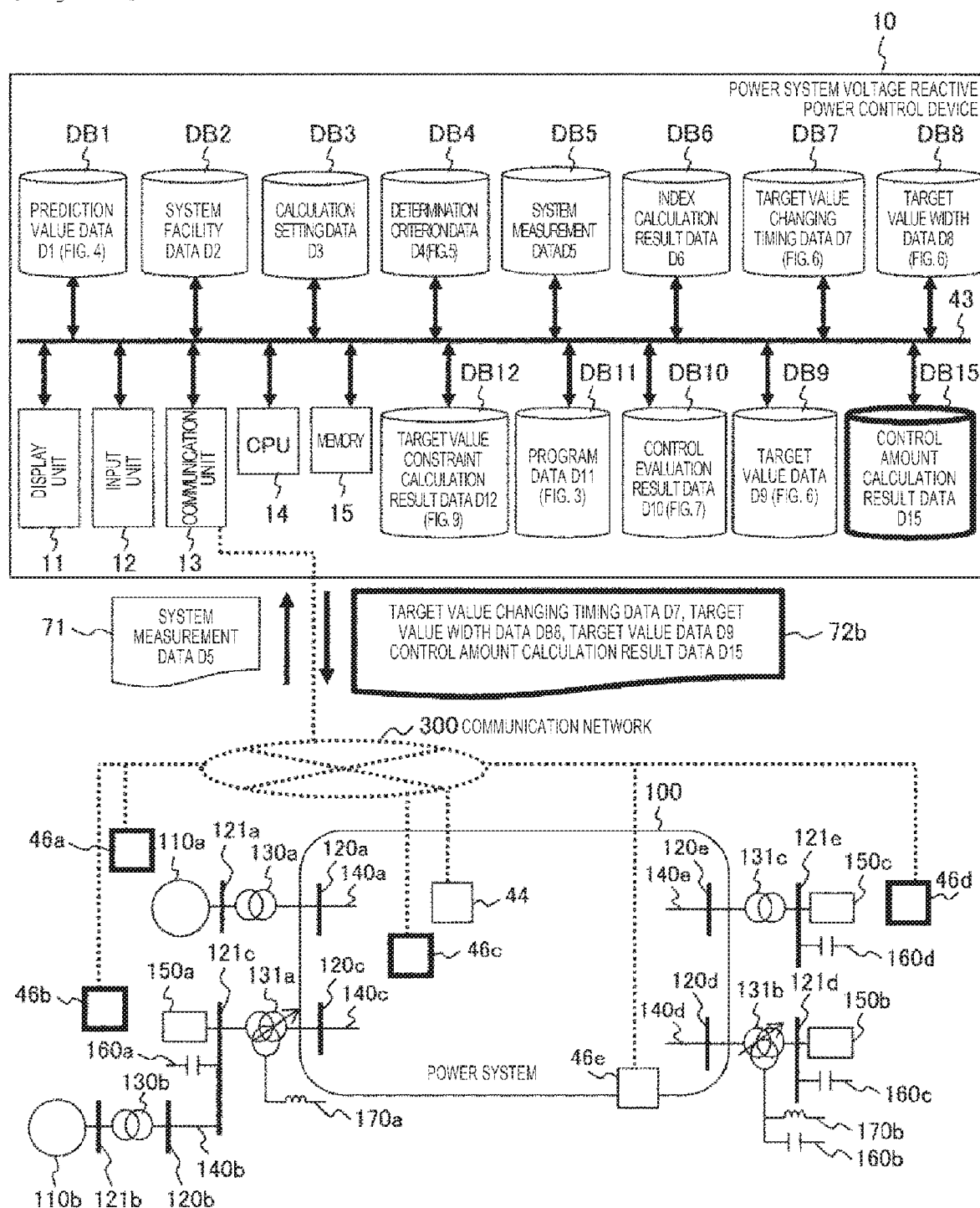

[Fig. 29]

| TIME [s] | TAP1 | TAP2 | ... | SC1 | SC2 | ... | ShR1 | ShR2 | ... | AVR1 | AVR2 | ... | AQR1 | AQR2 | ... |
|---|---|---|---|---|---|---|---|---|---|---|---|---|---|---|---|
| t1 | − | − | ... | − | − | ... | OFF | − | ... | XX | XX | ... | XX | XX | ... |
| t2 | +1 | − | ... | ON | − | ... | − | − | ... | XX | XX | ... | XX | XX | ... |
| : | : | : | : | : | : | : | : | : | : | : | : | : | : | : | : |

DB15

[Fig. 30]
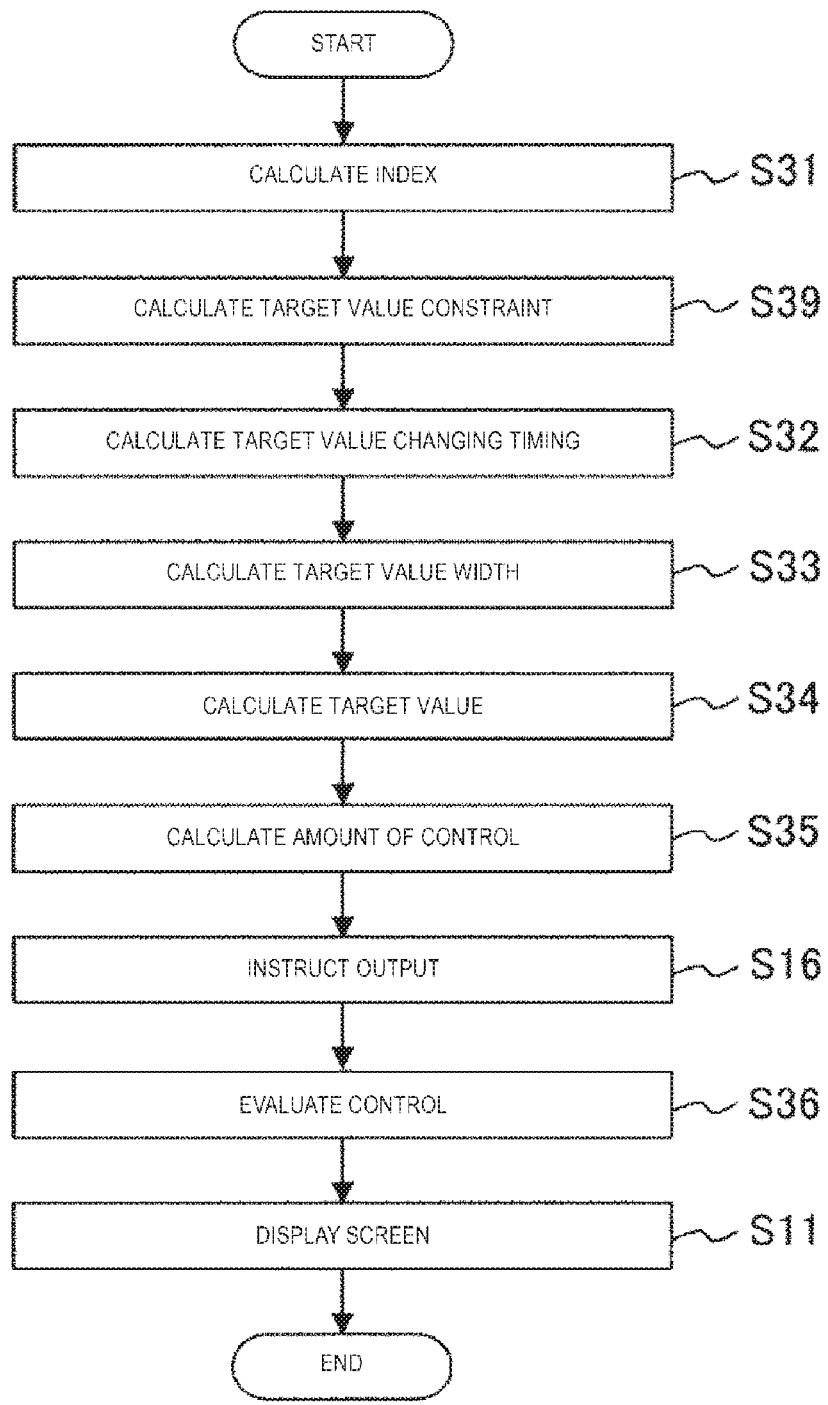

[Fig. 31]
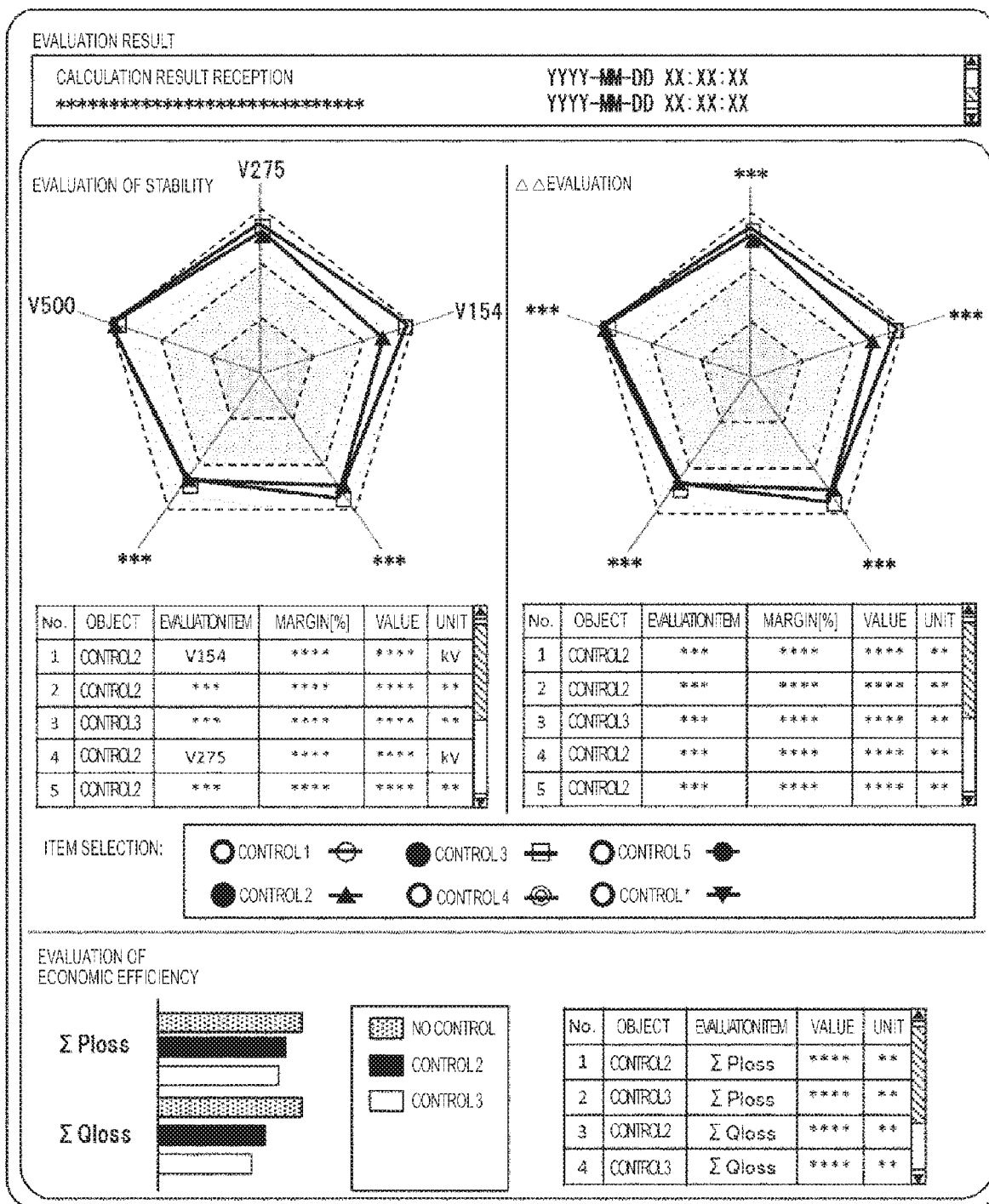

[Fig. 32]
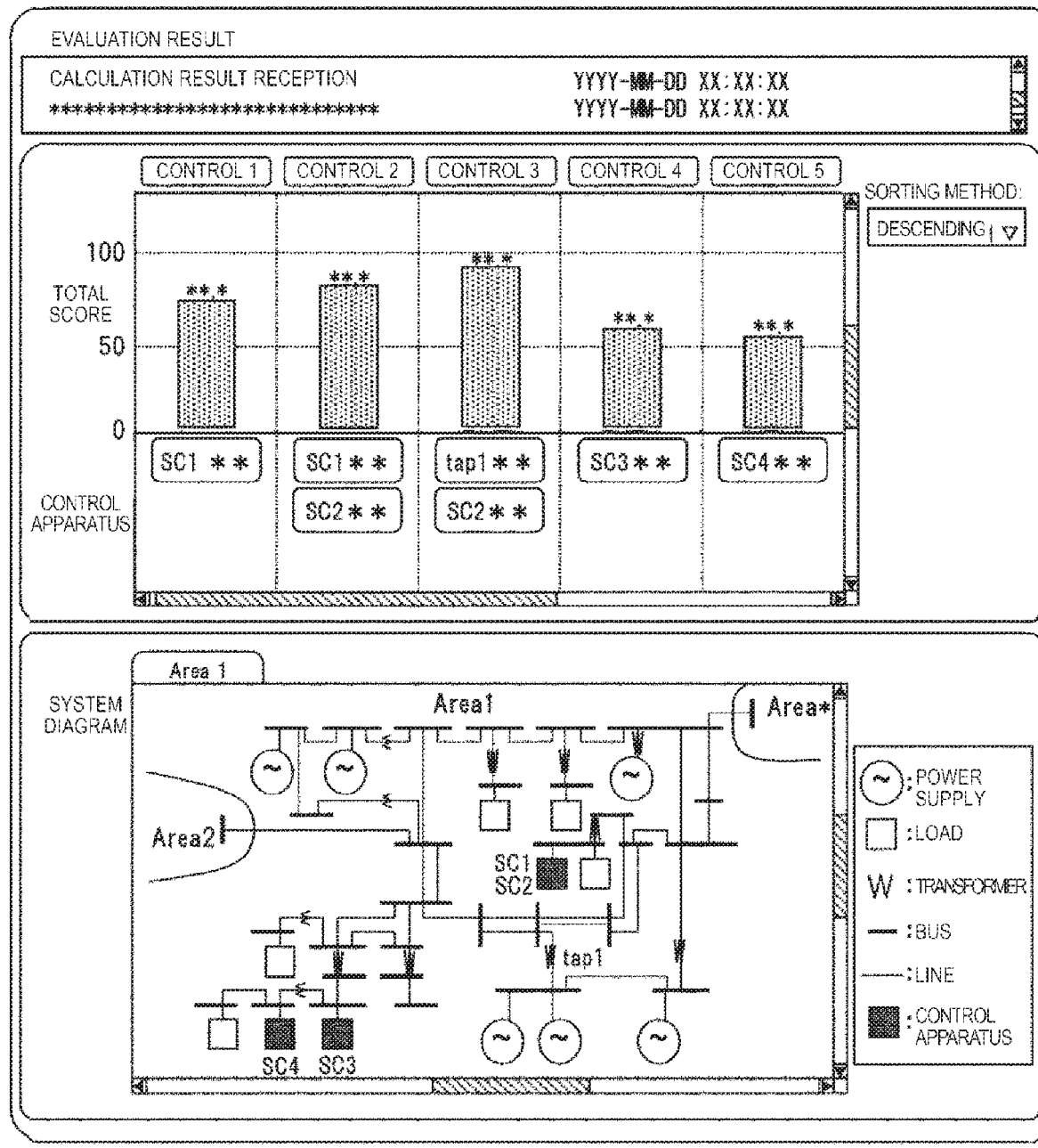

[Fig. 33]
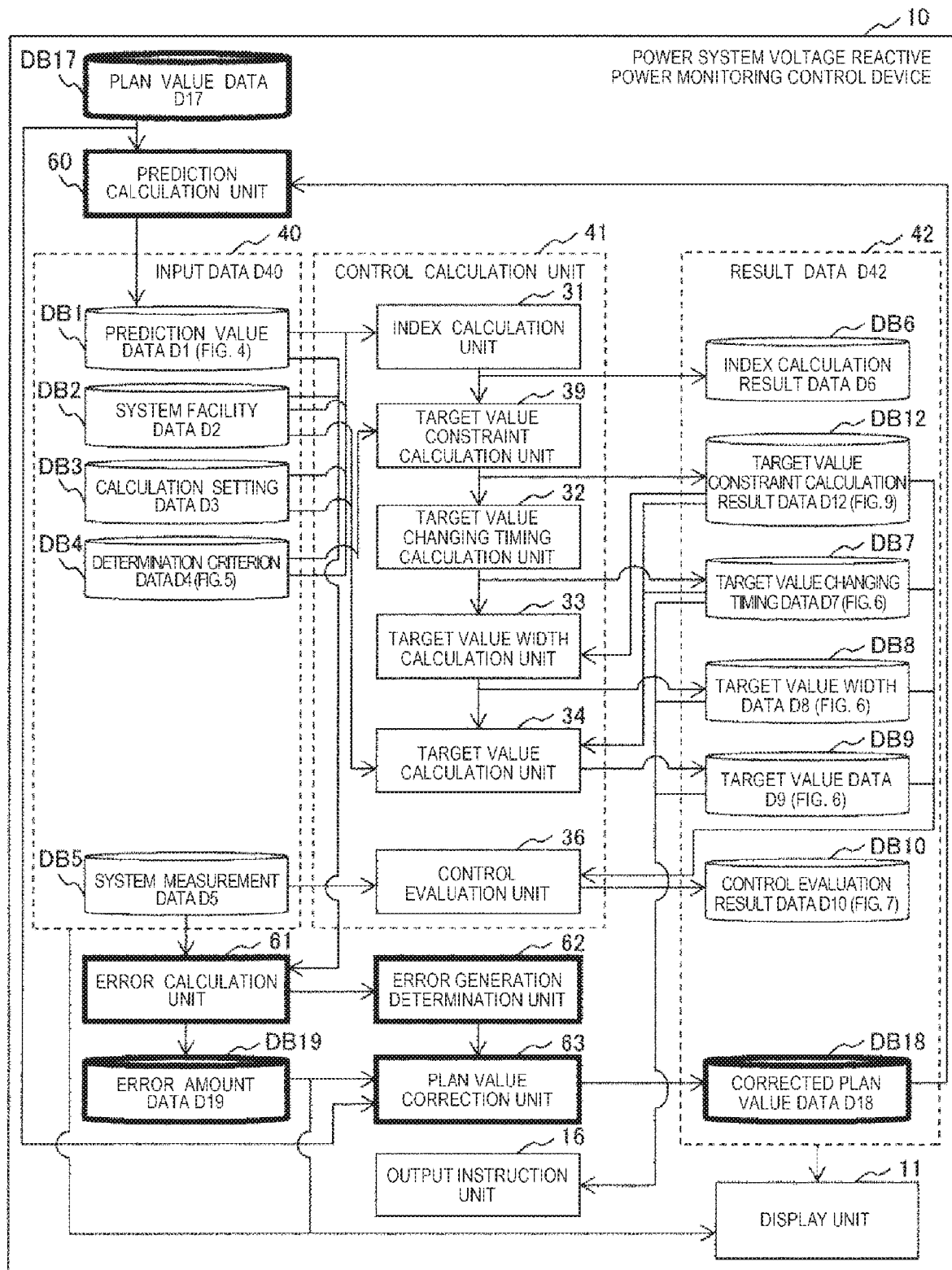

[Fig. 34]
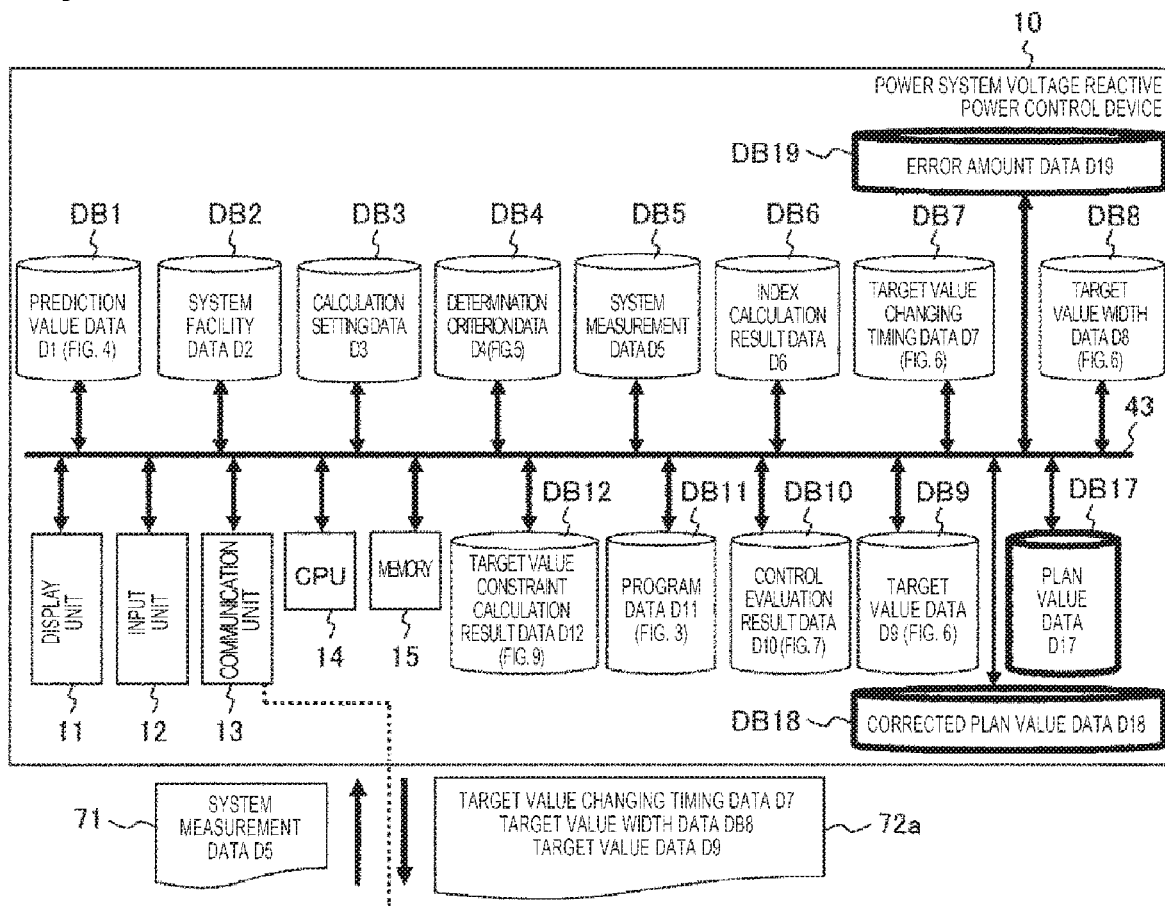
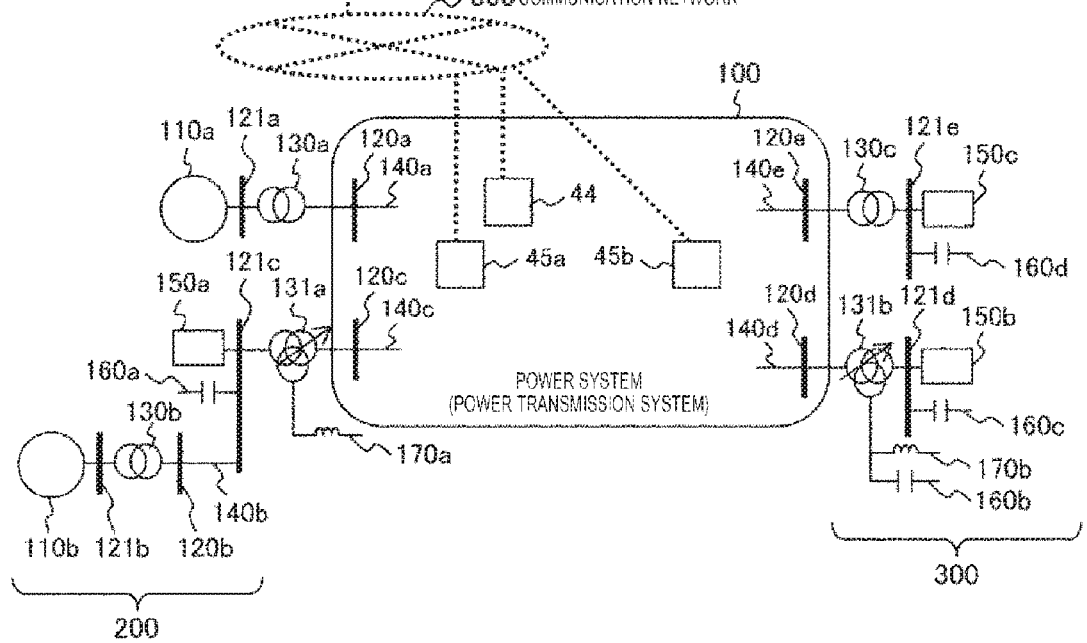

[Fig. 35]

| TIME [s] | PREDICTED CONSUMPTION [p.u.] | | | | POWER GENERATOR OUTPUT PLAN [p.u.] | | | | CONTROL PLAN | | | | | | | |
|---|---|---|---|---|---|---|---|---|---|---|---|---|---|---|---|---|
| | PL1 | QL1 | PL2 | QL2 | ... | PG1 | QG1 | PG2 | QG2 | ... | TAP1 | TAP2 | ... | SC1 | SC2 | ... | ShR1 | ShR2 | ... | AVR1 | AVR2 | ... |
| t1 | XX | XX | XX | XX | ... | XX | XX | XX | XX | ... | - | - | ... | - | - | ... | OFF | - | ... | XX | XX | ... |
| t2 | XX | XX | XX | XX | ... | XX | XX | XX | XX | ... | +1 | - | ... | ON | - | ... | - | - | ... | XX | XX | ... |
| .. | .. | .. | .. | .. | .. | .. | .. | .. | .. | .. | .. | .. | .. | .. | .. | .. | .. | .. | .. | .. | .. | .. |

DB17

[Fig. 36]
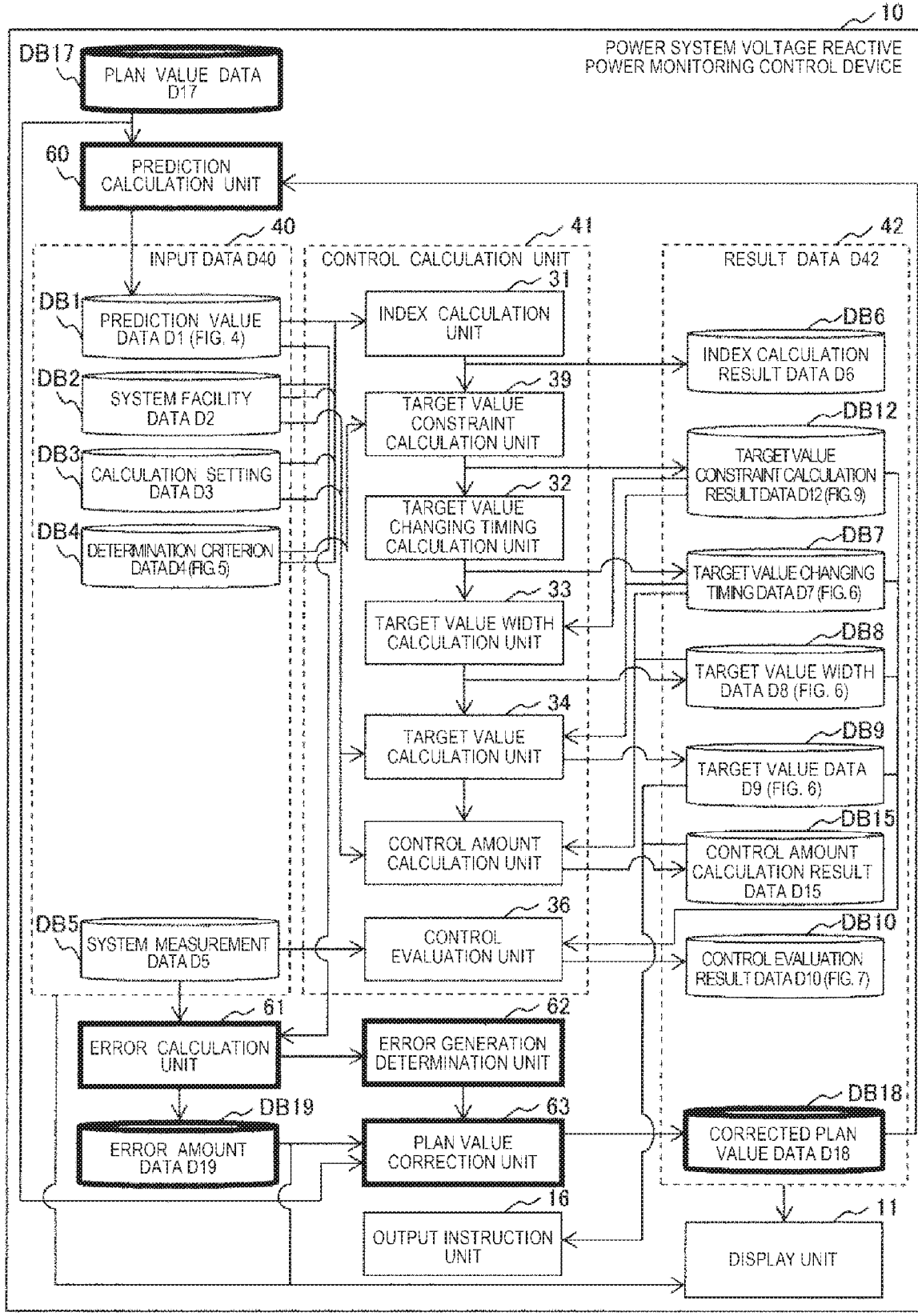

[Fig. 37]
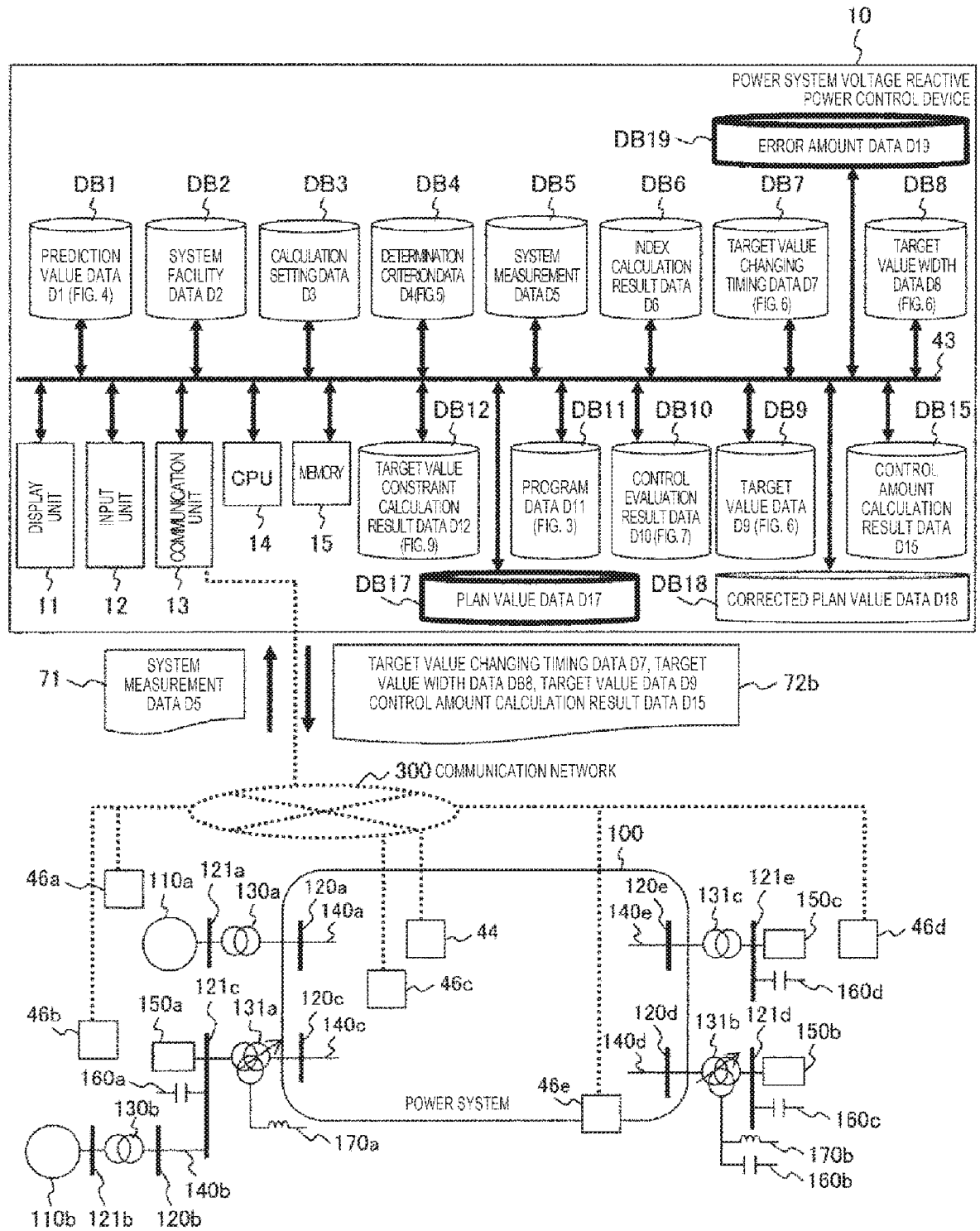

[Fig. 38]
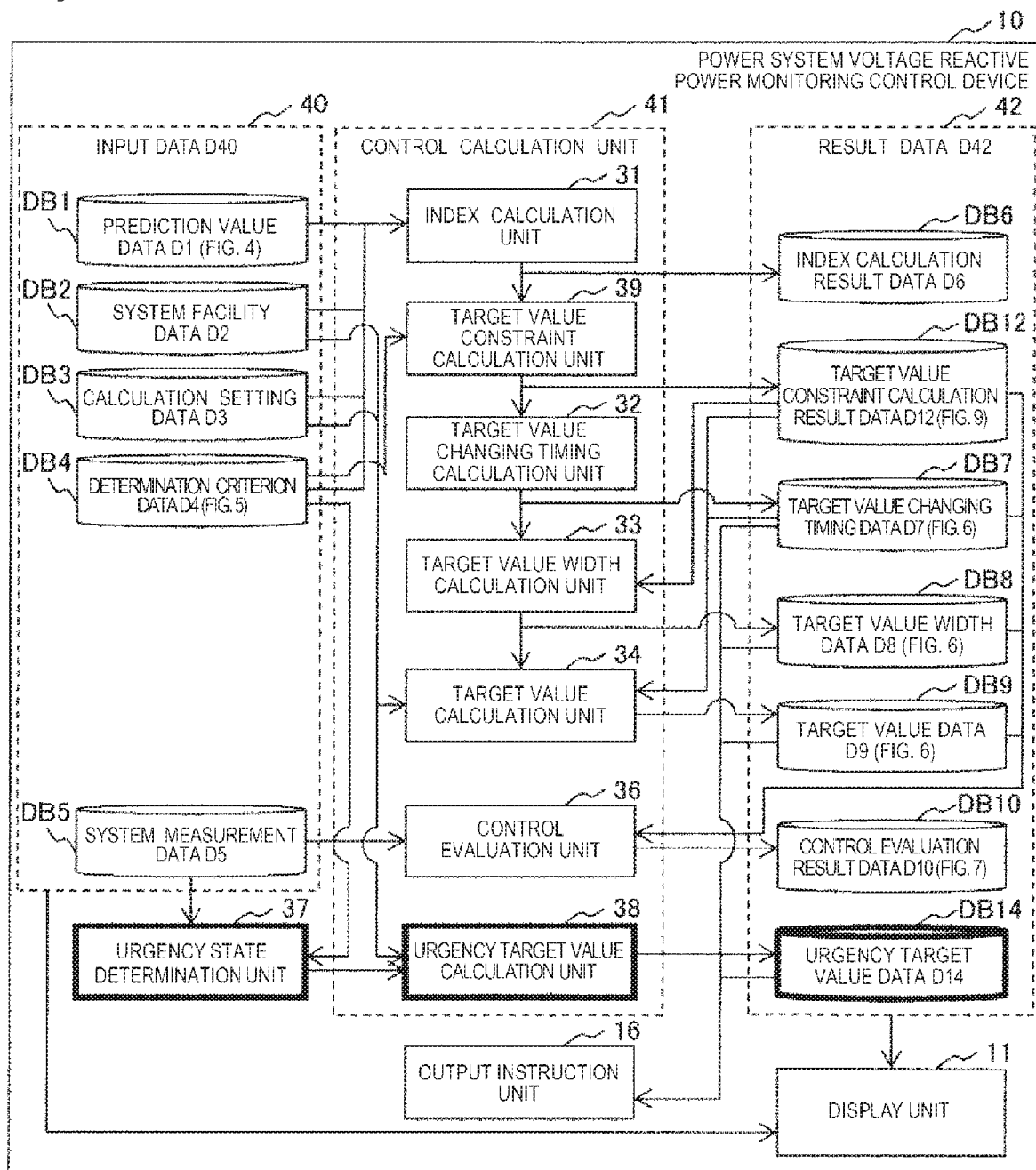

[Fig. 39]
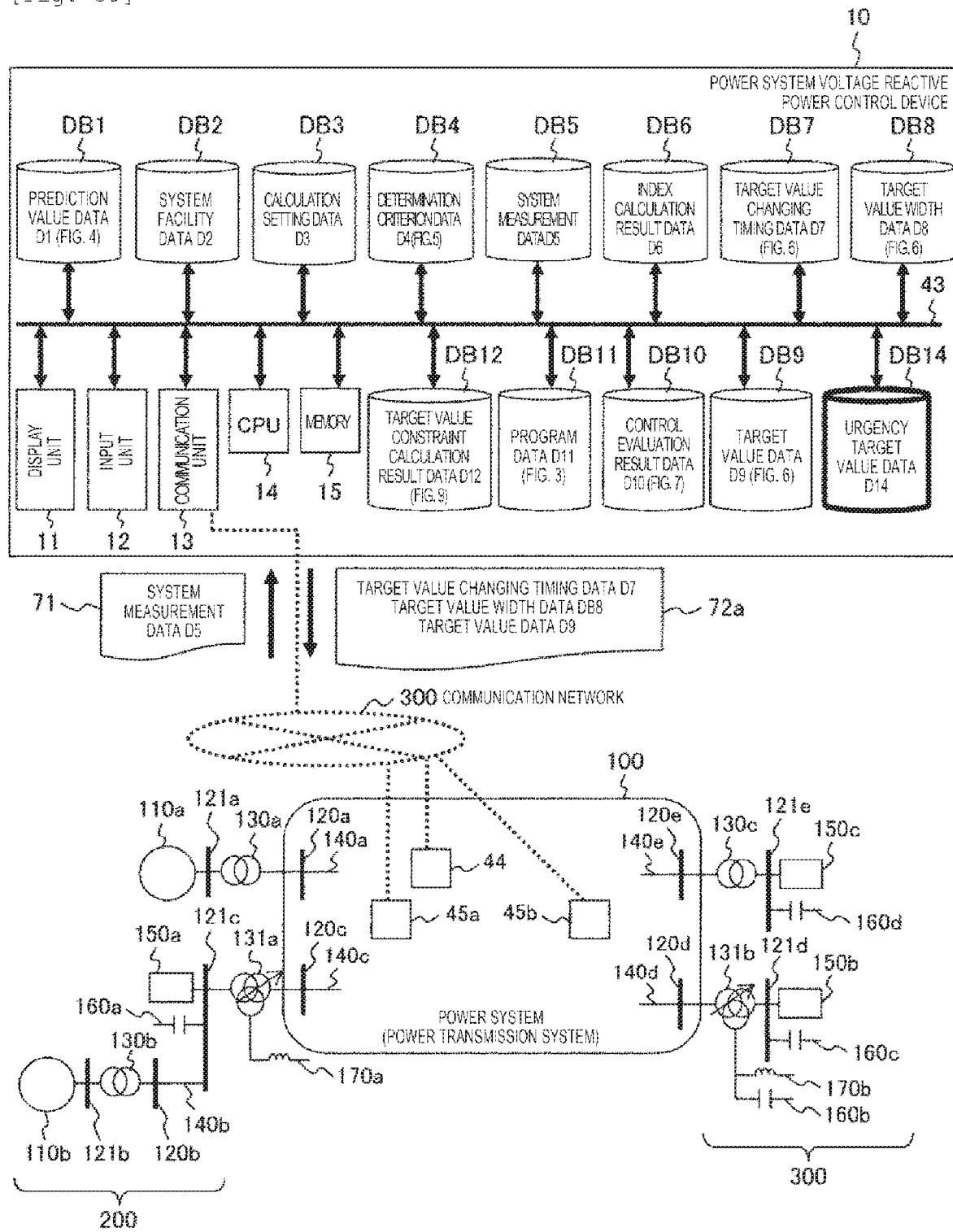

[Fig. 40]
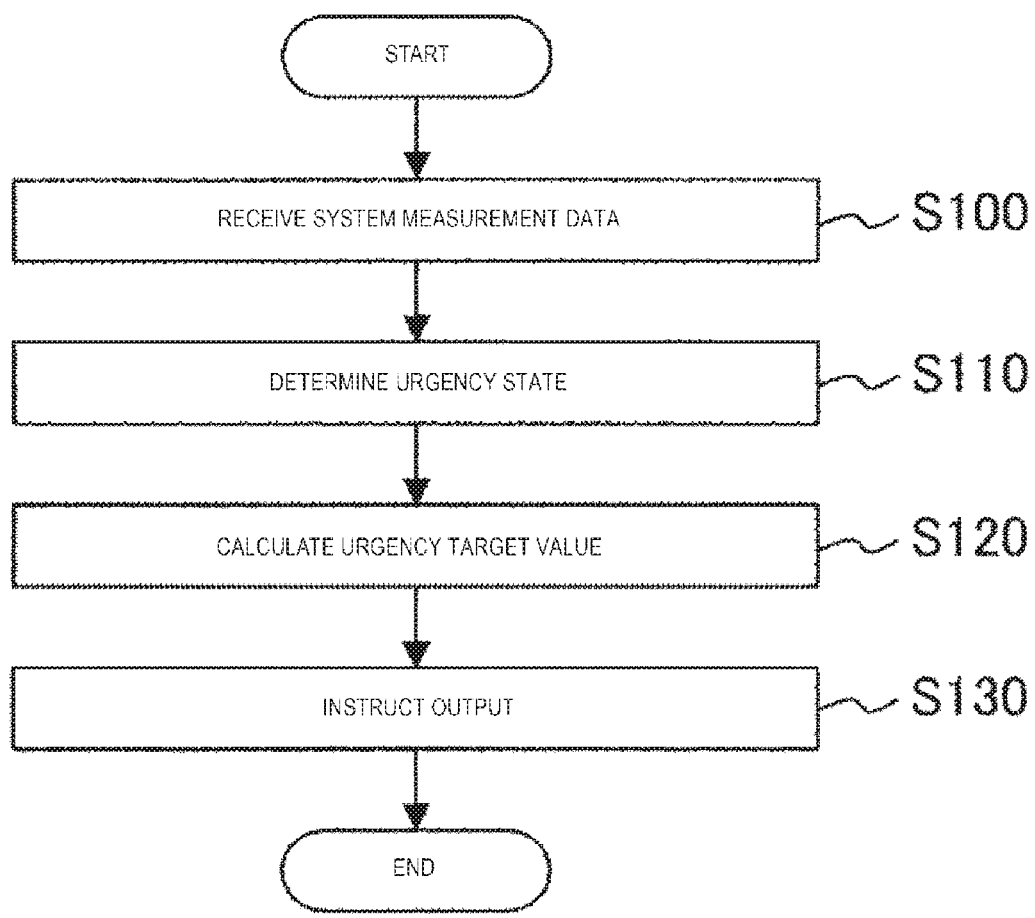

[Fig. 41]
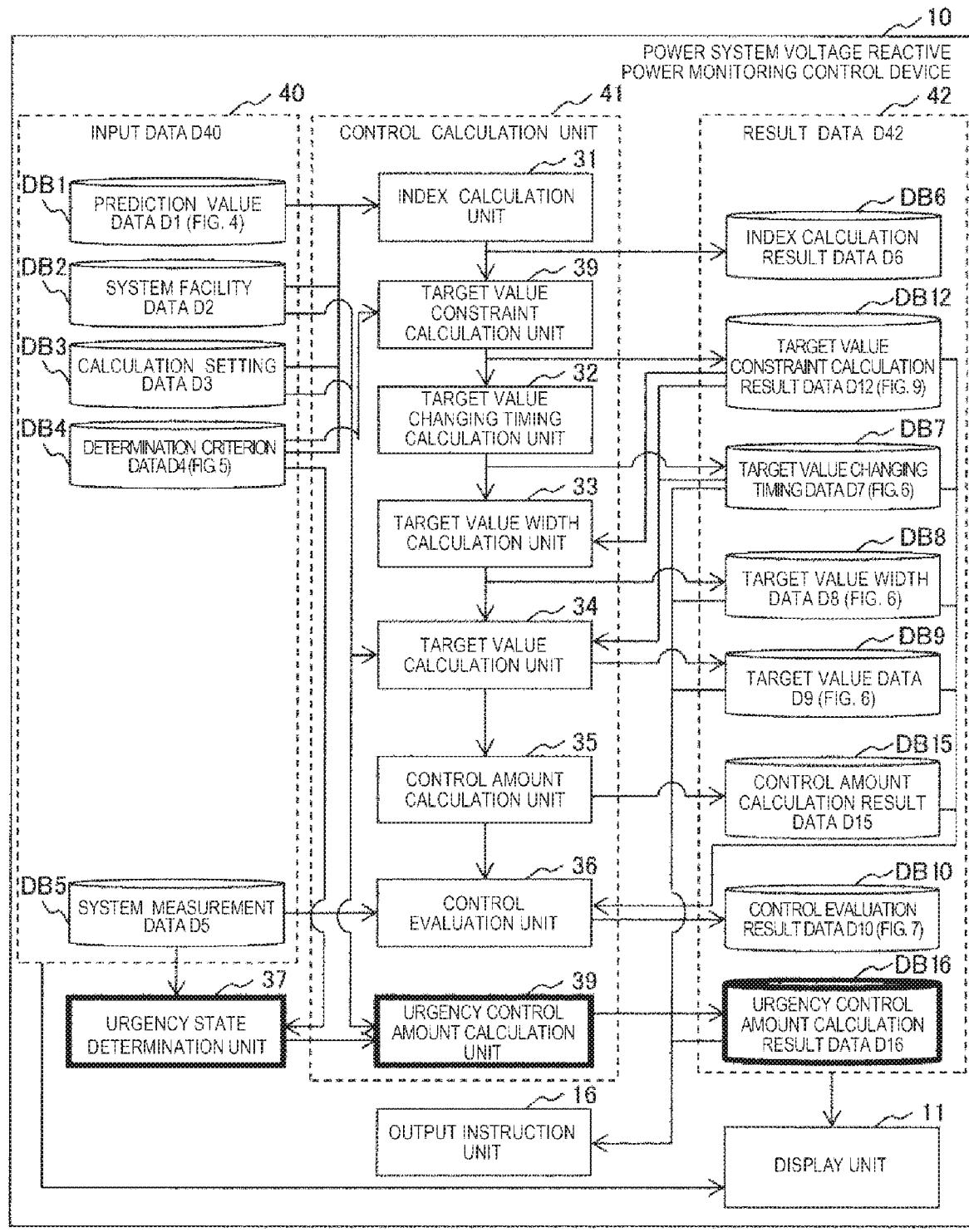

[Fig. 42]
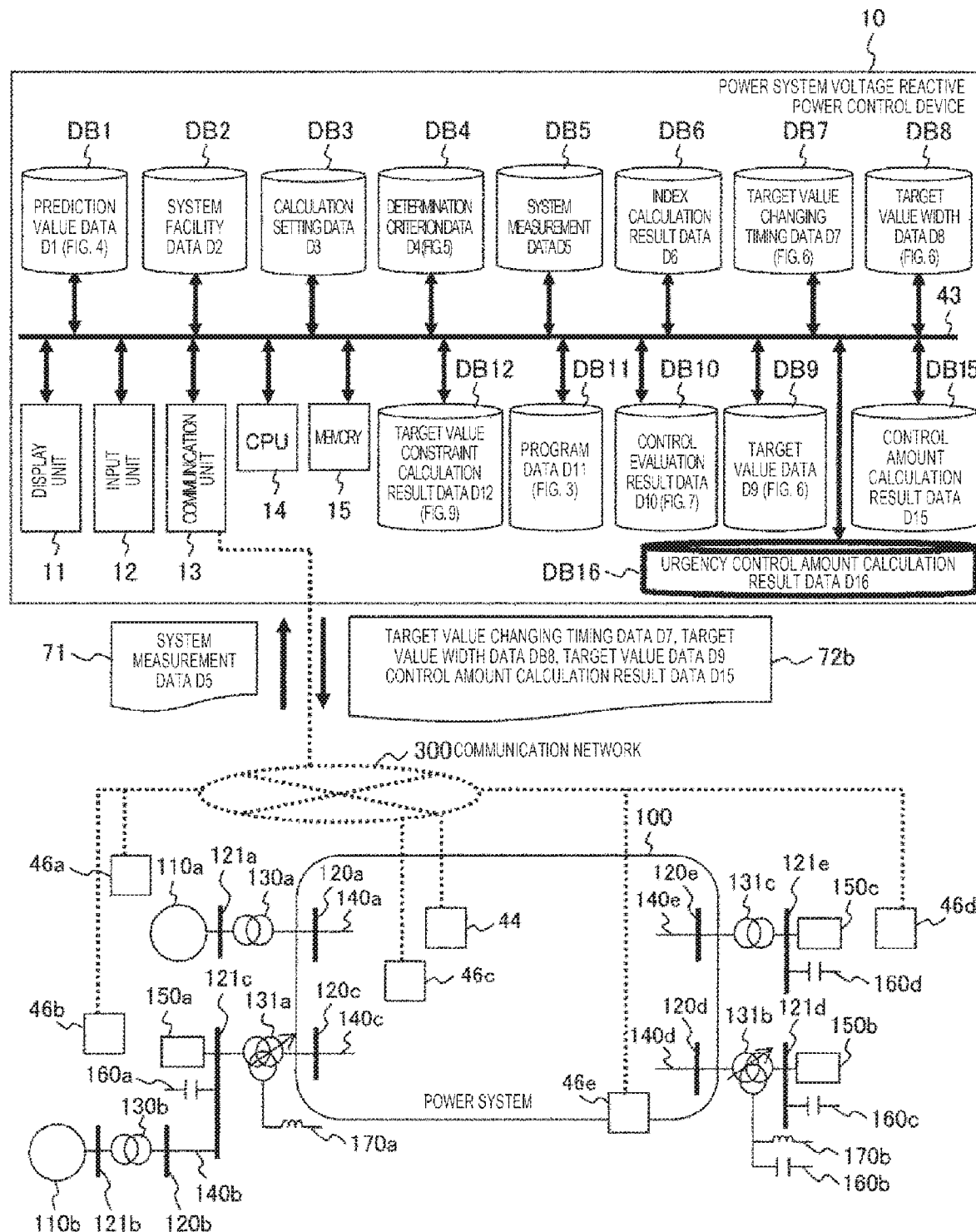

[Fig. 43]
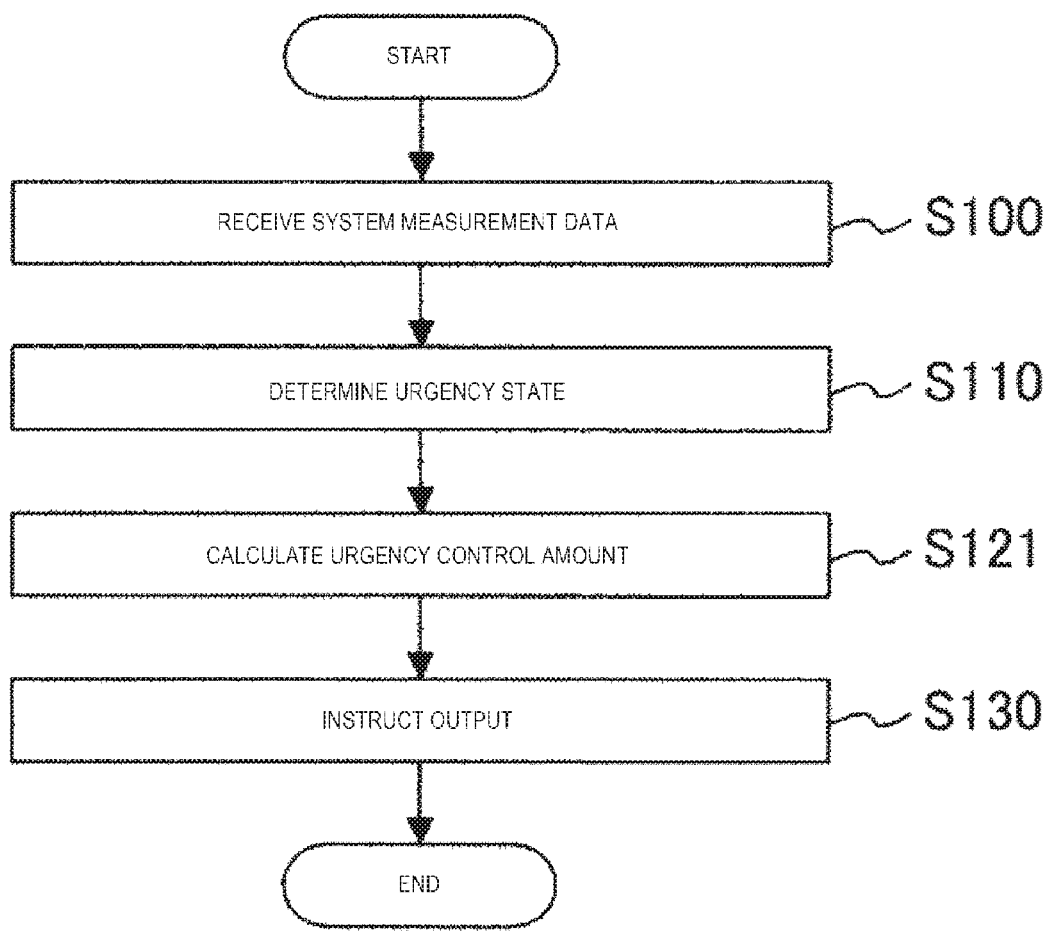

ID
POWER SYSTEM VOLTAGE REACTIVE POWER MONITORING CONTROL DEVICE AND METHOD

TECHNICAL FIELD

The present invention relates to a voltage reactive power monitoring control device of a power system and a method for monitoring the state of the power system and keeping balance between a voltage and a reactive power.

BACKGROUND ART

Background techniques of this technical field include PTL 1 and PTL 2. PTL 1 discloses that "objective functions of a plurality of power system control operations are obtained by objective function calculation means 5 by using data in system state amount storage means 4, the objective functions are subjected to linear transformation by objective function conversion means 101, a comprehensive objective function is further derived by comprehensive objective function calculation means 102, sensitivity is calculated with respect to the comprehensive objective function, and the amount of operation is determined by operation amount determination means 7".

In addition, PTL 2 discloses that "in a power system voltage stability monitoring control system that inputs system information received from a power system to an electronic computer through an information transmission device, and performs processing on the basis of these pieces of information to display a system state, stabilization control means includes index calculation means S1 for calculating a reactive power supply index Qs and a maximum value Qs max thereof for each power supply system, target value setting means S2 for setting a target value of Qs in the reactive power supply index so that a loss in power transmission is reduced when the loss in power transmission is sound, and operation determination means S3 for determining the order of operation of voltage control apparatuses and performing operation so that the reactive power supply index Qs is set to be a target value".

CITATION LIST

Patent Literature

PTL 1: JP-A-9-37463
PTL 2: JP-A-6-284582

SUMMARY OF INVENTION

Technical Problem

In the related art, although it has been expected that a power supply (output fluctuation type power supply) leading to a fluctuation in output depending on the weather, as well as renewable energy resources (photovoltaic, wind power generation, or the like), is introduced in great quantities in power systems, the renewable energy resources have an output fluctuating depending on the weather, and thus there is a possibility that the amount of fluctuation in a voltage or a power flow is increased. For this reason, there is a concern that it is not possible to keep balance between a voltage and a reactive power of a power system and to improve economic efficiency.

In this regard, in a power system control device disclosed in PTL 1, a description is given as follows: "objective functions of a plurality of power system control operations are obtained by objective function calculation means 5 by using data in system state amount storage means 4, the objective functions are subjected to linear transformation by objective function conversion means 101, a comprehensive objective function is further derived by comprehensive objective function calculation means 102, sensitivity is calculated with respect to the comprehensive objective function, and the amount of operation is determined by operation amount determination means 7", and a description is also given as follows: "an object is to provide a power system control device that comprehensively optimizes the control of a plurality of power systems, precisely reflects a set weight on a control result, is capable of setting the value of a weight for obtaining a control result having an operator's will reflected thereon, and is capable of performing comprehensive control based on a system state".

However, there are problems in that there is a concern that it is not possible to keep balance between a voltage and a reactive power of the power system because the value of the weight for obtaining the control result having the operator's will reflected thereon does not necessarily depend on a value based on a system state due to a cause such as a fluctuation in the output of renewable energy resources with the elapse of time due to the weather or a change in a power supply configuration or a system configuration with the elapse of time, and there is a concern that it is not possible to improve economic efficiency. In addition, there is a problem in that effort to adjust the weight during multi-objective optimization computational calculation.

Consequently, an object of the invention is to provide a power system voltage reactive power monitoring control device and a method which are capable of keeping balance between a voltage and a reactive power of a power system and improving economic efficiency even when the output of renewable energy resources fluctuates with the elapse of time due to the weather and a power supply configuration or a system configuration is changed.

Solution to Problem

In order to solve the above-described problems, for example, configurations described in claims are adopted.

The invention includes a plurality of means for solving the above-described problems, and an example thereof is "a power system voltage reactive power monitoring control device that gives transmission data to an individual device capable of adjusting a voltage and a reactive power of a power system, in which the power system voltage reactive power monitoring control device obtains one or more target value constraints by using one or more indexes indicating stability of the power system, obtains information on a target value from the target value constraint, gives transmission data including the information on the target value to the individual device, and adjusts a voltage and a reactive power at an installation location by the individual device".

In addition, the invention provides "a power system voltage reactive power monitoring control device that gives transmission data to an individual device capable of adjusting a voltage and a reactive power of a power system, the power system voltage reactive power monitoring control device including an index calculation unit that calculates an index value from one or more of a prediction value of power system information, system facility information, calculation setting information, and determination criterion information, a target value constraint calculation unit that calculates one or more target value constraints of a portion of the power system by using a calculation result of the index calculation unit and the determination criterion information, a target value changing timing calculation unit that calculates a target value changing timing by using a calculation result of the target value constraint calculation unit, a target value width calculation unit that calculates a target value width by using the calculation result of the target value constraint calculation unit, a target value calculation unit that calculates a target value by using the system facility information, the calculation setting information, and one or more calculation results of the target value constraint calculation unit, the target value changing timing calculation unit, and the target value width calculation unit, an output instruction unit that instructs control output by using one or more calculation results of the target value changing timing calculation unit, the target value width calculation unit, and the target value calculation unit, a control evaluation unit that evaluates an instruction result of the output instruction unit by using measurement information of the power system information and one or more calculation results of the target value constraint calculation unit, the target value changing timing calculation unit, the target value width calculation unit, and the target value calculation unit, and a display unit that displays one or more calculation results of the index calculation unit, the target value constraint calculation unit, the target value changing timing calculation unit, the target value width calculation unit, the target value calculation unit, and the control evaluation unit".

In addition, the invention provides "a voltage reactive power monitoring control method in a power system, the method including an index calculation processing step of calculating an index value from one or more of a prediction value of power system information, system facility information, calculation setting information, and determination criterion information, a target value constraint calculation processing step of calculating one or more target value constraints of a portion of the power system by using a calculation result obtained in the index calculation processing step and the determination criterion information, a target value changing timing calculation processing step of calculating a target value changing timing by using a calculation result obtained in the target value constraint calculation processing step, a target value width calculation processing step of calculating a target value width by using the calculation result obtained in the target value constraint calculation processing step, a target value calculation processing step of calculating a target value by using the system facility information, the calculation setting information, and one or more calculation results obtained in the target value constraint calculation processing step, the target value changing timing calculation processing step, and the target value width calculation processing step, an output instruction processing step of instructing control output by using one or more calculation results obtained in the target value changing timing calculation processing step, the target value width calculation processing step, and the target value calculation processing step, a control evaluation processing step of evaluating an instruction result obtained in the output instruction processing step by using measurement information of the power system information and one or more calculation results obtained in the target value constraint calculation processing step, the target value changing timing calculation processing step, the target value width calculation processing step, and the target value calculation processing step, and a display processing step of displaying one or more calculation results obtained in the index calculation processing step, the target value constraint calculation processing step, the target value changing timing calculation processing step, the target value width calculation processing step, the target value calculation processing step, and the control evaluation processing step".

Advantageous Effects of Invention

According to the invention, it is possible to keep balance between a voltage and a reactive power of a power system and to improve economic efficiency even when the output of renewable energy resources fluctuates with the elapse of time due to the weather and a power supply configuration or a system configuration is changed. In addition, it is possible to reduce effort to perform weighting when using a plurality of objective functions, in the calculation of a target value or the amount of control of a power system voltage reactive power monitoring control device.

BRIEF DESCRIPTION OF DRAWINGS

FIG. 1 is a diagram illustrating a configuration of a power system voltage reactive power monitoring control device 10 in the functional aspect.

FIG. 2 is a diagram illustrating a hardware configuration of a power system voltage reactive power monitoring control device in Example 1 and an example of the overall configuration of a power system.

FIG. 3 is a diagram illustrating functions executed on the basis of program data D11 held in a program database DB11 according to program names.

FIG. 4 is a diagram illustrating an example of prediction value data D1.

FIG. 5 is a diagram illustrating an example of determination criterion data D4.

FIG. 6 is a diagram illustrating an example of target value changing timing data, target value width data, and target value data in Example 1.

FIG. 7 is a diagram illustrating an example of control evaluation result data.

FIG. 8 is an example of a flow chart illustrating the overall processing of the power system voltage reactive power monitoring control device in Example 1.

FIG. 9 is a diagram illustrating an example of a calculation result of a target value constraint used to calculate a target value changing timing, a target value width, or a target value.

FIG. 10 is a diagram illustrating an example of a process of calculating a target value changing timing and a target value width.

FIG. 11 is a diagram illustrating an example of calculation results of a target value.

FIG. 12 is a diagram illustrating an example of an index calculation process based on transient stability calculation.

FIG. 13 is a diagram illustrating an example of a process of obtaining a target value constraint of a voltage from a transient stability calculation result.

FIG. 14 is a diagram illustrating an example of an index calculation process based on steady-state stability calculation.

FIG. 15 is a diagram illustrating an example of a process of obtaining a target value constraint of a voltage from steady-state stability calculation results.

FIG. 16 is a diagram illustrating an example of an index calculation process based on voltage stability calculation.

FIG. 17 is a diagram illustrating an example of an index calculation process based on voltage stability calculation.

FIG. 18 is a diagram illustrating an example of a process of obtaining a target value constraint of a voltage from a voltage stability calculation result.

FIG. 19 is a diagram illustrating an example of a screen on which a system voltage state for confirming control evaluation results is displayed.

FIG. 20 is a diagram illustrating an example of a screen on which a system operational state for confirming control evaluation results is displayed.

FIG. 21 is a diagram illustrating a configuration of a power system voltage reactive power monitoring control device in Example 2 in the functional aspect.

FIG. 22 is a diagram illustrating a hardware configuration of a power system voltage reactive power monitoring control device in Example 2 and an example of the overall configuration of a power system.

FIG. 23 is a diagram illustrating an example of fluctuation data D13.

FIG. 24 is a diagram illustrating an example of target value constraint data in Example 2.

FIG. 25 is a diagram illustrating an example of a target value calculation process in Example 2.

FIG. 26 is a diagram illustrating an example of target value data in Example 2.

FIG. 27 is a diagram illustrating a configuration of a power system voltage reactive power monitoring control device in Example 3 in the functional aspect.

FIG. 28 is a diagram illustrating a hardware configuration of the power system voltage reactive power monitoring control device in Example 3 and an example of the overall configuration of a power system.

FIG. 29 is a diagram illustrating an example of control amount calculation result data.

FIG. 30 is an example of a flow chart illustrating the overall processing of the power system voltage reactive power monitoring control device in Example 3.

FIG. 31 is a diagram illustrating an example of a screen on which control evaluation results are displayed.

FIG. 32 is a diagram illustrating an example of a screen on which control evaluation results are displayed.

FIG. 33 is a diagram illustrating a configuration of a power system voltage reactive power monitoring control device in Example 4 in the functional aspect.

FIG. 34 is a diagram illustrating a hardware configuration of a power system voltage reactive power monitoring control device in Example 4 and an example of the overall configuration of a power system.

FIG. 35 is a diagram illustrating an example of plan value data.

FIG. 36 is a diagram illustrating a configuration of a power system voltage reactive power monitoring control device in Example 5 in the functional aspect.

FIG. 37 is a diagram illustrating a hardware configuration of the power system voltage reactive power monitoring control device in Example 5 and an example of the overall configuration of a power system.

FIG. 38 is a diagram illustrating a configuration of a power system voltage reactive power monitoring control device in Example 6 in the functional aspect.

FIG. 39 is a diagram illustrating a hardware configuration of a power system voltage reactive power monitoring control device in Example 6 and an example of the overall configuration of a power system.

FIG. 40 is a flow chart illustrating the overall processing of urgency state determination and urgency target value calculation of the power system voltage reactive power monitoring control device in Example 6.

FIG. 41 is a diagram illustrating a hardware configuration of a power system voltage reactive power monitoring control device in Example 7 and an example of the overall configuration of a power system.

FIG. 42 is a flow chart illustrating the overall processing of urgency state determination and urgency target value calculation of the power system voltage reactive power monitoring control device in Example 7.

FIG. 43 is a flow chart illustrating the overall processing of urgency state determination and urgency control amount calculation of the power system voltage reactive power monitoring control device in Example 7.

DESCRIPTION OF EMBODIMENTS

Hereinafter, examples of the invention will be described with reference to the accompanying drawings.

The examples of the invention include various configurations, and thus an outline of each example will be described before beginning a detailed description.

Example 1 to be described with reference to FIGS. 1 to 20 shows a system configuration constituted by a central device that performs monitoring control from the viewpoint of the entire power system, and individual devices which are installed at individual portions of the power system and operate on the basis of data transmitted from the central device.

Example 2 to be described with reference to FIGS. 21 to 26 is configured such that a target value excluding the influence of external disturbance is given in consideration of fluctuation data as transmission data in the system configuration of Example 1.

Example 3 to be described with reference to FIGS. 27 to 32 is configured such that the central device sets the transmission data to be given to the individual devices as the amount of control for the individual devices in the system configuration of Example 1.

Example 4 to be described with reference to FIGS. 33 to 35 is configured such that a prediction function and a plan value correction function are provided to the central device in the system configuration of Example 1.

Example 5 to be described with reference to FIGS. 36 and 37 shows that a prediction function and a plan value correction function are provided to the central device in the system configuration of Example 3.

Example 6 to be described with reference to FIGS. 38 to 40 shows that an urgency state of the power system is determined to give a target value corresponding to the urgency state in the system configuration of Example 1, Example 2, or Example 4.

Example 7 to be described with reference to FIGS. 41 to 43 shows that an urgency state of the power system is determined to give the amount of control corresponding to the urgency state in the system configuration of Example 3 or Example 5.

Example 1

As described above, Example 1 shows a system configuration constituted by a central device that performs monitoring control from the viewpoint of the entire power system, and individual devices which are installed at individual portions of the power system and operate on the basis of data transmitted from the central device. A power system voltage reactive power monitoring control device in Example 1 will be described with reference to FIGS. 1 to 20.

First, an example of a configuration of the power system to be applied in Example 1 and a hardware configuration of the power system voltage reactive power monitoring control device will be described with reference to FIG. 2.

The hardware configuration of the power system voltage reactive power monitoring control device is shown in the upper portion of FIG. 2, and the example of a configuration of the power system to be applied in Example 1 is shown in the lower portion of FIG. 2. Here, the power system to be applied has a concept including a power generation system, a Power transmission system, and a load system, but the Power transmission system may be referred to as a power system in the narrow sense because apparatuses within the Power transmission system are treated as individual devices, as an example in Example 1 of the invention.

Here, a power generation system 200 is configured to include a power supply 110 (110a, 110b), a node (bus) 120 (120b), a node (bus) 121 (121a, 121b, 121c), a transformer 130 (130a, 130b), a transformer with tap 131 (131a), a load 150a, a static condenser (SC) 160a, a shunt reactor (ShR) 170a, and the like. Meanwhile, examples of the power supply 110 in the power generation system 200 include a distributed power supply, such as a photovoltaic or a wind power generation, and an inverter system power supply connected to the power system through an inverter, in addition to a rotation system power supply such as a thermal-power generator, a water-power generator, or a nuclear-power generator.

In addition, a load system 300 is configured to include a node (bus) 121 (121e, 121d), a transformer 130 (130c), a transformer with tap 131 (131b), a load 150 (150b, 150c), a static condenser (SC) 160 (160b, 160c, 160d), a shunt reactor (ShR) 170b, and the like.

A Power transmission system (power system) 100 includes a branch (line) 140 (140a, 140c, 140d, 140e), a node (bus) 120 (120a, 120c, 120d, 120e), and the like, and is connected to the power generation system 200 and the load system 300.

In addition, the Power transmission system (power system) 100 includes a measurement device 44 and individual control devices 45 (45a, 45b) which are individual devices, and the measurement device 44 and the individual control devices 45 are associated with a power system voltage reactive power monitoring control device 10 which is a central device through a communication network.

Here, the individual control devices 45 (45a, 45b) which are individual devices are apparatuses or devices capable of variably controlling a voltage and a reactive power of the power system. Although not shown in the drawing, examples of the individual control devices to be applied may include a battery, a rechargeable battery, an EV storage battery, a flywheel, other phase adjustment facilities (a Static Var Compensator (SVC) or a Static Synchronous Compensator (STATCOM), a Static Var Generator (SVG), a Loop Power Controller (LPC), and the like), a Load Ratio control Transformer (LRT) 131, and the like. Further, a Power System Voltage Regulator (PSVR) controlling a power transmission end voltage of a power plant, and the like can also be applied as the individual devices as long as the power generation system 200 side is also included in objects to be controlled. Further, the individual devices, the apparatus, and the devices may be the same as each other, but a Secondary Voltage Control System (SVC), a Primary Voltage Control System (PVR), and the like, among Hierarchical Voltage Control Systems (HVCS), can also be applied as the individual devices.

The measurement device 44 is a device that measures any one or two or more of pieces of on-off information of a switch, such as a node voltage V, a branch current I, an active power P, a reactive power Q, a power factor Φ, a tap value, a node, a branch, a transformer, SC, and ShR. Specifically, the measurement device is a Voltage Transformer (VT), a Potential Transformer (PT), a Current Transformer (CT).

Here, these measurement devices 44 has a function of transmitting data including data measurement portion identification ID and a built-in time stamp of the measurement device (measurement information: Telemeter (TM), Super Vision: display information (SV), and the like). Meanwhile, the measurement device may be a device that measures a power information with absolute time (phasor information of a voltage) using a GPS, a Phasor Measurement Unit (PMU), or another measurement apparatus.

Meanwhile, although a description is given on the assumption that the measurement device 44 is present within the power system 100, the measurement device may be a device which is attached to the power supply 110, the transformer 130, and the transformer with tap 131 on the power generation system 200 side and the load 150, the static condenser 160, and the shunt reactor 170 on the load system side and measures data in the portions, or may be installed in a bus, a line, and the like which are connected to the measurement device 44 and the individual control device 45.

The power system illustrated in FIG. 2 is as described above, and system measurement data D5 measured by the measurement device 44 serves as reception data 71 of the power system voltage reactive power monitoring control device 10. Here, the system measurement data D5 is any one or a plurality of pieces of data among the node voltage V, the branch current I, the power factor Φ, the active power P, and the reactive power Q which are measured by the measurement device 44, and is received by the power system voltage reactive power monitoring control device 10 through the communication network 300. However, the system measurement data D5 may be temporarily collected in other monitoring devices and then received by the power system voltage reactive power monitoring control device 10 through the communication network 300, instead of being directly received from the measurement device 44, or may be may be received by the power system voltage reactive power monitoring control device 10 through the communication network 300 from the measurement device 44 or other monitoring devices. Meanwhile, the system measurement data D5 may include a specific number for identifying data, and a time stamp. Examples of other monitoring device include a central load dispatching center, a system stability monitoring server, and the like.

Meanwhile, finally, transmission data 72a is given to the individual control device 45 from the power system voltage reactive power monitoring control device 10, and the individual control device 45 performs operation based on the transmission data 72a. Here, the transmission data 72a given to the individual devices means a target signal in Example 1, but may indicate the amount of control in the other examples. The transmission data 72a has a concept including the target signal and the amount of control.

In the power system voltage reactive power monitoring control device 10 shown in the upper portion of FIG. 2, a hardware configuration thereof is mainly illustrated. The power system voltage reactive power monitoring control device 10 is configured such that a display unit 11, an input unit 12 such as a keyboard or a mouse, a communication unit 13 that performs communication between the measurement device 44 and the individual control device 45, a computer or a Central Processing Unit (CPU) 14, a memory 15, various databases DB, and the like are connected to a bus line 43.

The various databases DB included in the power system voltage reactive power monitoring control device 10 include a prediction value database DB1 that holds prediction value data D1, a system facility database DB2 that holds system facility data D2, a calculation setting database DB3 that holds calculation setting data D3, a determination criterion database DB4 that holds determination criterion data D3, a system measurement database DB5 that holds system measurement data D5, an index calculation result database DB6 that holds index calculation result data D6, a target value changing timing database DB7 that holds target value changing timing data D7, a target value width database DB8 that holds target value width data D8, a target value database DB9 that holds target value data D9, a control evaluation result database DB10 that holds control evaluation result data D10, a program database DB11 that holds program data D11, and a target value constraint calculation result database DB12 that holds target value constraint calculation result data D12.

Among other hardware configuration apparatuses in the power system voltage reactive power monitoring control device 10, the display unit 11 is configured as, for example, a display device. The display unit 11 may be configured to using a printing device, a sound output device, or the like, for example, instead of or together with the display device. The input unit 12 can be configured to include at least any one of a pointing device, such as a keyboard switch or a mouse, a touch panel, a sound instruction device, and the like. The communication unit 13 includes a circuit and a communication protocol for connection to the communication network 300.

In addition, the CPU 14 reads a predetermined computer program P from the program database DB11 holding the program data D11 to execute computational calculation. The CPU 14 may be configured as one or a plurality of semiconductor chips, or may be configured as a computer device such as a calculation server.

The memory 15 is configured as, for example, a storage device (Random Access Memory (RAM)), and stores the computer program read out from the program database DB11 holding the program data D11 or stores calculation result data, image data, and the like which are necessary for processes. Screen data stored in the memory 14 is transmitted to and is displayed on the display unit 11. An example of a screen to be displayed will be described later.

FIG. 2 illustrates the power system voltage reactive power monitoring control device 10 from the viewpoint of a hardware configuration, while FIG. 1 illustrates a configuration of the power system voltage reactive power monitoring control device 10 from a functional aspect. In FIG. 2, a description is roughly classified into an input data unit 40, a result data unit 42, and a control calculation unit 41.

In FIG. 11, the various pieces of data of FIG. 2 are divided into data within the input data unit 40 and data within the result data unit 42. In FIG. 1, the former data includes the prediction value data D1, the system facility data D2, the calculation setting data D3, the determination criterion data D4, and the system measurement data D5. The latter data includes the index calculation result data D6, the target value constraint calculation result data D12, the target value changing timing data D7, the target value width data D8, the target value data D9, and the control evaluation result data D10.

In addition, in FIG. 1, functions performed on the basis of program data D11 held in the program database DB11 of FIG. 1 are developed to the control calculation unit 41. Functional units executed on the basis of the program data D11 include an index calculation unit 31, a target value constraint calculation unit 39, a target value changing timing calculation unit 32, a target value width calculation unit 33, a target value calculation unit 34, and a control evaluation unit 36. In addition, the functional units executed on the basis of the program data D11 include functions of an output instruction unit 16 and the display unit 11, in addition to the units described in the control calculation unit 41.

An outline of processing in each functional unit of the control calculation unit 41 is as follows. Meanwhile, relationships of use between the pieces of input data D40, the pieces of result data D42, and the functional units are as indicated by arrows in FIG. 1.

In FIG. 1, first, the index calculation unit 31 performs index calculation by using the prediction value data D1, the system facility data D2, the calculation setting data D3, and the determination criterion data D4. Results of the index calculation are stored in the index calculation result database DB6.

Next, the target value constraint calculation unit 39 performs target value constraint calculation by using the calculated index calculation result data D6 and determination criterion data D4. Results of the target value constraint calculation are stored in the target value constraint calculation result database DB12.

Next, the target value changing timing calculation unit 32 performs target value changing timing calculation by using the calculated target value constraint calculation result data D12. Results of the target value changing timing calculation are stored in the target value changing timing database DB7.

Next, the target value width calculation unit 33 performs target value width calculation by using the calculated target value constraint calculation result data D12 and target value changing timing data D7. Results of the target value width calculation are stored in the target value width database DB8.

Next, the target value calculation unit 34 performs target value calculation by using the system facility data D2, the calculation setting data D3, the calculated target value constraint calculation result data D12, target value changing timing data D7, and target value width data D8. Results of the target value calculation are stored in the target value database DB9.

Next, the output instruction unit 16 performs output instruction by using one or more of the calculated target value changing timing data D7, target value width data D8, and target value data D9.

Next, the control evaluation unit 36 performs calculation of control evaluation by using one or more of the system measurement data D5, the calculated target value constraint calculation result data D12, target value changing timing data D7, target value width data D8, and target value data D9. Results of the control evaluation are stored in the control evaluation result database DB10.

Finally, the display unit 11 performs screen display of one or more of the prediction value data D1, the system facility data D2, the calculation setting data D3, the determination criterion data D4, the system measurement data D5, the calculated target value constraint calculation result data D12, target value changing timing data D7, target value width data D8, target value data D9, and the control evaluation result data D10.

Meanwhile, various calculation results and pieces of data accumulated in the memory in the middle of calculation may be sequentially displayed on screens of other monitoring devices. Thereby, an operator can easily ascertain operational conditions of the power system voltage reactive power monitoring control device 10.

FIG. 3 is a diagram illustrating functions executed on the basis of the program data D11 held in the program database DB11 according to program names. The program names are, for example, an index calculation program P31, a target value constraint calculation program P39, a target value changing timing calculation program P32, a target value width calculation program P33, a target value calculation program P34, an output instruction program P16, a control evaluation program P36, and a screen display program P11. Functions of FIG. 1 which correspond to the respective programs P are denoted by the same reference numerals and signs.

Referring back to FIG. 2, the CPU 14 executes the calculation programs P (the index calculation program P31, the target value constraint calculation program P39, the target value changing timing calculation program P32, the target value width calculation program P33, the target value calculation program P34, the output instruction program P16, the control evaluation program P36, and the screen display program P11), which are read out to the memory 14 from the program database DB11, to perform index calculation, target value constraint calculation, target value changing timing calculation, target value width calculation, target value calculation, output instruction, control evaluation, various screen display, the instruction of image data to be displayed, the retrieval of data in various databases DB, and the like.

The memory 14 is a memory that temporarily stores image data for display, the system measurement data D5, pieces of calculation temporary data, and pieces of calculation result data, and generates necessary image data by the CPU 14 to display the generated image data on the display unit 11 (for example, a display screen). Meanwhile, the display unit 11 of the power system voltage reactive power monitoring control device 10 may be a simple screen for only rewriting control programs and databases.

As described above, 12 databases DB are prepared in the power system voltage reactive power monitoring control device 10 so as to be roughly divided. Here, 11 databases except for a program database DB1 and the contents stored therein will be described below in detail. First, databases DB1 to DB5 belonging to the input data unit 40 will be described.

A voltage, an active power, a reactive power, and the like of each node which are obtained through power flow calculation by using a power generation plan and a load consumption prediction value as illustrated in FIG. 4 as the prediction value data D1 are stored as time domain data in the prediction value database DB1. In addition, the active power and the reactive power are calculated with respect to each of the amount of power generation (power generator output) and the amount of load (consumption), and are stored.

Meanwhile, the prediction value data may be obtained by being calculated and stored by another system such as a monitoring control device, a central load dispatching center, or an EMS, or may be manually input. When the prediction value data is manually input, the prediction value data is manually input and stored by the input unit 12. Meanwhile, when the prediction value data is input, necessary image data may be generated by the CPU 14 and may be displayed on the display unit 11. When the prediction value data is input, a semi-manual mode may be set so that a large amount of data can be set by using a supplementary function.

A system configuration, a line impedance (R+jX), a ground electrostatic capacitance (admittance: Y), power supply data, and the like are included and stored as the system facility data D2 in the system facility database DB2. Meanwhile, the system configuration includes one or a plurality of connection relationships of the buses 120 and 121, the line 140, the power supply 110, the load 150, the transformers 130 and 131, and the control devices 45 of the system.

Meanwhile, the system facility data may be obtained from a monitoring control device, a central load dispatching center, or an Energy Management System (EMS), or may be manually input. When the system facility data is manually input, the system facility data is manually input and stored by the input unit 12. Meanwhile, when the system facility data is input, necessary image data may be generated by the CPU 14 and may be displayed on the display unit 11. When the system facility data is input, a semi-manual mode may be set so that a large amount of data can be set by using a supplementary function.

Setting values, such as a convergence determination threshold of power flow calculation, an assumed fault of transient stability calculation, an assumed fault of steady-state stability calculation, a load to be increased, load voltage characteristics, power generator output constraints, power flow constraints, the operation of each control device, and a schedule of voltage stability calculation, which are necessary for each calculation are stored as the calculation setting data D3 in the calculation setting database DB3.

The type of threshold to be used in the transient stability calculation, as illustrated in FIG. 5, is stored for each type (excessive stability, steady-state stability, voltage stability) of stability as the determination criterion data D4 in the determination criterion database DB4. For example, an out-of-step determination threshold $\delta_{oos}$ (Out Of Step) and an unstable threshold $\delta_{max\_Ti}$ are prepared for the determination of a transient stability, a damping threshold $\alpha_{Ti}$ is prepared for the steady-state stability calculation, and an active power margin $\Delta P_{Ti}$, a reactive power margin $\Delta Q_{Ti}$, and the like are prepared for the voltage stability calculation. These thresholds are represented by specific numerical values as the setting values, and are stored.

These pieces of data may be stored using the input unit 12 of the power system voltage reactive power monitoring control device 10, may be stored from other monitoring devices, or may be calculated using the system measurement data D5 or the system facility data D2 and then may be set as setting values.

An active power P, a reactive power Q, a voltage V, a voltage phase angle $\delta_V$, a current I, a power factor $\Phi$, a tap value, on-off information of the switch between the power system and the node, the branch, the transformer, SC, ShR, or the like, and the like are included as the system measurement data D5 in the system measurement database DB5. The data may be data with time stamp or PMU data.

For example, at least any one or two or more of a voltage V and a voltage phase angle $\delta_V$ in the node 120 connected to the power system 100, a line current (I) or a line power flow (P+jQ) of the branch 140 connected to the node 120 connected to the power system 100, a line current (I) or a line power flow (P+jQ) of the transformer 130 or the transformer with tap 131 connected to the node 120 connected to the power system 100, a voltage V and a voltage phase angle $\delta_V$ of the node 121 connected to the transformer 130, a voltage V, a current I, an active power P, a reactive power Q, or a power factor Φ of the power supply 110 connected to the node 121, a voltage V, a current I, an active power P, a reactive power Q, or a power factor Φ of the load 150, a voltage V, a current I, an active power P, a reactive power Q, a power factor Φ, a voltage V and a voltage phase angle $\delta_V$ of other nodes, a branch, a power supply, a load, or a control device connected to the power system 100 which is measured through a communication network from the measurement device 44, other monitoring devices, or the like, a tap value of the transformer 130 or the transformer with tap 131, on-off information of the switch between the node, the branch, the transformer, SC, and ShR, and the like are stored.

Meanwhile, the voltage phase angle $\delta_V$ may be measured using another measurement apparatus using a PMU or a GPS. Meanwhile, the measurement device is VT, PT, CT, TM, SV information, or the like. The line power flow (P+jQ) can be calculated from a current I, a voltage V, and a power factor Φ which are measured by the VT, the PT, the CT, or the like. Meanwhile, the system measurement data may be obtained from a monitoring control device, a central load dispatching center, or an EMS, or may be directly obtained from the measurement device of the entire system.

Next, the databases DB6 to DB10 and the database DB12 belonging to the result data unit 42 will be described.

Time domain calculation results of transient stability calculation, steady-state stability calculation, and voltage stability calculation with respect to each time cross-section and pieces of time domain data of index values calculated using the pieces of determination criterion data D4 illustrated in FIG. 5 are stored as the index calculation result data D6 in the index calculation result database DB6. These results and pieces of data are as illustrated in, for example, FIGS. 12, 14, 16, and 17.

Among these drawings, FIG. 12 is a diagram illustrating an example of an index calculation process based on transient stability calculation. Here, the horizontal axis represents a time t, and the vertical axis represents a power generator internal phase angle δ which is an index value of transient stability. In the example illustrated in the drawing, the power generator internal phase angle δ represents a second swing (peak time (base time) $t_B$) larger a first swing after the oscillation (peak time (base time) $t_A$) of the first swing. Here, transient stability calculation is performed on the assumed fault stored in the calculation setting data D3 with each time cross-section as an object so as to calculate a first swing peak swing $\delta_{max}$ of the power generator internal phase angle δ which is an index value of transient stability, and time domain data of $\delta_{max}$ is stored. Meanwhile, FIG. 12 shows that the first swing peak swing $\delta_{max}$ is equal to or less than an unstable threshold $\delta_{max\ Ti}$ (FIG. 5) at time $t_4$, but the power generator internal phase angle δ is set to be equal to or greater than the unstable threshold $\delta_{max\ Ti}$ (FIG. 5) at time $t_3$ and is then set to be equal to or greater than an out-of-step determination threshold $\delta_{oos}$ (FIG. 5) at the time $t_3$, and out-of-step is determined at time $t_B$. Meanwhile, in FIG. 12, two drawings on the upper side and the drawing on the lower side are different from each other in a reference time, and thus the horizontal axis is set to be t' in order to clarify the meaning of the time domain calculation being performed from the cross-section of the base time $t_B$.

FIG. 14 is a diagram illustrating an example of an index calculation process based on steady-state stability calculation. Here, the horizontal axis represents a time, and the vertical axis represents a damping rate α of an envelope of a power generator internal phase angle δ which is an index value of steady-state stability. In the example illustrated in the drawing, the damping rate α of the envelope of the power generator internal phase angle δ is decreased from a damping rate threshold $\alpha_{T1}$ to equal to or less than $\alpha_{T2}$, and is then increased to $\alpha_{T2}$ at time $t_4$ and equal to or greater than $\alpha_{T1}$ at time $t_5$. Here, steady-state stability calculation is performed on the assumed fault stored in the calculation setting data D3 with each time cross-section as an object so as to calculate the damping rate α of the envelope of the power generator internal phase angle δ which is an index value of steady-state stability, and time domain data of α is stored.

FIGS. 16 and 17 are diagrams illustrating an example of an index calculation process based on voltage stability calculation. Here, the horizontal axis represents time t, and the vertical axis represents an active power margin ΔP (FIG. 16) and a reactive power margin ΔQ (FIG. 17) which are index values of voltage stability. Meanwhile, in FIGS. 16 and 17, the drawing on the upper side is shown on the basis of base times $t_D$ and $T_E$. In the example illustrated in the drawing, an active power margin ΔP (FIG. 16) and a reactive power margin ΔQ (FIG. 17) are respectively decreased to equal to or less than an active power margin threshold $\Delta P_{T1}$ (FIG. 16) and a reactive power margin $\Delta QT_1$ and then respectively exceed the active power margin threshold and the reactive power margin at time t5. Here, as illustrated in FIGS. 16 and 17, voltage stability calculation is performed on the load to be increased, the load voltage characteristics, the power generator output constraints, the power flow constraints, the operation of each control device, and the schedule which are stored in the calculation setting data D3 with each time cross-section as an object so as to calculate the active power margin ΔP and the reactive power margin ΔQ which are index values of voltage stability, and pieces of time domain data of ΔP and ΔQ are stored. Meanwhile, a method of calculating each index may be obtained by another method, and each index may be another index.

One or more of the pieces of time domain data of upper and lower limit constraints of a target value which are obtained from the transient stability, the steady-state stability, the voltage stability, the facility upper and lower limits, and the like as illustrated in FIG. 9 are stored as the target value constraint calculation result data D12 in the target value constraint calculation result database DB12.

FIG. 9 shows upper and lower limits $V_{iUPPer}(t)$ and $V_{iLower}(t)$ (solid lines) of voltage constraints which are determined from facility upper and lower limits, a voltage constraint $V_{iTS}(t)$ (one-dot chain line) determined from transient stability, a voltage constraint $V_{iSS}(t)$ (long dotted line) determined from steady-state stability, and a voltage constraint $V_{iVS}(t)$ (short dotted line) determined from voltage stability as the upper and lower limit constraints of the target value, as illustrated in explanatory notes. All of these constraints are function of time, and indicate constraints changing with time.

The upper and lower limit constraints of the target value are results obtained by calculating a target value constraint by a method as illustrated in FIG. 13, 15, or 18 by using the determination criterion data D4 with respect to the index calculation result data D6, and the target value is indicated by a voltage V. The target value may be the voltage V, or may be an active power loss, a reactive power loss, or the like. In addition, the target value may be one or two or more of the above-described values.

FIG. 13 is a diagram illustrating an example of a process of obtaining a target value constraint of a voltage V from a transient stability calculation result. A voltage constraint $V_{iTS}(t)$ is determined in accordance with results of comparison between the peak swing $\delta_{max}$ of the power generator internal phase angle $\delta$ changing every moment and the unstable threshold $\delta_{max\ T}$ which are obtained by the computational calculation of FIG. 12. In the example illustrated in the drawing, a constraint condition voltage is greatly increased after time $t_3$ exceeding the unstable threshold $\delta_{max\ T}$.

FIG. 15 is a diagram illustrating an example of a process of obtaining a target value constraint of a voltage V from steady-state stability calculation results. A voltage constraint $V_{iSS}$ determined from steady-state stability is determined on the basis of the damping rate $\alpha$ of the envelope of the power generator internal phase angle $\delta$ changing every moment which is obtained by the computational calculation of FIG. 14 and the thresholds $\alpha_{T1}$, $\alpha_{T2}$ thereof. In the example illustrated in the drawing, a constraint condition voltage is changed at time $t_1$ when the damping rate $\alpha$ is set to equal to or greater than $\alpha T_2$, time $t4$ when the damping rate $\alpha$ is set to equal to or greater than $\alpha_{T2}$, and time $t_5$ when the damping rate $\alpha$ is set to equal to or greater than $\alpha_{T1}$. Meanwhile, the damping rate $\alpha$ may be obtained by analysis of an eigenvalue.

FIG. 18 is a diagram illustrating an example of a process of obtaining a target value constraint of a voltage V from voltage stability calculation results. Here, a voltage constraint $V_{iSV}$ determined from voltage stability is determined from the active power margin $\Delta P$ (FIG. 16) being an index of voltage stability which changes every moment and is obtained by the computational calculation of FIG. 16, and the active power margin threshold $\Delta P_{T1}$ (FIG. 16). In the example illustrated in the drawing, a constraint condition voltage is changed before and after a deviation of the threshold.

Meanwhile, here, an example of a change of the constraint condition voltage from the active power margin is shown, but this change can be similarly made to the reactive power margin $\Delta Q$. Meanwhile, in FIGS. 16 and 18, the active power margin threshold $\Delta P$ may be the entire system, or may be a specific load $\Delta P_i$. The active power margin threshold may be $dV/dP$, or may be $\Delta P$ taking N–1 into consideration.

FIG. 9 described above is a diagram in which changes over time in a constraint condition voltage which are obtained by FIGS. 13, 15, and 18 are shown together on one graph. In FIG. 9, voltage constraints determined by facility upper and lower limits are described in addition to the constraint condition voltages, but a target value changing timing and a target value width to be described below are determined in accordance with a difference from the voltage constraints determined by the facility upper and lower limits.

FIG. 6 is a diagram illustrating an example of target value changing timing data t, target value width data $\Delta V_i$, and target value data in Example 1, and a changing timing, a changing width, and a target value are shown as a pair. In the example shown, a portion of the target value changing timing data t represents the target value changing timing database DB7, a portion of the target value width data $\Delta V_i$ represents the target value width database DB8, and a portion of the target value data represents the target value database DB9.

Calculation results of a timing at which a target value as illustrated in FIG. 6 are stored as the target value changing timing data D7 in the target value changing timing database DB7. The target value changing every moment can be made variable by including the target value changing timing data D7, and there is an effect that it is possible to effectively keep balance between a voltage V and a reactive power Q and to improve economic efficiency.

Calculation results of a target value width in a period of time of each target value changing timing as illustrated in FIG. 6 are stored as the target value width data D8 in the target value width database DB8. A constraint value of a target value changing every moment can be made variable by including the target value width data D8, and there is an effect that it is possible to effectively keep balance between a voltage V and a reactive power Q and to improve economic efficiency.

FIG. 10 is an example of a diagram illustrating an example of a process of calculating a target value changing timing and a target value width. This drawing shows that a difference between the largest value, among the voltage constraint $V_{iTS}(t)$ (one-dot chain line) determined from transient stability, the voltage constraint $V_{iSS}(t)$ (long dotted line) determined from steady-state stability, and the voltage constraint $V_{iVS}(t)$ (short dotted line) determined from voltage stability with respect to the various voltage constraints illustrated in FIG. 9, and the upper limit $V_{iUPPer}(t)$ of the voltage constraint determined from the facility is obtained, and the difference is set to be a target value width of FIG. 6 at the point in time. In addition, the target value changing timing is set to be a time when the difference between the largest value and the upper limit $V_{iUPPer}(t)$ of the voltage constraint determined from the facility is changed.

Calculation results of a target value in a period of time of each target value changing timing as illustrated in FIG. 11 are stored as the target value data D9 in the target value database DB9. In a case of FIG. 11, a voltage target value $V_{iref}(t)$ from the viewpoint of economic efficiency is added, in addition to the various voltage constraints illustrated in FIG. 9. The target value can be changed with the elapse of time by including the target value data D9 taking the voltage target value $V_{iref}(t)$ from the viewpoint of economic efficiency into consideration, and there is an effect that it is possible to effectively keep balance between a voltage and a reactive power and to improve economic efficiency. A calculation method, in this case, will be described later.

A target value and a measurement value at each point and a deviation thereof as illustrated in FIG. 7 are stored as the control evaluation result data D10 in the control evaluation result database DB10. Thereby, there is an effect that it is possible to simply ascertain monitoring matters such as whether or not the target value is followed and whether or not balance between a voltage and a reactive power can be kept, on a screen as illustrated in FIG. 20 to be described later.

Next, contents of a calculation process of the power system voltage reactive power monitoring control device 10 will be described with reference to FIG. 8. FIG. 8 is an example of a flow chart illustrating the overall processing of the power system voltage reactive power monitoring control device. A flow of the above-described processing will be described for each processing step.

Meanwhile, it is assumed that the following respects have been already considered in executing a program of FIG. 8. Pieces of input data D2 to D4 may be input in advance, or may be received from another server. Pieces of reception data D1, D5, and D6 are periodically measured at all times, and thus may be periodically received through an EMS or a renewable energy resource control center. In addition, in a case where each calculation cannot be performed, and the like, an alert may be output. It is assumed that a system configuration includes one or a plurality of connection relationships between a bus, a line, a power supply, a load, a transformer, and control apparatuses of a system.

First, in processing step S31, index calculation is performed using the prediction value data D1, the system facility data D2, the calculation setting data D3, and the determination criterion data D4, and results thereof are stored in the index calculation result database DB6.

The index calculation is performed from the viewpoint of excessive stability, steady-state stability, voltage stability, and a control margin. However, frequency stability is not directly related to a voltage, and thus may not be considered. During the index calculation, a program for checking a violation in upper and lower limits based on transient stability calculation, eigenvalue calculation, voltage stability calculation, and power flow calculation, and the like are specifically executed.

Here, an example of an index calculation method will be described with reference to FIGS. 12, 14, 16, and 17. First, FIG. 12 illustrates an example of the calculation of an index related to transient stability, and shows that transient stability calculation is performed on the assumed fault stored in the calculation setting data D3 by using the system facility data D2 and the calculation setting data D3 with each time cross-section of the prediction value data D1 as an initial condition, a first swing peak swing $\delta_{max}$ of a power generator internal phase angle $\delta$ which is an index value of transient stability is calculated, and time domain data of $\delta_{max}$ is stored as the index.

Here, in a case where out-of-step is determined due to $\delta_{max}$ being larger than an out-of-step determination threshold $\delta_{oos}$ of the transient stability calculation, $\delta_{oos}$ is obtained as a result of an index. In this case, one or a plurality of assumed faults may be set in advance through the operator's experience, and the assumed fault may be set to be a severe fault having sever transient stability from the past transient stability calculation results. Although not shown in the drawing, the assumed fault may be set by periodically performing transient stability calculation and extracting only a severe fault by screening. Thereby, there are an effect of performing index calculation with respect to a sever assumed fault and an effect of reducing the amount of calculation.

Meanwhile, a specific transient stability calculation method can be performed according to various methods shown in "Prabha Kundur, Power System Stability and Control, The Epri Power System Engineering (1994) pp. 827-954", "Development Of Stability Integrated Analysis System Of Large-Scale Power System, Central Research Institute of Electric Power Industry T14 (1990)", "Analysis and Operation Technology Supporting Use Of Power System, Technical report of Electric Institute 1100 (2007) pp. 106-110", and the like.

In addition, the specific transient stability calculation method may be a method of obtaining a width having secure stability by taking stability constraints in OPF with respect to target value constraint calculation. This point is described in "Sekine et al., Optimal Power Flow (OPF) of Power System, March 2002, NEC Association, pp. 58-66".

Next, FIG. 14 illustrates an example in which an index related to steady-state stability is calculated, and shows that steady-state stability calculation which is the same as the transient stability calculation for three-phase open of a certain line for causing small disturbance which is the assumed fault stored in the calculation setting data D3 is performed with each time cross-section as an object, a damping rate $\alpha$ of an envelope of a power generator internal phase angle $\delta$ which is an index value of steady-state stability is calculated, and time domain data of the damping rate $\alpha$ of the envelope is stored as the index.

An expression for calculating the damping rate $\alpha$ of the envelope is shown in Expression (1). In Expression (1), $\delta(t)$ denotes a power generator internal phase angle, a denotes a damping rate, t denotes a time, $\beta$ denotes an oscillation frequency, and $t_c$ denotes a base time.

Meanwhile, with respect to the envelope and the like, "Definition and Classification of Power System Stability IEEECIGRE Joint Task Force on Stability Terms and Definitions, p. 1397, FIG. 5" is referred to.

In a case where the damping rate $\alpha$ of the envelope of the power generator internal phase angle $\delta$ which is obtained in this expression is negative, the oscillation of the power generator internal phase angle $\delta$ is damped and stabilized. In a case where the damping rate $\alpha$ of the envelope of the power generator internal phase angle $\delta$ is positive, the oscillation of the power generator internal phase angle $\delta$ is diffused and destabilized without being damped. In addition, in a case where the damping rate $\alpha$ of the envelope of the power generator internal phase angle $\delta$ is negative, the damping rate increases as the magnitude thereof increases, and thus damping easily occurs.

$$\delta(t)=\varepsilon e^{\alpha(t'-t'o)}\cos(\beta t) \qquad (1)$$

Here, the steady-state stability calculation may be a steady-state stability calculation method which is the same calculation as the transient stability calculation, and may be a method based on various calculations such as eigenvalue calculation described in "Analysis and Operation Technology Supporting Use Of Power System, Technical report of Electric Institute 1100 (2007) pp. 105-106" and "Prabha Kundur, Power System Stability and Control, The Epri Power System Engineering (1994) pp. 699-822".

Next, FIGS. 16 and 17 illustrate an example in which an index related to voltage stability is calculated, and show that the calculation of a P-V curve and a V-Q curve which is voltage stability calculation is performed on the load to be increased, the load voltage characteristics, the power generator output constraints, the power flow constraints, the operation of each control device, and the schedule which are stored in the calculation setting data D3 with each time cross-section as an object, an active power margin $\Delta P$ and a reactive power margin $\Delta Q$ which are index values of voltage stability are calculated, and pieces of time domain data of $\Delta P$ and $\Delta Q$ are stored as the indexes. In a time slot in which the prediction value data D1 does not much change, an improvement in the efficiency of calculation may be achieved by taking a long interval time of index calculation of time domain data.

Here, the P-V curve and the V-Q curve of FIGS. 16 and 17 will be described. FIG. 16 illustrates an example in which the P-V curve is calculated by taking a total consumption P of an active power and an active power $P_i$ of each load as the horizontal axis and taking a voltage $V_i$ of a node i as the vertical axis. An operational point is $(P_0, V_{i0})$, and a low solution paired with the high solution is $(P_0, V'_{i0})$. Further, an active power limit which is a limit of voltage stability is the portion of $P_c$. The active power limit which is a tip end of the P-V curve is generally called a node.

FIG. 17 illustrates an example in which the V-Q curve is calculated by taking a voltage $V_i$ of a node i as the horizontal axis and taking a total consumption Q of a reactive power as the vertical axis. An operational point is $(V_{i0}, Q_0)$. Further, the reactive power limit which is a limit of voltage stability is the portion of $Q_c$. The V-Q curve can be drawn by subtracting the amount of reactive power, which is supplied from the system side, from the consumption of the reactive power of the node i. Meanwhile, constraint data of active and reactive power outputs of a power generator may be considered, or voltage characteristics of a load may be considered. Thereby, it is possible to examine voltage stability of the power system which is closer to reality.

Here, the calculation of the P-V curve can be performed according to a calculation method or the like described in "Development of Voltage Stability Analysis Method of Power System, Central Research Institute of Electric Power Industry T37 (1995)", "Prabha Kundur, Power System Stability and Control, The Epri Power System Engineering (1994) pp. 977-1012", "Chiang. H. D. et al., CPFLOW: A Practical Tool for Tracing Power System Steady-State Stationary Behavior Due to Load and Generation Variations, IEEE Trans. on Power Systems, Vol. 10, No. 2, pp. 623-634, 1995, Venkataramana Ajjarapu, Computational Techniques for Voltage Stability Assessment and Control, Springer, 2006, pp. 49-116", JP-A-6-153397, and the like.

In addition, the calculation of the V-Q curve can be performed according to a calculation method or the like described in "Stable Operation Technology Technical Committee of Power System, Stable Operation Technology Electric Collaboration Research of Power System, Volume 47, No. 1, pp. 24-26". In addition, a voltage stability margin $\Delta P$ can be calculated as an index of the P-V curve by Expression (2) indicating a difference between the operational point $P_0$ and the active power limit $P_c$ which are illustrated in FIG. 16. Meanwhile, the voltage stability margin may be $\Delta V_i$ which is calculated by Expression (3). In addition, another index, such as an inclination dV/dP of the operational point, which is related to voltage stability may be used as an index of the P-V curve.

$$\Delta P = (P_c - P_0)/P_0 \quad (2)$$

$$\Delta V_i = (V_{i0} - V'_{i0})/V_{i0} \quad (3)$$

In addition, the voltage stability margin $\Delta P$ may be calculated by applying an N−1 criterion and dividing a difference between a tip end Pc of the P-V curve and the operational point P0 by the operational point P0 when a line or a facility at a certain point is lost. Thereby, it is possible to calculate the voltage stability margin based on the N−1 criterion and to further improve voltage stability. Meanwhile, a target portion at the time of applying the N−1 criterion is set in advance.

In addition, regarding the calculation of the V-Q curve, a voltage stability margin $\Delta Q$ can be calculated on the basis of $\Delta Q$ which is a difference between a reactive power Q=0 and a reactive power limit $Q_c$ illustrated in FIG. 17. In this manner, a voltage stability margin simply obtained from the P-V curve or the V-Q curve constituted by a physical quantity which is normally used by a system operator is used, and thus there is an effect of facilitating the understanding of the system operator.

Meanwhile, in a case where the prediction value data D1, the system facility data D2, the calculation setting data D3, and the determination criterion data D4 are not set in advance, these pieces of data may be input using the input unit 12 and the display unit 11. Here, these pieces of data may be input through the communication network 300 and the communication unit 13 from other monitoring devices, or data regarding the prediction value data D1, the system facility data D2, the calculation setting data D3, and the determination criterion data D4 which are held in other monitoring devices or the like may be automatically received and stored at a fixed cycle. In addition, in a case where the prediction value data D1, the system facility data D2, the calculation setting data D3, and the determination criterion data D4 are set in advance, correction may be added, or the pieces of data may be used as they are.

Next, index calculation performed from the viewpoint of a control margin will be described. The control margin is described in "Nakachi et al.: "Voltage and Reactive Power Control Taking into Account of Economy and Security by Using Tab Search", The transactions of the Institute of Electrical Engineers of Japan B, Vol. 128, No. 1, pp. 305-311, 2008", or "Kishi et al.: "Voltage and Reactive Power Control Considering Operation Room", School of Engineering of Tokai University, Vol. 48, No. 1, pp. 81-86, 2008".

The degree of a margin of a reactive power output of a power generator bus i of Qgi or a deviation of a tap position of a transformer bus r of $\Delta Tapr$, as shown in Expression (1) of p. 82 of "Voltage and Reactive Power Control Considering Operation Room" described above, from the maximum value of Qgi or the degree of a margin thereof to the maximum value of the tap position is obtained. When the margins cohere with the respective upper and lower limits, the margins cannot be controlled, and thus the margins are required from the viewpoint of a deterioration of stability. Meanwhile, it is premised that one or more of these indexes are calculated.

Although a point of view of the above-described control margin is similar to that of the checking of a violation in upper and lower limits based on power flow calculation, this is a point of view of voltage stability in the meaning of the prevention of breakdown of an apparatus, which is a point of view different from that of "control margin" described in the invention.

In processing step S39, target value constraint calculation is performed using the index calculation result data D6 and the determination criterion data D4 which are stored in processing step S31, and the result thereof is stored in the target value constraint calculation result database DB12. Thereby, one or more of pieces of time domain data of upper and lower limit constraints of a target value which are obtained from transient stability, steady-state stability, voltage stability, facility upper and lower limits, or the like.

This is a result obtained by calculating a target value constraint with respect to the index calculation result data D6 by the method as illustrated in FIG. 13, 15, or 18 by using the determination criterion data D4. Here, the target value is indicated by a voltage. The target value may be a voltage, or may be an active power loss, a reactive power loss, or the like. In addition, the number of target values may be one as described above, or may be two or more. Here, a specific example a target value constraint calculation method will be described with reference to FIG. 13, 15, or 18.

First, FIG. 13 illustrates an example in which a target value constraint related to transient stability is calculated, and a target value constraint $V_i$ is determined as in Expression (4) in a case of $\delta_{max} < \delta_{max\ T}$ and Expression (5) in a case of $\delta_{max\ T} < \delta_{max}$ which are conditions shown in Expression (4) and Expression (5), by using an unstable threshold $\delta_{max\ T}$ of the determination criterion data D4 illustrated in FIG. 5 with respect to the index calculation result data D6 calculated in processing step S31 illustrated in FIG. 8. Here, the number of thresholds of the determination criterion data D4 may be one, two or more, or zero.

$$V_i = V_{iTS0}(\delta_{max} < \delta_{max\ T}) \quad (4)$$

$$V_i = V_{iTS1}(\delta_{max\ T} \leq \delta_{max}) \quad (5)$$

FIG. 15 illustrates an example in which a target value constraint related to steady-state stability is calculated, and a target value constraint $V_i$ of steady-state stability at each time as in Expression (6) in a case of $\alpha_{T2} < \alpha \leq \alpha_{T1}$, Expression (7) in a case of $\alpha \leq \alpha_{T2}$, and Expression (8) in a case of $\alpha_{T1} < \alpha$ which are conditions shown in Expressions (6) to (8), by using a damping rate threshold $\alpha_{Ti}$ of the determination criterion data D4 illustrated in FIG. 5 with respect to the index calculation result data D6 calculated in processing step S31 illustrated in FIG. 8.

$$V_i = V_{iSS0}(\alpha_{T2} < \alpha \leq \alpha_{T1}) \qquad (6)$$

$$V_i = V_{iSS2}(\alpha \leq \alpha_{T2}) \qquad (7)$$

$$V_i = V_{iSS2}(\alpha_{T1} < \alpha) \qquad (8)$$

FIG. 18 illustrates an example in which a target value constraint related to voltage stability is calculated, and a target value constraint $V_i$ of voltage stability at each time is determined as in Expression (9) in a case of $\Delta P_T < \Delta P$ and Expression (10) in a case of $\Delta P < \Delta P_T$ which are conditions shown in Expressions (9) and (10), by using an active power margin threshold $\Delta P_{Ti}$ of the determination criterion data D4 illustrated in FIG. 5 with respect to the index calculation result data D6 calculated in processing step S31 illustrated in FIG. 8. Here, although $\Delta P$ is used as an index, $\Delta Q$ may be used, or an index combined with other indexes may be used.

$$V_i = V_{iVS0}(\Delta P_T < \Delta P) \qquad (9)$$

$$V_i = V_{iVS1}(\Delta P \leq \Delta P_T) \qquad (10)$$

Here, an example of the target value constraint calculation result data D12 of each stability will be described with reference to FIG. 9. Here, a voltage is selected as the type of target value, and the following four voltage constraints are given as voltage constraints at a point i which is set as an object. A first voltage constraint is a voltage constraint of facility upper and lower limits. The facility upper and lower limits are upper and lower limits of a facility, such as a facility at a point i, which has to be kept so that a consumer, a transformer, each control apparatus, a line, a bus, and the like are not damaged. In FIG. 9, an upper limit of time t is represented by $V_{iUpper}(t)$, and a lower limit of the time t is represented by $V_{iLower}(t)$. The values thereof are $V_{iUpper}(t) = V_{iUpper}$ and $V_{iLower}(t) = V_{iLower}$, respectively, which are indicated by a solid line, in a range of the time t illustrated in FIG. 9.

A second voltage constraint is a voltage constraint of transient stability. The second voltage constraint is a result obtained by calculating the target value constraint related to transient stability which is calculated in processing step 39. In FIG. 9, the voltage constraint of the time t is represented by $V_{iTS}(t)$, and an example in which two stages of $V_{iTS0}$ and $V_{iTS1}$ are indicated by a one-dot chain line in the range of the time t illustrated in FIG. 9. Meanwhile, TS denotes transient stability.

A third voltage constraint is a voltage constraint of steady-state stability. The third voltage constraint shows a result obtained by calculating the target value constraint related to steady-state stability which is calculated in processing step 39. In FIG. 9, the voltage constraint of the time t is represented by $V_{iSS}(t)$, and an example in which three stages of $V_{iSS0}$, $V_{iSS1}$, and $V_{iSS2}$ are indicated by a long dashed line in the range of the time t illustrated in FIG. 9. Meanwhile, SS denotes steady-state stability.

A fourth voltage constraint is a voltage constraint of voltage stability. The fourth voltage constraint is a result obtained by calculating a target value constraint related to the voltage stability calculated in processing step 39. In FIG. 9, the voltage constraint of the time t is represented by $V_{iVS}(t)$, and an example in which two stages of $V_{iVS0}$ and $V_{iVS1}$ are indicated by a short dashed line in the range of the time t illustrated in FIG. 9. Meanwhile, VS denotes voltage stability.

The above-described four target value constraints are collectively shown in FIG. 9. Meanwhile, only lower limits of the second to fourth constraints are shown, but upper limits thereof may be shown as occasion demands. The target value constraints calculated as described above are determined by synthesizing the upper and lower limits thereof. For example, in FIG. 9, the width between $V_{iUpper}$ and each of $V_{iTS0}$, $V_{iSS1}$, $V_{iVS1}$, and $V_{iTS1}$ serves as a voltage value constraint. Thereby, it is possible to calculate a target value constraint based on one or more stabilities, and there is an effect that a width or a timing of a target value capable of keeping one or more stabilities is easily calculated or an effect that the operator easily visually ascertains which constraint is severe at which time.

In addition, in a case where such a constraint value cannot be calculated, a value which is set in advance may be used. For example, the operator may be set the value as described in "Research Committee of Voltage and Reactive Power Control of Power System, Voltage and Reactive Power Control of Power System, Technical Report of Institute of Electrical Engineers, No. 743 (1999), pp. 6-13". Meanwhile, this calculation time width may be obtained by calculating the length of a period for outputting an instruction value such as a target value of the power system voltage reactive power monitoring control device 10 by using prediction value data, or another calculation time width may be used.

Meanwhile, in FIG. 9, the following points may be further considered. First, in the voltage constraint of the facility upper and lower limits, the steady-state stability is degraded when the voltage is lowered. In FIG. 9, the time is shown as a right angle on the basis of $P_{max} = V \cdot V/X$ of the P-δ curve, but this does not result from a prediction value. Since a more jagged shape is given, it is preferable to determine a timing by performing smoothing thereon. In addition, a dead zone may be set. The voltage stability is degraded during a voltage drop, a lower limit constraint is generated. The voltage stability constraint includes two types of constraints based on $\Delta P$ and $\Delta Q$.

In processing step S32, target value changing timing calculation is performed using the target value constraint calculation result data D12 stored in processing step S31, and results thereof are stored in the target value changing timing database 27. Here, an example of a target value changing timing calculation method will be described with reference to FIG. 10. A target value changing timing is controlled in advance in a case of an excessively short change by an expected delay in control.

The target value changing timing is set to be a timing when the width of a target value constraint basically changed. That is, times $t_1$, $t_2$, and $t_6$, except for the first time to, the last time $t_7$, the middle times $t_3$, $t_4$, and $t_5$ among times time $t_0$, $t_1$, $t_2$, $t_3$, $t_4$, $t_5$, $t_6$, and $t_7$ illustrated in FIG. 10, are calculated as the target value changing timing. This timing is a time when a difference between the largest value and the upper limit $V_{iUpper}(t)$ of the voltage constraint determined from a facility is changed.

Meanwhile, in a case where a result of target value calculation to be described later hardly changes before and after the target value changing timing, the subsequent target value changing timings may not be set. However, this is used for the calculation of a target value width. Meanwhile, a margin may be provided in a timing in consideration of a time delay of control. A target value changing every moment can be made variable by calculating the target value changing timing data D7, and it is possible to more effectively keep balance between a voltage and a reactive power with respect to the instruction of a fixed target value and to change a target value for improving economic efficiency.

In processing step S33, target value width calculation is performed using the target value constraint calculation result data D12 stored in processing step S39 and the target value changing timing data D7 stored in processing step S32, and results thereof are stored in the target value width database DB8. Here, an example of a target value width calculation method will be described with reference to FIG. 10.

As illustrated in FIG. 10, the width of a target value constraint at each time is set to be a target value width. That is, a target value width between the times $t_0$ and $t_1$ is $\Delta V_{i0}$, a target value width between the times $t_1$ and $t_2$ is $\Delta V_{i1}$, a target value width between the times $t_2$ and $t_3$ is $\Delta V_{i2}$, a target value width between the times $t_3$ and $t_4$ is $\Delta V_{i3}$, a target value width between the times $t_4$ and $t_5$ is $\Delta V_{i4}$, a target value width between the times $t_5$ and $t_6$ is $\Delta V_{i5}$, and a target value width between the times $t_6$ and $t_7$ is $\Delta V_{i6}$. Here, the times $t_3$, $t_4$, and $t_5$ excluded as the target value changing timing have the same target value width, and thus $\Delta V_{i3}$ to $\Delta V_{i5}$ are not necessary. A constraint value of a target value changing every moment can be made variable by including the target value width data D8, and there is an effect that it is possible to effectively keep balance between a voltage and a reactive power.

In processing step S34, target value calculation is performed using the system facility data D2, the calculation setting data D3, the target value constraint calculation result data D12 stored in processing step S39, the target value changing timing data D7 stored in processing step S32, and the target value width data D8 stored in processing step S33, and results thereof are stored in the target value database DB9.

Optimization calculation is performed by setting one or more of minimization of an active power transmission loss, minimization of a reactive power transmission loss, minimization of a total fuel cost due to a change in active power output distribution of a power supply, and minimization of a reactive power output due to a change in a power factor of each power supply to be objective functions and setting an operation variable to be the type (voltage in this example) of target value with a target value width at each timing as a constraint, and thus a target value at each timing and target value width is calculated.

A target value can be changed with the elapse of time by including the target value data D9, and there is an effect that it is possible to effectively improve economic efficiency among voltage constraints for keeping balance between a voltage and a reactive power.

Here, an example of results of target value calculation will be described with reference to FIG. 11. Target values of voltages $V_{iref0}$ to $V_{iref2}$, among constraints widths, are calculated. Here, an example of a calculation expression using Optimal Power Flow (OPF) calculation as optimization calculation is shown. An example of a problem of optimization based on OPF is shown in Expression (11). The optimal power flow calculation can be performed according to a calculation method or the like described in, for example, "Sekine et al., Optimal Power Flow (OPF) of Power System, March 2002, NEC Association, pp. 133-203" or the like.

$$\min \text{ subject to } \begin{array}{l} f(x) \\ g_i(x) \leq 0 \quad (i = 0, \ldots, m) \\ h_j(x) \leq 0 \quad (j = 0, \ldots, m) \end{array} \quad (11)$$

Here, f(x) denotes an evaluation function. The evaluation function f(x) is an evaluation function, such as an active power transmission loss, a reactive power transmission loss, a total fuel cost due to a change in the active power output distribution of a power supply, or a reactive power output of each power supply due to a change in the power factor of the power supply, which is related to economic efficiency, and is an evaluation function for any one or two or more of these items. However, in a case of two or more of the items, weighting which is set in advance may be performed.

Here, h(x) denotes an equality constraint condition, and is an active and reactive power flow equation. Here, g(x) denotes an inequality constraint condition (penalty function), and is an inequality constraint condition for one or two or more of target value constraints (voltage upper and lower limit constraints), power generator reactive power output upper and lower limit constraints, power flow upper and lower limit constraints, and the like. However, the inequality constraint condition may be treated as a constraint value instead of a penalty. However, in a case where convergence is degraded, it is preferable to achieve an improvement in convergence by embedding an objective function as a penalty function. Further, in a case where convergence is degraded, it is preferable to obtain a solution by adding a process of alleviating the value of the penalty function.

Here, expressions of an active power transmission loss $P_{Loss}(x)$ of the entire system, a reactive power transmission loss $Q_{Loss}(x)$ of the entire system, a total fuel cost $C_{ost}(p)$ due to a change in the active power output distribution of the power supply, and a sum $Q_{Gall}(x)$ of reactive power outputs of the power supply due to a change in the power factor of each power supply is shown in Expressions (12) to (15) as an example of the evaluation function f(x). The evaluation functions are separately shown below, but may be configured as one or more combinations thereof.

$$P_{Loss}(x) = \sum_{i=1}^{N} \sum_{j=1}^{N} |P_{ij} + P_{ji}| \quad (12)$$

$$= \sum_{i=1}^{N} \sum_{j=1}^{N} [G_{ij}\{V_i^2 + V_j^2 - 2V_iV_j\cos(\theta_i - \theta_j)\}] \; (i \neq j)$$

In Expression (12) showing the active power transmission loss $P_{Loss}(x)$ of the entire system, i, $j \in \Omega_V$ denotes a bus to be monitored, N denotes a total number of bus numbers (i=1 to N), $P_{ij}$ denotes an active power from the bus i to the bus j, $P_{ji}$ denotes an active power from the bus j to the bus i, $G_{ij}+jB_{ij}$ respectively denote a real portion and an imaginary portion of a bus admittance matrix, $V_i$ and $V_j$ respectively denote the magnitudes of voltages of the bus i and the bus j, and $\theta_i$ and $\theta_j$ respectively denote phase angles of the bus i and the bus j. However, a relation of $G_{ij}+jB_{ij}=(R_{ij}+jX_{ij})$ is established, and $R_{ij}+jX_{ij}$ denotes an impedance of a line.

$$Q_{Loss}(x) = \sum_{i=1}^{N} \sum_{j=1}^{N} |Q_{ij} + Q_{ji}| \quad (13)$$

-continued $$= \sum_{i=1}^{N} \sum_{j=1}^{N} [-B_{ij}\{V_i^2 + V_j^2 - 2V_iV_j\cos(\theta_i - \theta_j)\} -$$

$$y_{ij}(V_i^2 + V_j^2)] \quad (i \neq j)$$

In Expression (13) showing the reactive power transmission loss $Q_{Loss}(x)$ of the entire system, Qij denotes a reactive power from the bus i to the bus j, $Q_{ji}$ denotes a reactive power from the bus j to the bus i, and $Y_{ij}$ denotes an admittance of a ground capacitance component of the bus.

$$\text{Cost}(p) = \sum_{g=1}^{m} (\alpha_g p_g^2 + \beta_g p_g + \gamma) \quad (14)$$

In Expression (14) showing the total fuel cost Cost(p) due to a change of the active power output distribution of the power supply, $\alpha_g$, $\beta_g$, and $\gamma_g$ denote a coefficient of a fuel consumption characteristic of a power generator g, $p_g$ denotes an active output of the power generator g, and m denotes the number of power generators.

$$Q_{Gall}(x) = \sum_{m} |Q_g| \quad (15)$$

In Expression (15) showing the sum $Q_{Gall}(x)$ of reactive power outputs of the power supply due to a change in the power factor of each power supply, $Q_{Gall}(x)$ denotes the sum of reactive power outputs of the power generator, $Q_g$ denotes a reactive power output of the power generator g, and m denotes the number of power generators. However, the power factor is calculated on the basis of the magnitude of $Q_g$, and may be converted into a cost by using the coefficient of the fuel consumption characteristic of the power generator g.

Meanwhile, regarding the optimization calculation, an interior point method, an active constraint method, a simplex method, and the like may be applied as a linear plan problem due to a linearized system, a primal-dual interior point method, a maximum entropy method, or the like may be applied as a secondary plan problem, a steepest descent method, a quasi-Newton method, a penalty function method, or the like may be applied as a non-linear plan problem, and an augmented Lagrangian multiplier method or the like may be applied as a non-linear plan problem with constraint. In addition, the optimization calculation may be a method performed by applying genetic algorithm which is meta-heuristic, simulated annealing, tab search, or particle swarm optimization (PSO) to each problem, a combination optimization problem, a mixed integer non-linear optimization problem, or the like.

In a case of the linear plan problem, a linear plan method can be applied using a method of performing linear approximation of a power system which is described in, for example, "Ishida et al., Feasibility Study on Feed-Forwarding Voltage Reactive-Power Control Method Based on LP Method, The transactions of the Institute of Electrical Engineers of Japan B, Vol. 117, No. 8, pp. 1115-1120, 1997". In a case of the non-linear plan problem, a non-linear plan method can be applied by applying a calculation method such as a Newton-Raphson method to a power equation.

In processing step S16, output instruction is performed using one or more of the target value changing timing data D7 stored in processing step S32, the target value width data D8 stored in processing step S33, and the target value data D9 stored in processing step S34. A transmission destination is, for example, the individual control device 45 for keeping balance between a voltage and a reactive power in a certain region, and the individual control device 45 receives one or more of the target value changing timing data D7, the target value width data D8, and the target value data D9 at a cycle which is set in advance, changes a target value to the value of the target value data D9, for example, at a timing based on the target value changing timing data D7, performs optimization calculation on the basis of Expressions (11) and (16), and performs voltage and reactive power control.

$$V(x) = \sum_{i=1}^{M} (v_i - v_{iref})^2 \quad (16)$$

In Expression (16), V(x) denotes the sum of deviations between a voltage target value and a voltage measurement value of a bus to be monitored, i, j∈$\Omega_V$ denotes a bus to be monitored, M denotes a total number of buses to be monitored (i=1 to M), $v_i$ denotes a voltage measurement value of the bus i, and $v_{iref}$ denotes a target value of the bus i.

However, a target value width serves as a constraint expression. In a case where convergence is degraded, an improvement in convergence is achieved by embedding an objective function as a penalty function. Further, in a case where convergence is degraded, it is preferable to obtain a solution by adding a process of alleviating the value of the penalty function.

Meanwhile, in FIG. 11, a dead zone can be provided in a voltage setting value $V_{ref}$. In addition, $V_1$, $V_2$, and $Q_2$ may also be given. Further, it is also preferable to correct stability of upper and lower limits of a voltage in addition to economic efficiency. Meanwhile, a method of correcting the voltage setting value $V_{ref}$ in advance from tendencies of an increase and a decrease of consumption is known.

In processing step S36, a deviation between a target voltage and a measurement value is calculated in order to make the operator easily confirm whether or not the target value is correctly followed, as the calculation of control evaluation by using one or more of the system measurement data D5, the target value constraint calculation result data D12 stored in processing step S39, the target value changing timing data D7 stored in processing step S40, the target value width data D8 stored in processing step S33, and the target value data D9 stored in processing step S34, and results thereof are stored in the control evaluation result database DB10.

In the last processing step S11, as state monitoring of the power system, screen display is performed for one or more of the prediction value data D1, the system facility data D2, the calculation setting data D3, the determination criterion data D4, the system measurement data D5, the target value constraint calculation result data D12 stored in processing step S39, the target value changing timing data D7 stored in processing step S32, the target value width data D8 stored in processing step S33, the target value data D9 stored in processing step S34, and the control evaluation result data D10 stored in processing step S36.

Meanwhile, various calculation results and pieces of data accumulated in the memory in the middle of calculation may be sequentially displayed on screens of other monitoring devices. Thereby, an operator can easily ascertain operational conditions of the power system voltage reactive power monitoring control device 10.

FIGS. 19 and 20 are specific display examples of an output screen. First, FIG. 19 is a system diagram in which a system voltage state is indicated by a contour line of a voltage. In this example, color-coding display is performed in order to display the contour line of the voltage. Further, the state of the voltage is monitored at all times, and there is an effect that the operator easily ascertains the state by notifying a message in the upper portion of the screen when a violation occurs in each voltage level which is set in advance. Meanwhile, the contour line of the voltage is indicated by a straight line, and all of the buses or measurement points of maps can be connected by the line. In addition, the transparency of the color of a voltage contour line having a system diagram shape and a figure surrounded by the contour line is adjusted, and the system diagram is made to be seen behind, which leads to an effect that the operator easily understands each point of the system diagram and voltage conditions. Meanwhile, in a case where an area is large, the screen can also be divided by a tab, but it is also possible to show all of the areas on one screen by enlarging or reducing the size of the system diagram.

With regard to the display in FIG. 19, measurement points of all nodes or maps may be connected by a line. The display also plays a role in monitoring a voltage level 1 violation and the like. It is preferable to make the map seen by a skeleton. The display may not be the display of a tab. One screen may be set for each region.

Next, FIG. 20 shows an operational state of the system which is indicated by a relationship between a time domain waveform of a voltage, a target voltage width of a selection time, and a measurement value. In an upper screen of FIG. 20, it is possible to easily confirm a relationship between a facility voltage upper and lower limit, a voltage target value width, and a target voltage, and a result value of the measurement value and an operational point are displayed thereon, which leads to an effect that the operator can easily ascertain the operational state of the system. In addition, the control evaluation result data D10 calculated in processing step S36 is displayed on the screen, and thus there is an effect that the operator easily evaluates the followability of control. Although each of the buses to be monitored is switched by a tab, the bus is treated as a window, and the screens can also be arranged in parallel. Thereby, there is an effect that the operator easily compares the screens with each other.

In addition, a measurement value for a target voltage width of each bus to be monitored is displayed in a lower portion of FIG. 20, and thus there is an effect that the operator easily compares the measurement values with each other. These screens change every moment for each measurement cycle, and the past history can be seen from a database. Thereby, it is possible to evaluate the past data or to compare the present state with the past state at any time, which leads to an effect of utilization for operation.

In addition, the display in FIG. 20 may not be the display of a tab. One screen may be set for each bus. In addition, calculation result data and past data can be selected. Results of integration of a deviation between a target voltage and a measurement value may be displayed on the screen.

In this manner, the above-described transmission data 72a (target value changing timing data D7, target value width data D8, target value data D9) which is created by the power system voltage reactive power monitoring control device 10 which is a central device is transmitted to the individual control devices 45 which are individual devices. The individual control device 45 measures and obtains a voltage and a reactive power at the installation point thereof in accordance with a given target value, and executes control on the target value. The individual control device 45 receives one or more of the target value changing timing data D7, the target value width data D8, and the target value data D9 at a cycle which is set in advance, changes the target value to the value of the target value data D9, for example, at a timing based on the target value changing timing data D7, and performs voltage and reactive power control.

Example 1 shows a method in which the central device performing monitoring control from the viewpoint of the entire power system computationally calculates and provides a target value for the individual device, and the individual device executes control in order to observe this.

As described above, Example 1 shows an example of the power system voltage reactive power monitoring control device 10 that calculates an index by using the prediction value data D1 which is a prediction value of power system information, the system facility data D2 which is system facility information, the calculation setting data D3 which is calculation setting information, and the determination criterion data D4 which is determination criterion information, calculates one or more target value constraints of the portion of the power system by using the calculated index calculation result data D6, calculates a target value changing timing by using the calculated target value constraint calculation result data D12, calculates a target value width by using the calculated target value constraint calculation result data D12 and target value changing timing data D7, calculates a target value by using the system facility data D2, the calculation setting data D3, the calculated target value constraint calculation result data D12, target value changing timing data D7, and target value width data D8, performs output instruction by using the calculated target value changing timing data D7, target value width data D8, and target value data D9, evaluates results of the output instruction by using the system measurement data D5 which is measurement information of power system information, the calculated target value constraint calculation result data D12, target value changing timing data D7, target value width data D8, and target value data D9, and displays one or more calculation results of the calculated index calculation result data D6, the target value constraint calculation result data D12, the target value changing timing data D7, the target value width data D8, the target value data D9, and the control evaluation result data D10.

Meanwhile, there are also matters applicable to the subsequent examples in common, but the matters may be reflected in consideration of the following points in the invention and the examples. Here, noticeable matters throughout the entirety will be collectively described.

First, when a target value calculation method (optimization calculation) with economic efficiency as an objective function is performed, the points of view of the distribution of an economical load as a loss of the power supply, the control of an active power, a phase adjustment facility as a loss of power transmission, a tap ratio of a transformer, a change in a voltage of a terminal of a power generator, the control of a voltage and a reactive power, and the amount of control as the amount of operation may be reflected and considered.

According to the invention, since the method is a method of narrowing an objective function, weight adjustment is not necessary, and thus it is possible to solve a problem that a large amount of effort for adjusting a weight during multi-objective optimization computational calculation, which has been a problem in the related art, is required.

Example 1 shows a method in which a target value is given to the individual devices, but the following points may be considered for the target value. First, the extraction of a setting target portion to which the target value is to be given may be determined by an appropriate method. In the invention, a target value width is absolutely necessary information, and the target value may not be required. When there is information on the target value or the target value width, it is possible to control the target value using the individual devices. When the state of the system becomes severe and there is no solution, the solution of a width may be obtained by a determination criterion alleviation process. When the width is severe in the calculation of the target value, a solution may be obtained as a penalty function instead of an absolute constraint. The target value constraint refers to, for example, a constraint of a voltage target value, and a reactive power loss target value and the like can be additionally set. Results of the execution of the control may be returned from the individual devices.

Regarding data obtained from the system, the system measurement data D1 includes data in a case of only a pilot bus and data in a case where pieces of data of the entire system are collected. The data is V, I, P, or Q of each portion of the system. In addition, the system facility data D2 is topology of the system or an adjustment force of an adjustment power supply, and data of dynamic characteristic analysis is also necessary. The data to be exchanged may also include an instruction value, a time, and an ID.

In addition, in a case of a communication failure, the setting of a voltage and a width in an urgency state having a likelihood may be given so as to perform operation by only the individual devices. Either the setting of a voltage or the amount of control may be used in accordance with specifications of the individual devices. Meanwhile, control evaluation is performed at all times, but is meaningless when the individual devices do not operate.

The above-described modification and alternative example can also be appropriately applied in the subsequent examples.

Example 2

In Example 2, reference will be made to FIGS. 21 to 26 to describe the giving of a target value from which the influence of external disturbance is excluded, in consideration of fluctuation data as transmission data in the system configuration of Example 1.

In Example 2, fluctuation data D13 is added in addition to the prediction value data D1 in Example 1. Thereby, a description will be given of an example of a system control device 10 for achieving either one or both of more firmly keeping balance between a voltage and a reactive power of the power system and improving economic efficiency even when the output of renewable energy resources fluctuates with the elapse of time due to the weather. Meanwhile, the same operations at the same configuration portions as those in Example 1 will not be described.

FIG. 21 is an example of a diagram in which a configuration of the power system voltage reactive power monitoring control device 10 in Example 2 is described from a functional aspect. A difference in configuration between Example 2 and Example 1 is in that a fluctuation data database DB13 is added to the input data unit 40 in FIG. 1 of Example 1, and the fluctuation data D13 is added as data used in the index calculation unit 31.

FIG. 22 is a diagram illustrating a hardware configuration of the power system voltage reactive power monitoring control device in Example 1 and an example of the overall configuration of the power system, and Example 1 is different from Example 2 in that the fluctuation data database DB13 is added as a database DB in FIG. 2 of Example 1.

FIG. 23 is a diagram illustrating an example of the fluctuation data D13. Here, the fluctuation data D13 will be described with reference to FIG. 23. Regarding the fluctuation data D13, fluctuation data generated due to renewable energy resources (photovoltaic, a wind power generation, or the like) is stored as, for example, standard deviations $\pm\sigma$, $\pm 2\sigma$, and $\pm 3\sigma$ and the like of time domain probability distribution. Meanwhile, the fluctuation data may be set in a database in advance, or may be obtained by storing and referring to system measurement data. Meanwhile, the fluctuation in the fluctuation data described here is not a great change such as during the occurrence of a failure, and a fluctuation in supply and demand due to renewable energy resources and the like is described in Example 2.

Meanwhile, the fluctuation data may be held in a database, or may be calculated from the history of the system measurement data. The term "fluctuation" as used herein refers to a steady fluctuation, such as a renewable energy fluctuation, in a non-accident case, and is obtained by excluding a steep fluctuation by using a low-pass filter or the like.

Contents of a calculation process are different from those in Example 1 by using the fluctuation data D13. Portions having different calculation in FIG. 8, which is an example of a flow chart illustrating the entire processing of the power system voltage reactive power monitoring control device, will be described in order.

First, in processing step S31 of FIG. 8, index calculation is performed using prediction value data D1, the system facility data D2, the calculation setting data D3, the determination criterion data D4, and the fluctuation data D13, and results thereof are stored in the index calculation result database DB6. Here, an index calculation method is the same as that in Example 1, but this example is different from Example 1 in that calculation is also performed as an initial condition on each time cross-section subjected to maximum and minimum fluctuations of fluctuation data set in advance for each time cross-section of the prediction value data D1 to be calculated.

Next, in processing step S39, target value constraint calculation is performed using the index calculation result data D6 and the determination criterion data D4 stored in processing step S31, and results thereof are stored in the target value constraint calculation result database DB12. Although the target value constraint calculation method is the same as that in Example 1, not only a result serving as a severe constraint after the addition of fluctuation data but also a result calculated by changing the cross-section of a power flow at a preset interval is set to be a calculation result.

FIG. 24 is a diagram illustrating an example of target value constraint data in Example 2, and shows only the severest calculation results here. Here, an example of the target value constraint calculation result data D12 of each stability will be described with reference to FIG. 24.

Here, a voltage is selected as the type of target value, and the following four voltage constraints are given as voltage constraints at a point i which is set as an object. A first voltage constraint is a voltage constraint $V_{iUPPer}(t)$, $V_{iLower}(t)$ (solid line) of facility upper and lower limits. This is the same as that in Example 1.

A second voltage constraint is a voltage constraint $V_{iTS}$ of transient stability, which is a different calculation result from that in FIG. 9. This is a result obtained by calculating a target value constraint related to the transient stability calculated in processing step 39. In FIG. 24, a voltage constraint of time t is represented by $V_{iTS}(t)$, and is indicated by a narrow one-dot chain line in the range of the time t illustrated in FIG. 24.

A third voltage constraint is a voltage constraint of steady-state stability, and is a result obtained by calculating a target value constraint $V_{iSS}$ related to the steady-state stability calculated in processing step 39. In FIG. 24, the voltage constraint of the time t is represented by $V_{iSS}(t)$, and is indicated by a long and narrow dashed line in the range of the time t illustrated in FIG. 24.

A fourth voltage constraint is a voltage constraint $V_{iVS}$ of voltage stability, and is a result obtained by calculating a target value constraint related to the voltage stability calculated in processing step 39. In FIG. 24, the voltage constraint of the time t is represented by $V_{iVS}(t)$, and is indicated by a short and narrow dashed line in the range of the time t illustrated in FIG. 24.

The above-described four target value constraints are collectively shown in FIG. 24. Meanwhile, only lower limits of the second to fourth constraints are shown, but upper limits thereof may be shown as occasion demands. The target value constraints calculated as described above are determined by synthesizing the upper and lower limits thereof. FIG. 24 shows calculation results of the severest target value constraint data of the fluctuation data D13, but calculation is actually performed on each cross-section increased or decreased by fluctuation data. As is apparent from comparison between FIG. 11 and FIG. 24, FIG. 11 shows a set of voltage target upper and lower limits $V_{iref}$, while FIG. 24 shows a plurality of sets of voltage target upper and lower limits $V_{iref}$ as a result obtained by performing calculation on each cross-section increased or decreased by the fluctuation data D13.

Next, in processing step S32, target value changing timing calculation is performed using the target value constraint calculation result data D12 stored in processing step S39, and results thereof are stored in the target value changing timing database DB7. Although the calculation method is the same as that in Example 1, calculation is performed on each cross-section increased or decreased by the fluctuation data D13.

Next, in processing step S33, target value width calculation is performed using the target value constraint calculation result data D12 stored in processing step S39 and the target value changing timing data D7 stored in processing step S32, and results thereof are stored in the target value width database DB8. Although the calculation method is the same as that in Example 1, calculation is performed on each cross-section increased or decreased by the fluctuation data D13.

Next, in processing step S34, target value calculation is performed using the system facility data D2, the calculation setting data D3, the target value constraint calculation result data D12 stored in processing step S39, the target value changing timing data D7 stored in processing step S32, and the target value width data D8 stored in processing step S33, and results thereof are stored in the target value database DB9. Although the calculation method at this time is the same as that in Example 1, the results are calculation results with a width as illustrated in FIG. 24. This will be described later with reference to FIG. 25.

Optimization calculation is performed by setting one or more of minimization of an active power transmission loss, minimization of a reactive power transmission loss, minimization of a total fuel cost due to a change in active power output distribution of a power supply, and minimization of a reactive power output due to a change in a power factor of each power supply to be objective functions and setting an operation variable to be the type (voltage in Example 2) of target value with a target value width at each timing as a constraint, and thus a target value at each timing and target value width is calculated on each cross-section increased or decreased by the fluctuation data.

FIG. 25 is a diagram illustrating an example of a target value calculation process in Example 2. Although the vertical axis represents economic efficiency and the horizontal axis represents a voltage Vi, there is a solution for maximizing economic efficiency. Regarding the target value data D9, one answer of optimization calculation is calculated with respect to a voltage constraint of a cross-section increased or decreased by any one piece of fluctuation data D13 as illustrated in FIG. 25. This is a point of each line as illustrated in FIG. 25. Since there are a plurality of target value widths, the repetition of this calculation results in a dashed line, a long and narrow dashed line, and a short and narrow dashed line with respect to economic efficiency which are results in FIG. 25 illustrating a graph in which the horizontal axis represents a voltage $V_i$ and the vertical axis represents an evaluation function.

Therefore, there is an effect that when operation is performed in a region in which each line is larger than a threshold $E_T$ for evaluating economic efficiency which is set in advance, it is possible to keep stability and to perform operation with economic efficiency greater than the threshold ET even when the cross-section of a power flow of the system fluctuates. In addition, since the superimposition of these lines results in a thick solid line, a point having the maximum economic efficiency is determined as a target value, and thus it is possible to calculate the most economic target value while a fluctuation may occur.

FIG. 26 is a diagram illustrating an example of target value data in Example 2. According to FIG. 26 illustrating calculation results of a target value, it is indicated that operation can be performed in a region in which economic efficiency is always larger than the threshold $E_T$ of FIG. 25 by changing a voltage target value $V_{iref}$ with the elapse of time as indicated by a thick solid line.

Meanwhile, processing step S16 and the subsequent processing steps are the same as those in Example 1.

Example 3

Example 3 is configured such that transmission data given to the individual devices by the central device is set to be the amount of control for the individual devices in the system configuration of Example 1. Example 3 will be described with reference to FIGS. 27 to 32.

While Example 1 shows a configuration in which a target value is transmitted to the individual control devices 45 which are individual devices, Example 3 is different from Example 1 in terms of a control flow and a configuration in which the amount of control is calculated after a target value is calculated, and control is performed using direct control devices 46 which are individual devices.

Thereby, even with respect to a power system that does not include the individual control devices 45, it is possible to provide either one or both of a function of keeping balance between a voltage and a reactive power of the power system and a function of improving economic efficiency when the control devices 46 are present. Hereinafter, an example of the system control device 10 will be described. The same operations at the same configuration portions as those in Example 1 will not be described.

FIG. 27 is a diagram illustrating a configuration of the power system voltage reactive power monitoring control device 10 in Example 3 in the functional aspect. A difference in configuration between Example 3 and Example 1 is in that a control amount calculation unit 35 is added to the control calculation unit 41 in FIG. 1 of Example 1, and control amount calculation result data D15 is added to the result data D42. Here, a method is adopted in which optimization calculation is performed by a target value calculation method with economic efficiency as an objective function, and the amount of control is transmitted to the individual devices.

FIG. 28 is a diagram illustrating a hardware configuration of the power system voltage reactive power monitoring control device 10 in this example and an example of the overall configuration of the power system 100. This example is different from Example 1 in that a control amount calculation result database DB5 is added as the database in FIG. 2, the individual control device 45 is changed to the direct control device 46, and transmission data 72*b* includes control amount calculation result data D15. Meanwhile, the direct control device 46 controls not only the Power transmission system 100 but also the power generation system 200 or the load system 300.

Here, a difference between the individual control device 45 in the case of Example 1 and the direct control device 46 in Example 3 will be described. Both the devices are devices for keeping balance between a voltage and a reactive power in a certain region. In Example 1, a target value (timing, width, magnitude) is given to the individual control device 45, and the individual control device 45 measures the magnitudes of the voltage and the reactive power to be set as the given target value to determine the amount of control and perform control on the target value. On the other hand, in the direct control device 46 in Example 3, a signal is transmitted in the form of the amount of control. The direct control device 46 only executes operation in accordance with the amount of control. From this, it can be said that the individual control device 45 in the case of Example 1 is suitable for an apparatus capable of controlling analog magnitude, while the direct control device 46 in Example 3 is suitable, for example, for an apparatus digitally performing the control of opening and closing. That is, as illustrated in FIG. 29, the direct control device is suitable for a case targeted at an apparatus functioning by the control of a position such as opening and closing positions or a tap position.

FIG. 29 is a diagram illustrating an example of the control amount calculation result data D15. Here, the control amount calculation result data D15 will be described with reference to FIG. 29. SC, ShR, a tap value of a transformer with tap, or a time domain instruction value of AVR or AQR of the power supply is stored in the control amount calculation result data D15. Accordingly, control can be indicated. Meanwhile, AVR or AQR of the power supply can also be given in the form of a target value, but an example in which AVR or AQR is given in the form of the amount of control is shown.

Meanwhile, according to FIG. 28, the transmission data 72*b* to be given to the direct control device 46 by the power system voltage reactive power monitoring control device 10 may include a target value (timing, width, magnitude) in addition to the control amount calculation result data D15.

When the direct control device 46 is a human-based device, there is an effect that control can be performed while confirming the effect of control not only by giving a control instruction by the control amount calculation result data D15 but also by giving one or more of the target value changing timing data D7, the target value width data D8, and the target value data D9. This depends on the performance of the direct control device 46. However, when the direct control device 46 can also confirm a control effect, there is an effect that it is possible to perform control while confirming a control effect by transmitting one or more of the target value changing timing data D7, the target value width data D8, and the target value data D9, in addition to the control amount calculation result data D15.

There are contents of a calculation process which are added to Example 1 by using the control amount calculation result data D15. In FIG. 30 which is an example of a flow chart illustrating the overall processing of the power system voltage reactive power monitoring control device 10, an added portion to be calculated will be described.

In FIG. 30, first, a flow up to processing steps S31 to S34 is the same as that in Example 1.

Next, in processing step S35, control amount calculation is performed using one or more of the target value changing timing data D7 stored in processing step S32, the target value width data D8 stored in processing step S33, and the target value data D9 stored in processing step S34, and calculation results are stored in the control amount calculation result data database DB15.

The control amount calculation is performed by performing optimization calculation on the basis of Expressions (11) and (16), but an example of a control variable x at this time is shown in Expression (17). The control variable x is defined by the following vector expression on the basis of an SC, an ShR, a tap value (Tap) of a transformer with tap which is a portion to be controlled, an instruction value of AVR or AQR of a power generator, a phase regulator, line switching, and the like. Voltage and reactive power control is performed using the results of the optimization calculation on the basis of the expression.

$$x = [SC, ShR, Tap]^T \qquad (17)$$
$$= [SC_i \ldots SC_n, ShR_1 \ldots ShR_m, Tap_1 \ldots Tap_p, V_{g1} \ldots V_{gq}]^T$$

Here, SCn denotes the amount of bank insertion of an n-th SC, $ShR_m$ denotes the amount of insertion of an m-th ShR, $Tap_p$ denotes a tap position of a p-th LRT, $V_{gq}$ denotes a terminal voltage of a q-th power generator, n denotes the number of facilities of SC, m denotes the number of facilities of ShR, p denotes the number of facilities of LRT, and p denotes the number of facilities of $V_g$.

Meanwhile, the point of view of a control margin may be considered in executing Expression (17). Regarding an operation margin, a terminal voltage $V_q$ of the power generator as shown in Nakachi et al.: "Voltage and Reactive Power Control Taking into Account of Economy and Security by Using Tab Search", The transactions of the Institute of Electrical Engineers of Japan B, Vol. 128, No. 1, pp. 305-311, 2008, or Expression (2) of P82 of "Kishi et al.:

"Voltage and Reactive Power Control Considering Operation Room", School of Engineering of Tokai University, Vol. 48, No. 1.

Processing step S16 is different from that in Example 1 in that the output of the control amount calculation result data D15 calculated in processing step S35 is also instructed, in addition to pieces of data of which the output is instructed in Example 1.

Processing steps S36 and S11 are different from those in Example 1 in that contents illustrated in FIGS. 31 and 32 are calculated in processing step S36 and are displayed on a screen in processing step S11, in addition to the contents in Example 1.

As shown in an example of screen display in FIG. 35, in processing step S36, calculation and the like as described in "Jintaek Lim and Jaeseok Choi et. al, Expert criteria based probabilistic power system health index model and visualization, Probabilistic Methods Applied to Power Systems (PMAPS), 2014 International Conference on, pp. 1-6, and Christoph Schneiders, et. al, Enhancement of situation awareness in wide area transmission systems for electricity and visualization of the global system state, Innovative Smart Grid Technologies (ISGT Europe), 2012 3rd IEEE PES International Conference and Exhibition on, pp. 1-9", and the like are performed so that stability of each voltage level can be displayed on a radar chart, and results thereof are stored in the control evaluation result database DB10.

Economic efficiency is also evaluated by performing on-line calculation on the basis of the evaluation functions described in processing step S34. Thereby, it is possible to easily confirm the effect of control, and there is an effect that the operator can notice that the control is not successfully performed in a case of the unsuccessful control. In addition, as illustrated in FIG. 32, since even the amount of control can be calculated, a system diagram showing a relationship between a candidate of the amount of control and a control apparatus is also displayed in processing step S11, and thus there is an effect that the effect of control is easily confirmed.

Meanwhile, system facility data includes a connection configuration of the system, and adjustment force (adjustment capability) data may be the amount of plan adjustment and may be periodically received.

Example 4

Example 4 is configured such that the central device is provided with a prediction function and a plan value correction function in the system configuration of Example 1. Example 4 will be described with reference to FIGS. 33 to 35.

Comparing FIG. 33 which is a diagram illustrating a configuration of the power system voltage reactive power monitoring control device in Example 4 in the functional aspect of FIG. 1 which is a diagram illustrating a configuration of the power system voltage reactive power monitoring control device in Example 1 in the functional aspect, the following configuration is newly added. Added portions are a plan value database DB17, a prediction calculation unit 60, an error calculation unit 61, an error amount calculation database DB19, an error generation determination unit 62, a plan value correction unit 63, and a corrected plan value database DB18.

These databases and units are added, and thus a power flow state and the like of the power system change. In a case where a deviation from the prediction value data D1 occurs, the deviation is calculated, and corrected plan value data D18 is calculated on the basis of the deviation. Prediction calculation is performed again on the basis of the corrected plan value data D18, and thus a target value can be calculated through the same operation as that in Example 1 and the output of the target value can be instructed. Accordingly, it is possible to provide either one or both of keeping balance between a voltage and a reactive power of the power system and improving economic efficiency even when the output of renewable energy resources fluctuates with the elapse of time due to the weather.

Hereinafter, first, an example of the system control device 10 will be described. The same operations at the same configuration portions as those in Example 1 will not be described.

FIG. 33 is a diagram illustrating an example of the overall configuration of the power system voltage reactive power monitoring control device 10 in Example 4. A difference in configuration between the above-described examples and Example 4 is in that a plan value database DB17, a prediction unit 60, an error calculation unit 61, an error amount calculation database DB19, an error generation determination unit 62, a plan value correction unit 63, and a corrected plan value database DB18 are added.

FIG. 34 is a diagram illustrating a hardware configuration of the power system voltage reactive power monitoring control device 10 in Example 4 and an example of the overall configuration of the power system 100. This example is different from the above-described examples in that the plan value database DB17, the corrected plan value database DB18, and the error amount calculation database DB19 are added as the databases in FIG. 2 of Example 1.

FIG. 35 is a diagram illustrating an example of plan value data. Here, the plan value data D17 will be described with reference to FIG. 35. The plan value data D17 includes predicted consumption results, a power generator output plan, and a control plan, and the prediction calculation unit 60 can calculate a power flow for each cross-section of the future prediction time by using the results and plans to calculate the prediction value data D1. For this reason, also regarding the corrected plan value data D18, the value thereof is corrected, but the same type of data as the plan value data D17 are stored. Prediction calculation can be performed using the corrected plan value data D18 by including the plan value database DB17 and the prediction calculation unit 60, and it is possible to provide either one or both of keeping balance between a voltage and a reactive power of the power system and improving economic efficiency even when the output of renewable energy resources fluctuates with the elapse of time due to the weather. Thereby, the contents of the calculation process are different from those in Example 1. Portions having a different calculation mode in FIG. 8, which is an example of a flow chart illustrating the entire processing of the power system voltage reactive power monitoring control device, will be described in order.

First, prediction calculation is performed using the plan value data D17 before the processing step S31, and the prediction value data D1 is stored. The subsequent flow up to processing steps S31 to S11 is the same as that in Example 1.

In parallel with this, the error calculation unit 61 calculates an error by subtracting values of the system measurement data D5 which are periodically measured and the values of the prediction value data D1. In addition, the error calculation unit 61 subtracts on-off data of the system measurement data D5 and an on-off state of the system facility data D2 to calculate whether or not a system configuration includes an error.

Calculation results of the two errors in the error calculation unit 61 are stored as error amount data D19 in the error amount calculation database DB19 and are also transmitted to the error generation determination unit 62, and it is determined whether or not an error has occurred through comparison with a threshold which is set in advance. The error generation determination unit 62 determines that an error has occurred, the plan value correction unit 63 corrects plan values corresponding to the amount of errors by using the error amount data D19 and the plan value data D17, and stores the corrected plan value data D18 in the corrected plan value database DB18.

The corrected plan value data D18 is finally transmitted to the prediction value calculation unit 60, and the prediction value calculation unit 60 calculates the prediction value data D1 in the same manner as when the prediction value calculation is performed using the plan value data D17, and overwrites the prediction value data D1. These operations are rapidly performed when an error occurs, and thus it is possible to reduce an error of control.

In addition, when the error generation determination unit 62 determines that an error has occurred, the output instruction of a target value is temporarily set to be in a standby state, and thus there is an effect that a target value having an error may not be transmitted. In addition, regarding error calculation, there is also a method in which measurement data itself is used, but the measurement data may be used for comparison after state estimation and power flow calculation. Thereby, comparison can be performed after estimating a plausible state of the system, and thus the accuracy of error determination is improved. In addition, since there is a possibility that a steep fluctuation in renewable energy output which is unnecessary for the error determination, and the like may be added to a measurement value depending on the weather, only a desired fluctuation component is extracted using a low-pass filter which is set in advance, and thus the accuracy of error determination is improved.

Here, state estimation and power flow calculation will be supplemented. A system state during system measurement is calculated through state estimation calculation and the calculation of a power flow calculation program, which are not shown in the drawing, by using the system measurement data D5, the system facility data D2, and the calculation setting data D3, and the system state is stored in a system measurement database 25. Meanwhile, the state estimation calculation refers to a calculation function of estimating a plausible system state in a specific time cross-section by determining whether or not there is abnormal data in observation data of a power transmission and distribution apparatus including a substation, a power plant, and a power transmission line and by removing the abnormal data, on the basis of the observation data and connection data. Here, the state estimation calculation is performed on the basis of various methods such as "Lars Holten, Anders Gjelsvlk, Sverre Adam, F. F. Wu, and Wen-Hs Iung E. Liu, Comparison of Different Methods for State Estimation, IEEE Transaction on Power Systems, Vol. 3 (1988), pp. 1798-1806".

In addition, in the power flow calculation, it is preferable to perform PV designation of a power generator node, a synchronous phase modifier, and a reactive power compensator in the power system 100 and PQ designation of a substation node and a load node by using state estimation results, a voltage V of each node 120 necessary for the power flow calculation of the system facility data D2 and the calculation setting data D3, and output instruction values P and Q of a load, to designate a node voltage V and a phase angle θ which are set in advance in a preset slack node in the power system 100, to perform power flow calculation by using a Newton-Raphson method together with an admittance matrix Yij created from a system database 21, and to store calculation results. Here, a power flow calculation method may be performed on the basis of a method such as "WILLIAM F TINNEY, CLIFFORD E HART, Power Flow Solution by Newton's Method, IEEE Transaction on Power APPARATUS AND SYSTEMS, VOL. PAS-86, NO. 11 (1967) pp. 1449-1967". Meanwhile, the power flow calculation method is performed on the basis of an alternating current method, but may be performed by a direct current method, a flow method, or the like.

Meanwhile, regarding the error calculation in Example 4, comparison may be performed after performing state estimation of the system measurement data. In addition, the error calculation may be determined on the basis of a difference in an SV value, or a mean deviation from a state estimation value may be used. In this case, there is a situation where a low-pass filter is required to be passed.

Example 5

Example 5 is configured such that the central device is provided with a prediction function and a plan value correction function in the system configuration of Example 3. Example 5 will be described with reference to FIGS. 36 and 37.

Example 5 is configured such that the contents added to Example 1 in Example 4 are similarly added to Example 3. FIG. 36 is a diagram illustrating an example of the overall configuration of the power system voltage reactive power monitoring control device 10 in Example 5, and assumes a configuration in FIG. 27. A difference in configuration between the above-described examples and Example 5 is in that a plan value database DB7, a prediction unit 60, an error calculation unit 61, an error amount calculation database DB19, an error generation determination unit 62, a plan value correction unit 63, and a corrected plan value database DB18 are added.

FIG. 37 is a diagram illustrating a hardware configuration of the power system voltage reactive power monitoring control device 10 in Example 5 and an example of the overall configuration of the power system 100, and assumes a configuration in FIG. 28. Here, this example is different from the above-described examples in that the plan value database DB17, the corrected plan value database DB18, and the error amount calculation database DB19 are added as the databases in FIG. 28 of Example 3. Thereby, the same effects as those in Example 4 can also be achieved in the configuration of Example 3.

Example 6

Example 6 is configured such that an urgency state of the power system is determined to give a target value corresponding to the urgency state in the system configuration of Example 1. Example 6 will be described with reference to FIGS. 38 to 40.

In Example 6, an urgency state determination unit 37, an urgency target value calculation unit 38, and an urgency target value database DB14 holding urgency target value data D14 are added to the configuration in FIG. 1 of Example 1 as illustrated in FIG. 38, so that an urgency state is determined when a power flow state of the power system suddenly changes due to the occurrence of a system failure, or the like, a target value suitable for an urgency case is calculated, and the output of the target value can be indicated. Accordingly, it is possible to provide either one or both of keeping balance between a voltage and a reactive power of the power system and improving economic efficiency even when the output of renewable energy resources fluctuates with the elapse of time due to the weather. First, an example of the system control device 10 will be described. The same operations at the same configuration portions as those in Example 1 will not be described.

FIG. 38 is a diagram illustrating an example of the overall configuration of the power system voltage reactive power monitoring control device 10 in this example. A difference in configuration between the above-described examples and Example 6 is in that the urgency state determination unit 37, the urgency target value calculation unit 38, and the urgency target value database DB14 are added.

FIG. 39 is a diagram illustrating a hardware configuration of the power system voltage reactive power monitoring control device 10 in this example and an example of the overall configuration of the power system 100. This example is different from Example 1 in that the urgency target value database DB14 is added as the database in FIG. 2 of Example 1. FIG. 8 which is a main flow is the same as in Example 1.

Here, an urgency processing flow to be calculated in parallel with the main flow will be described with reference to FIG. 40. First, system measurement data is periodically received in processing step S100, and an urgency state is determined in processing step S110. The determination of the urgency state is performed by the same method as that of the error calculation in Example 4, but a determination threshold is different. In addition, in processing step S120, an urgency state occurs and is measured by the same method as that in Example 1, the urgency target value data D14 is obtained by calculating an urgency target value for the cross-section, and the output of the data is instructed. Thereby, there is an effect that stabilization can be achieved even in an urgency case.

In Example 6, the urgency target value data is required to immediately controlled, and thus a prediction value is not necessary. Regarding the urgency target value calculation, the calculation may be performed in advance by assuming a severe condition in advance even when there is no system measurement data. In addition, urgency state determination and urgency target value calculation are added to a program database. Thereby, there is an effect that stabilization can be achieved even in an urgency case.

Example 7

Example 7 is configured such that an urgency state of the power system is determined to give the amount of control corresponding to the urgency state in the system configuration of Example 3. A description thereof will be given with reference to FIGS. 41 to 43.

Example 7 is configured such that the contents added to Example 1 in Example 6 are similarly added to Example 3. FIG. 41 is a diagram illustrating an example of the overall configuration of the power system voltage reactive power monitoring control device 10 in this example. A difference in configuration between the above-described examples and Example 7 is in that the urgency state determination unit 37, the urgency target value calculation unit 38, and an urgency control amount calculation result database DB16 holding urgency control amount calculation result data D16 are added.

FIG. 42 is a diagram illustrating a hardware configuration of the power system voltage reactive power monitoring control device 10 in Example 7 and an example of the overall configuration of the power system 100. This example is different from the above-described examples in that the urgency control amount calculation result database DB16 holding the urgency control amount calculation result data D16 are added to the configuration in FIG. 32 of Example 3. Thereby, the same effects as in Example 6 can also be achieved in the configuration in Example 3.

FIG. 43 is a flow chart illustrating the overall processing of urgency state determination and urgency control amount calculation of the power system voltage reactive power monitoring control device in Example 7.

System measurement data is received in the first processing step S100, an urgency state is determined in processing step S110, urgency control amount calculation is performed in processing step S121, and an output command is given in processing step S130.

REFERENCE SIGNS LIST

10: POWER SYSTEM VOLTAGE REACTIVE POWER MONITORING CONTROL DEVICE
11: DISPLAY UNIT
12: INPUT UNIT
13: COMMUNICATION UNIT
14: CPU
15: MEMORY
16: INSTRUCTION UNIT
DB1: PREDICTION VALUE DATABASE (PREDICTION VALUE DATA D1)
DB2: SYSTEM FACILITY DATABASE (SYSTEM FACILITY DATA D2)
DB3: CALCULATION SETTING DATABASE (CALCULATION SETTING DATA D3)
DB4: DETERMINATION CRITERION DATABASE (DETERMINATION CRITERION DATA D4)
DB5: SYSTEM MEASUREMENT DATABASE (SYSTEM MEASUREMENT DATA D5)
DB6: INDEX CALCULATION RESULT DATABASE (INDEX CALCULATION RESULT DATA D6)
DB7: TARGET VALUE CHANGING TIMING DATABASE (TARGET VALUE CHANGING TIMING DATA D7)
DB8: TARGET VALUE WIDTH DATABASE (TARGET VALUE WIDTH DATA D8)
DB9: TARGET VALUE DATABASE (TARGET VALUE DATA D9)
31: INDEX CALCULATION UNIT
32: TARGET VALUE CHANGING TIMING CALCULATION UNIT
33: TARGET VALUE WIDTH CALCULATION UNIT
34: TARGET VALUE CALCULATION UNIT
35: CONTROL AMOUNT CALCULATION UNIT
36: CONTROL EVALUATION UNIT
37: URGENCY STATE DETERMINATION UNIT
38: URGENCY TARGET VALUE CALCULATION UNIT
39: TARGET VALUE CONSTRAINT CALCULATION UNIT
40: INPUT DATA UNIT (INPUT DATA D40)
41: CONTROL CALCULATION UNIT
42: RESULT DATA UNIT (RESULT DATA D42)
43: BUS LINE
44: MEASUREMENT DEVICE
45a, 45b: INDIVIDUAL CONTROL DEVICE
46a, 46b, 46c, 46d, 46e: DIRECT CONTROL DEVICE

DB10: CONTROL EVALUATION RESULT DATABASE (CONTROL EVALUATION RESULT DATA D10)
DB11: PROGRAM DATABASE (PROGRAM DATA D11)
DB12: TARGET VALUE CONSTRAINT CALCULATION RESULT DATABASE (TARGET VALUE CONSTRAINT CALCULATION RESULT DATA D12)
DB13: FLUCTUATION DATABASE (FLUCTUATION DATA D13)
DB14: URGENCY TARGET VALUE DATABASE (URGENCY TARGET VALUE DATA D14)
DB15: CONTROL AMOUNT CALCULATION RESULT DATABASE (CONTROL AMOUNT CALCULATION RESULT DATA D15)
DB16: URGENCY CONTROL AMOUNT CALCULATION RESULT DATABASE (URGENCY CONTROL AMOUNT CALCULATION RESULT DATA D16)
DB17: PLAN VALUE DATABASE (PLAN VALUE DATA D17)
DB18: CORRECTED PLAN VALUE DATABASE (CORRECTED PLAN VALUE DATA D18)
60: PREDICTION CALCULATION UNIT
61: ERROR CALCULATION UNIT
62: ERROR GENERATION DETERMINATION UNIT
63: PLAN VALUE CORRECTION UNIT
71: RECEPTION DATA (SYSTEM MEASUREMENT DATA D1)
72a: RECEPTION DATA (TARGET VALUE CHANGING TIMING DATA D7, TARGET VALUE WIDTH DATA D8, TARGET VALUE DATA D9)
72b: TRANSMISSION DATA (TARGET VALUE CHANGING TIMING DATA D7, TARGET VALUE WIDTH DATA D8, TARGET VALUE DATA D9, CONTROL AMOUNT CALCULATION RESULT DATA D15)
100: POWER TRANSMISSION SYSTEM
200: POWER GENERATION SYSTEM
300: LOAD SYSTEM
110a, 110b: POWER SUPPLY (POWER GENERATOR OR RENEWABLE ENERGY RESOURCES POWER SUPPLY OR INVERTER SYSTEM POWER SUPPLY)
120a, 120b, 120c, 120d, 120e, 121a, 121b, 121c, 121d, 121e: NODE (BUS)
130a, 130b, 130c: TRANSFORMER
131a, 131b: TRANSFORMER WITH TAP
140a, 140b, 140c, 140d, 140e: BRANCH (POWER TRANSMISSION LINE OR LINE)
150a, 150b, 150c: LOAD
160a, 160b, 160c, 160d: STATIC CONDENSER (SC)
170a, 170b: SHUNT REACTOR (ShR)
300: COMMUNICATION NETWORK

The invention claimed is:

1. A power system voltage reactive power monitoring control device comprising:
a user interface;
a communication device that communicates with an individual device external to the power system voltage reactive power monitoring control device;
a memory that stores a program for execution in the power system voltage reactive power monitoring control device; and
a CPU programmed to execute the program stored in the memory to
obtain one or more target value constraints by using one or more indexes indicating stability in a voltage of a power system,
obtain information on a target value of the voltage of the power system from the one or more target value constraints, and
transmit transmission data to the individual device, which is capable of adjusting a voltage and a reactive power of the power system, including the information on the target value,
wherein the individual device adjusts the voltage and the reactive power at an installation location of the power system based on the transmission data received from the CPU to maintain a balance between the voltage and the reactive power at the installation location by varying the target value and a constraint value of the target value at each time of a target value changing timing;
wherein the information on the target value which is obtained from the one or more target value constraints is information including the target value changing timing and at least one of a target value width and a magnitude of the target value.

2. The power system voltage reactive power monitoring control device according to claim 1,
wherein the one or more indexes indicating stability of the power system include at least one of steady-state stability, voltage stability, and a control margin of the power system.

3. The power system voltage reactive power monitoring control device according to claim 1,
wherein the individual device obtains data of the power system at the installation location, and adjusts the voltage and the reactive power at the installation location, with the information on the target value transmitted from the voltage reactive power monitoring control device as a target value.

4. The power system voltage reactive power monitoring control device according to claim 1,
wherein the information on the target value obtained from the one or more target value constraints is information on an amount of control for achieving the target value.

5. The power system voltage reactive power monitoring control device according to claim 4,
wherein the individual device performs position control, and performs operation to a position indicated by the amount of control to adjust the voltage and the reactive power at the installation location.

6. The power system voltage reactive power monitoring control device according to claim 1, wherein the CPU is further programmed to:
exclude a fluctuation component during occurrence of a failure from fluctuation components of the power system,
extract a supply and demand fluctuation due to renewable energy resources as fluctuation data, and
obtain the one or more target value constraints by adding the fluctuation data and using the one or more indexes indicating stability of the power system.

7. The power system voltage reactive power monitoring control device according to claim 1, wherein the CPU is further programmed to:
obtain a deviation due to a change in a power flow state of the power system, and
obtain the one or more target value constraints by adding the deviation and using the one or more indexes indicating stability of the power system.

8. The power system voltage reactive power monitoring control device according to claim 1, wherein the CPU is further programmed to:
  determine an urgency state of the power system,
  obtain the information on the target value in the urgency state, and
  transmit the information on the target value in the urgency state to the individual device,
    wherein the individual device adjusts the voltage and the reactive power at the installation location based on the information on the target value in the urgency state.

9. A power system voltage reactive power monitoring control method comprising:
  obtaining, by a CPU, one or more target value constraints by using one or more indexes indicating stability in a voltage of the power system;
  obtaining, by the CPU, information on a target value of the voltage of the power system from the one or more target value constraints;
  transmitting, by a communication device, transmission data including the information on the target value to an individual device capable of adjusting the voltage and a reactive power of the power system; and
  adjusting, by the individual device, the voltage and the reactive power at an installation location of the power system based on the transmission data received from the CPU to maintain a balance between the voltage and the reactive power at the installation location by varying the target value and a constraint value of the target value at each time of a target value changing timing;
  wherein the information on the target value which is obtained from the one or more target value constraints is information including the target value changing timing and at least one of a target value width and a magnitude of the target value.

* * * * *